US012707795B2

(12) United States Patent
Tanaka et al.

(10) Patent No.: US 12,707,795 B2
(45) Date of Patent: Aug. 11, 2026

(54) PHOTOELECTRIC CONVERSION ELEMENT, PHOTOELECTRIC CONVERSION MODULE, ELECTRONIC DEVICE, AND PARTITION

(71) Applicants: Yuuji Tanaka, Shizuoka (JP); Masato Tanaka, Shizuoka (JP); Nozomu Tamoto, Shizuoka (JP); Naomichi Kanei, Shizuoka (JP)

(72) Inventors: Yuuji Tanaka, Shizuoka (JP); Masato Tanaka, Shizuoka (JP); Nozomu Tamoto, Shizuoka (JP); Naomichi Kanei, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 523 days.

(21) Appl. No.: 17/987,864

(22) Filed: Nov. 16, 2022

(65) Prior Publication Data

US 2023/0171975 A1 Jun. 1, 2023

(30) Foreign Application Priority Data

Nov. 26, 2021 (JP) ................................ 2021-192531
Mar. 31, 2022 (JP) ................................ 2022-060372

(51) Int. Cl.
*H10K 30/82* (2023.01)
*H10K 30/88* (2023.01)
*H10K 77/10* (2023.01)
*H10K 85/10* (2023.01)

(52) U.S. Cl.
CPC ............ *H10K 30/82* (2023.02); *H10K 30/88* (2023.02); *H10K 77/10* (2023.02); *H10K 85/10* (2023.02)

(58) Field of Classification Search
CPC ........ H10K 30/82; H10K 30/88; H10K 77/10; H10K 85/10; H10K 39/621; H10K 30/15; H10K 39/10; Y02E 10/549; B01D 53/26
See application file for complete search history.

(56) References Cited

U.S. PATENT DOCUMENTS 5,463,057 A 10/1995 Graetzel et al.
6,028,265 A 2/2000 Ono et al.
6,153,824 A 11/2000 Takada et al.
6,278,056 B1 8/2001 Sugihara et al.
(Continued)

FOREIGN PATENT DOCUMENTS

CN 1706226 A 12/2005
EP 0892411 A2 1/1999
(Continued)

OTHER PUBLICATIONS

Extended European Search Report issued Apr. 12, 2023 in European Patent Application No. 22207497.3, 9 pages.
(Continued)

*Primary Examiner* — Bitew A Dinke
(74) *Attorney, Agent, or Firm* — XSENSUS LLP

(57) ABSTRACT

A photoelectric conversion element includes: a first substrate; a first electrode; a photoelectric conversion layer; a second electrode; a sealing part; and a second substrate. The photoelectric conversion element is translucent. The second electrode includes a conductive nanowire and a conductive polymer. The sealing part includes a drying agent.

20 Claims, 16 Drawing Sheets

(56) References Cited

U.S. PATENT DOCUMENTS

| | | | | |
|---|---|---|---|---|
| 12,268,043 | B2 * | 4/2025 | Tamoto | H10K 30/10 |
| 2002/0187655 | A1 * | 12/2002 | Tan | H01L 21/31608<br>257/E21.279 |
| 2004/0099306 | A1 | 5/2004 | Hara et al. | |
| 2004/0256002 | A1 | 12/2004 | Horiuchi et al. | |
| 2017/0069876 | A1 | 3/2017 | Popp et al. | |
| 2017/0092433 | A1 | 3/2017 | Kanei et al. | |
| 2017/0243698 | A1 | 8/2017 | Kanei et al. | |
| 2017/0358399 | A1 | 12/2017 | Matsuyama et al. | |
| 2018/0053863 | A1 | 2/2018 | Tanaka et al. | |
| 2018/0198083 | A1 | 7/2018 | Tanaka et al. | |
| 2018/0330890 | A1 | 11/2018 | Tanaka et al. | |
| 2019/0305168 | A1 * | 10/2019 | Honda | H10K 85/654 |
| 2020/0066458 | A1 | 2/2020 | Matsuyama et al. | |
| 2020/0272260 | A1 * | 8/2020 | Zhang | G06F 3/041 |
| 2021/0013412 | A1 | 1/2021 | Kanei et al. | |
| 2021/0104367 | A1 * | 4/2021 | Tanaka | H10K 30/88 |
| 2021/0157447 | A1 * | 5/2021 | Tsai | G06F 3/0446 |
| 2021/0167287 | A1 * | 6/2021 | Horiuchi | H10K 30/10 |
| 2021/0273193 | A1 | 9/2021 | Kanei et al. | |
| 2021/0280809 | A1 | 9/2021 | Kanei et al. | |
| 2021/0280810 | A1 * | 9/2021 | Tamoto | H10K 30/81 |
| 2021/0296597 | A1 | 9/2021 | Tanaka et al. | |
| 2021/0366662 | A1 * | 11/2021 | Horiuchi | H10K 85/50 |
| 2022/0102651 | A1 * | 3/2022 | Tanaka | H10K 85/654 |
| 2022/0173165 | A1 * | 6/2022 | Ito | H10K 85/656 |
| 2022/0302399 | A1 * | 9/2022 | Tamoto | H10K 30/10 |
| 2022/0322518 | A1 * | 10/2022 | Ueda | H05K 5/0069 |
| 2023/0189540 | A1 * | 6/2023 | Horiuchi | H10K 30/86<br>136/243 |

FOREIGN PATENT DOCUMENTS

| | | | | |
|---|---|---|---|---|
| EP | 0911841 A2 | | 4/1999 | |
| EP | 1049117 A2 | | 11/2000 | |
| EP | 1052661 A2 | | 11/2000 | |
| EP | 1083582 A2 | | 3/2001 | |
| EP | 2 728 625 A1 | | 5/2014 | |
| EP | 3 276 695 A1 | | 1/2018 | |
| EP | 3855523 A1 | * | 7/2021 | H10K 30/30 |
| EP | 4 060 700 A1 | | 9/2022 | |
| JP | 07-500630 | | 1/1995 | |
| JP | 09-199744 | | 7/1997 | |
| JP | 10-092477 | | 4/1998 | |
| JP | 10-093118 | | 4/1998 | |
| JP | 10-233238 | | 9/1998 | |
| JP | 11-086916 | | 3/1999 | |
| JP | 11-204821 | | 7/1999 | |
| JP | 11-214730 | | 8/1999 | |
| JP | 11-214731 | | 8/1999 | |
| JP | 11-238905 | | 8/1999 | |
| JP | 11-265738 | | 9/1999 | |
| JP | 11-273754 | | 10/1999 | |
| JP | 11-273755 | | 10/1999 | |
| JP | 2000-026487 | | 1/2000 | |
| JP | 2000-106224 | | 4/2000 | |
| JP | 2000-323191 | | 11/2000 | |
| JP | 2001-052766 | | 2/2001 | |
| JP | 2001-059062 | | 3/2001 | |
| JP | 2001-076773 | | 3/2001 | |
| JP | 2001-076775 | | 3/2001 | |
| JP | 2002-164089 | | 6/2002 | |
| JP | 2003-007359 | | 1/2003 | |
| JP | 2003-007360 | | 1/2003 | |
| JP | 2003-031273 | | 1/2003 | |
| JP | 2003-264010 | | 9/2003 | |
| JP | 2004-063274 | | 2/2004 | |
| JP | 2004-095450 | | 3/2004 | |
| JP | 2004-115636 | | 4/2004 | |
| JP | 2004-200068 | | 7/2004 | |
| JP | 2004-235052 | | 8/2004 | |
| JP | 2006-032260 | | 2/2006 | |
| JP | 2013-168572 | | 8/2013 | |
| JP | 2015193724 A | | 11/2015 | |
| JP | 2016225628 A | | 12/2016 | |
| JP | 2017-175019 | | 9/2017 | |
| JP | 2019186528 A | | 10/2019 | |
| JP | 2020067546 A | | 4/2020 | |
| JP | 2020523462 A | | 8/2020 | |
| JP | 2021-150588 | | 9/2021 | |
| WO | 2011004872 A1 | | 1/2011 | |
| WO | 2012/121937 A1 | | 9/2012 | |
| WO | WO-2019181330 A1 | * | 9/2019 | H01G 9/2018 |
| WO | WO-2019181701 A1 | * | 9/2019 | H01L 51/006 |
| WO | WO-2020067188 A1 | * | 4/2020 | H01G 9/2009 |
| WO | WO-2020158876 A1 | * | 8/2020 | H01L 51/005 |
| WO | WO-2020250901 A1 | * | 12/2020 | H01G 9/20 |
| WO | WO-2021010425 A1 | * | 1/2021 | C08G 61/12 |

OTHER PUBLICATIONS

Suyoung Hwang, et al., "A highly efficient organic sensitizer for dye-sensitized solar cells", Chem. Commun., 4887-4889 (2007).

Tamotsu Horiuchi, et al., "High Efficiency of Dye-Sensitized Solar Cells Based on Metal-Free Indoline Dyes", J. Am. Chem. Soc., 12218-12219, vol. 126 (2004).

Daibin Kuang, et al., "Organic Dye-Sensitized Ionic Liquid Based Solar Cells: Remarkable Enhancement in Performance through Molecular Design of indoline Sensitizers", Angew. Chem. Int. Ed., 1923-1927, vol. 47 (2008).

K. Kalyanasundaram, et al., "Sensitization of $TiO_2$ in the Visible Light Region Using Zinc Porphyrins", J. Phys. Chem., 2342-2347, vol. 91 (1987).

Andreas Kay and Michael Gratzel, "Artificial Photosynthesis. 1. Photosensitization of $TiO_2$ Solar Cells with Chlorophyll Derivatives and Related Natural Porphyrins", J. Phys. Chem., 6272-6277, vol. 97 (1993).

T. Ma et al., "Photoelectrochemical properties of $TiO_2$ electrodes sensitized by porphyrin derivatives with different number of carboxyl groups", Journal of Electroanalytical Chemistry, 31-38, vol. 537 (2002).

Paidi Yella Reddy, et al., "Efficient Sensitization of Nanocrystalline $TIO_2$ Films by a Near-IR-Absorbing Unsymmetrical Zinc Phthalocyanine", Angew. Chem. Int. Ed., 373-376, vol. 46 (2007).

Seung Hun Eom, et al., "Roles of Interfacial Modifiers in Hybrid Solar Cells: Inorganic/Polymer Bilayer vs Inorganic/Polymer:Fullerene Bulk Heterojunction", ACS Appl. Mater. Interfaces 2014, 6, 803-810.

Office Action issued Dec. 2, 2025 in corresponding Japanese patent application No. JP2022-060372 (12 pages; with English translation).

Office Action mailed on Mar. 20, 2026 corresponding to Chinese patent application No. 202211489686.6 (26 pages; with English translation).

* cited by examiner 102
10
7b
6
5
4
2b
9
7a
8
3
2a
1
11

102
7b
6
5
4
2b
9
7a
8
3
2a
1
11

PHOTOELECTRIC CONVERSION ELEMENT, PHOTOELECTRIC CONVERSION MODULE, ELECTRONIC DEVICE, AND PARTITION

CROSS-REFERENCE TO RELATED APPLICATION

The present application claims priority under 35 U.S.C. § 119 to Japanese Patent Application No. 2021-192531, filed Nov. 26, 2021, and Japanese Patent Application. No. 2022-060372, filed Mar. 31, 2022. The contents of which are incorporated herein by reference in their entirety.

BACKGROUND OF THE INVENTION

1. Field of the Invention

The disclosures herein generally relate to a photoelectric conversion element, a photoelectric conversion module, an electronic device, and a partition.

2. Description of the Related Art

In recent years, driving electric power in an electronic circuit is considerably decreased, and various electronic components such as sensors can be driven with very weak electric power (μW order).

Regarding use of sensors, application to environmental power generation elements as self-driving power sources, which can generate electric power on the spot and can use the generated electric power, is expected. In recent years, indoor photoelectric conversion elements (or solar cells), which have a high power generation performance even with light having a low illuminance (1500 1× or less) such as light-emitting diodes (LEDs) or fluorescent lamps, attract much attention.

For example, as transparent electrode materials of solar cells, a photoelectric conversion element, which has a high translucency and includes, as electrode materials, a conductive transparent material, such as a silver nanowire, and a conductive transparent polymer that are highly translucent materials, has been proposed (see, for example, Japanese Unexamined Patent Application Publication No. 2017-175019).

However, there is a problem that when the photoelectric conversion element is stored under high temperature and high humidity environment, its output decreases significantly. Therefore, in order to prevent water vapor or oxygen in the external environment from entering the photoelectric conversion element under high temperature and high humidity environment to thereby decrease the photoelectric conversion efficiency, for example, an organic thin film solar cell element, which includes an adhesive layer obtained by curing a photocurable resin or a thermosetting resin so that the resin covers the whole photoelectric conversion layer, has been proposed (see, for example, Japanese Unexamined Patent A plication Publication No. 2013-168572).

SUMMARY OF THE INVENTION

In one embodiment, a photoelectric conversion element includes: a first substrate; a first electrode; a photoelectric conversion layer; a second electrode; a sealing part; and a second substrate. The photoelectric conversion element is translucent. The second electrode includes a conductive nanowire and a conductive polymer. The sealing part includes a drying agent.

DESCRIPTION OF THE PREFERRED EMBODIMENTS

Figure 1:
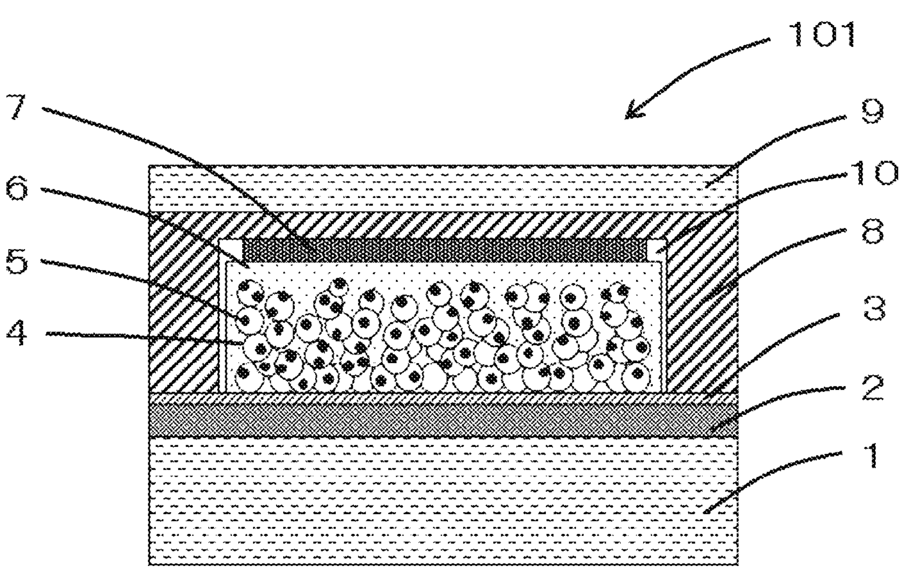
FIG. 1 is a schematic view illustrating one example of a photoelectric conversion element of the present disclosure.

In the following, embodiments of the present invention will be described with reference to the accompanying drawings.

(Photoelectric Conversion Element)

A photoelectric conversion element of the present disclosure includes: a first substrate; a first electrode; a photoelectric conversion layer; a second electrode; a sealing part; and a second substrate. The photoelectric conversion element is translucent. The photoelectric conversion element includes a hole blocking layer, an electrode protection layer, and other layers if necessary.

The second electrode in the photoelectric conversion element of the present disclosure includes a conductive nanowire and a conductive polymer.

The sealing part in the photoelectric conversion element of the present disclosure includes a drying agent.

An object of the present disclosure is to provide a photoelectric conversion element excellent in durability.

According to the present disclosure, it is possible to provide a photoelectric conversion element excellent in durability.

In the specification of the present application, the "photoelectric conversion element" means an element that converts light energy into electric energy or an element that converts electric energy into light energy. Specific examples thereof include solar cells and photodiodes.

In the present disclosure, a "layer" may be a single film (single layer), or may be a stacked layer in which a plurality of films is stacked.

A "layered direction" means a direction perpendicular to a surface of a layer in a photoelectric conversion element. The "connection" means not only physical contact but also electric connection enough to be able to achieve the effect of the present disclosure.

As a result of diligent studies, the present inventors found the following.

A conventional photoelectric conversion element including electrodes formed of a metal nanowire and a conductive polymer has such a problem that moisture derived from an electrode coating liquid for forming electrodes remains inside the electrodes, and this moisture deteriorates the durability of the photoelectric conversion element itself.

Therefore, the present inventors found that inclusion of the drying agent in the sealing material in the photoelectric conversion element can remove the moisture derived from the electrode coating liquid and can improve the durability of the photoelectric conversion element.

A visible light transmittance of the photoelectric conversion element itself of the present disclosure is preferably 15% or more, more preferably 20% or more, and still more preferably 20% or more and 50% or less. When the visible light transmittance of the photoelectric conversion element itself is 20% or more and 50% or less, excellent durability can be obtained.

Conventional photoelectric conversion elements have the following problem. Specifically, when a second electrode is produced through deposition of silver, a photoelectric conversion element has an extremely low visible light transmittance, and almost no translucency is achieved. As a result, almost no electric power is generated unless light is emitted from a side of a first electrode, which makes it difficult to generate electric power under low illuminance (1,500 1× or less) conditions such as indoor environments. However, when the visible light transmittance of the photoelectric conversion element itself is 15% or more, transmission of visible light is ensured, and a photoelectric conversion element that can generate electric power even under low illuminance (1,500 1× or less) conditions such as indoor environments can be obtained by receiving light from both surfaces of the first electrode side and the second electrode side.

Moreover, because the photoelectric conversion element of the present disclosure can receive light from both surfaces of the first electrode side and the second electrode side, the photoelectric conversion element of the present disclosure can obtain more excellent durability under living space conditions (under low illuminance) compared to conventional photoelectric conversion elements including a second electrode formed through deposition of silver.

Having a translucency means that a transmittance of visible light having a wavelength of 380 nm or more and 780 nm or less is 15% or more, the transmittance being measured in a layered direction of a photoelectric conversion element according to JIS 25759.

The visible light transmittance is a transmittance of visible light having a wavelength of 380 nm or more and 780 nm or less according to JIS A5759, and can be measured by a measurement method of visible light transmittance $t_v$ using, for example, an ultraviolet and visible spectrophotometer (apparatus name: ISR-3100, manufactured by SHIMADZU CORPORATION.

<Substrate>

A photoelectric conversion element of the present disclosure includes a first substrate and a second substrate.

The first substrate is a substrate provided on the outermost part of a first electrode side, and the second substrate is a substrate provided on the outermost part of a second electrode side. In the present specification, the first substrate and the second substrate may be collectively referred to as "substrate".

Note that, the photoelectric conversion element of the present disclosure may be an aspect where one of the first substrate and the second substrate is provided.

The shape, structure, and size of the substrate are not particularly limited and may be appropriately selected in accordance with the intended purpose.

The material of the first substrate is not particularly limited and may be appropriately selected in accordance with the intended purpose as long as it is translucent and has an insulation property. Examples thereof include substrates such as glass, plastic films, and ceramic. Among them, when a firing step for forming an electron transport layer is included as described hereinafter, a substrate having heat resistance to a firing temperature is preferable. Moreover, preferable examples of the substrate include those that are flexible.

The second substrate is not particularly limited and conventional products can be used. Examples thereof include substrates such as glass, plastic films, and ceramic. Among them, plastic films are more preferable. A convex-concave part may be formed at a connection part between the second substrate and a sealing part that will be described later, in order to increase adhesiveness.

A method of forming the convex-concave part is not particularly limited and may be appropriately selected in accordance with the intended purpose. Examples of the formation method include sand blasting, water blasting, abrasive paper, chemical etching, and laser processing.

As a method of increasing adhesiveness between the second substrate and the sealing part, for example, organic matter on the surface may be removed, or hydrophilicity may be improved.

The method of removing organic matter from the surface of the second substrate is not particularly limited and may be appropriately selected in accordance with the intended purpose. Examples of the method include UV ozone washing and oxygen plasma treatment.

A water vapor transmittance of the second substrate is not particularly limited and may be appropriately selected in accordance with the intended purpose. The water vapor transmittance is preferably 0.01 ($g/m^2\cdot day$) or less, and more preferably 0.001 ($g/m^2\cdot day$) or less.

When the water vapor transmittance of the second substrate is 0.01 ($g/m^2\cdot day$) or less, the durability under high humidity and high temperature of 40° C. and 90% RH or more can be improved. When the water vapor transmittance of the second substrate is 0.001 ($g/m^2\cdot day$) or less, the durability under high humidity and high temperature of 60° C. and 90% RH or more can be improved.

The water vapor transmittance can be measured through, for example, gas chromatography according to JIS K 7129.

The second substrate may be formed of a single layer or may be formed of such a structure that a plurality of layers is stacked. Among them, the second substrate is preferably formed of such a structure that a plurality of layers is stacked. Examples of the structure that a plurality of layers is stacked include: such a structure that a substrate for protection from external impact and a barrier layer for decreasing the water vapor transmittance are stacked; and such a structure that 100 or more thin films each having a thickness on the nanometer scale are stacked on top of one another.

<First Electrode>

The photoelectric conversion element includes a first electrode.

The shape and size of the first electrode are not particularly limited and may be appropriately selected in accordance with the intended purpose.

The visible light transmittance of the first electrode is preferably 60% or more.

The visible light transmittance of the first electrode can be determined by measuring, for example, the first electrode formed on the first substrate by a measurement method of visible light transmittance $t_v$ using an ultraviolet and visible spectrophotometer (apparatus name: ISR-3100, manufactured by SHIMADZU CORPORATION) according to JIS A5759.

The structure of the first electrode is not particularly limited and may be appropriately selected in accordance with the intended purpose. The structure may be a single layer structure or a structure in which a plurality of materials is stacked.

The material of the first electrode is not particularly limited and may be appropriately selected in accordance with the intended purpose as long as it is transparent to visible light and is conductive. Examples thereof include transparent conductive metal oxides, carbon material, and metals.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminum-doped zinc oxide, indium-zinc oxide, and niobium-titanium oxide.

Examples of the carbon include carbon black, carbon nanotube, graphene, and fullerene.

Examples of the metal include gold, silver, aluminum, nickel, indium, tantalum, and titanium.

These may be used alone or in combination. Among them, transparent conductive metal oxide having high transparency is preferable, and ITO, FTO, ATO, and NTO are more preferable.

An average thickness of the first electrode is not particularly limited and may be appropriately selected in accordance with the intended purpose. The average thickness of the first electrode is preferably 5 nm or more and 100 μm or less, and more preferably 50 nm or more and 10 μm or less. When a material of the first electrode is carbon or metal, the average thickness of the first electrode is preferably an average thickness enough to obtain translucency.

The first electrode can be formed by conventional methods such as the sputtering method, the vapor deposition method, and the spray method.

Moreover, the first electrode is preferably formed on the first substrate. It is possible to use a commercially available integrated product where the first electrode has been formed on the first substrate in advance.

Examples of the commercially available integrated product where the first electrode is formed on the first substrate include FTO-coated glass (for example, product name: TEC15, manufactured by Nippon Electric Glass Co., Ltd.), ITO-coated glass (for example, manufactured by GEOMATEC Co., Ltd.), zinc oxide/aluminum coated glass, FTO-coated transparent plastic films, and ITO-coated transparent plastic films (for example, manufactured by GEOMATEC Co., Ltd.). Other examples of the commercially available integrated product include: glass substrates provided with a transparent electrode where tin oxide or indium oxide is doped with a cation or an anion having a different atomic value; and glass substrates provided with a metal electrode having such a structure that allows light in the form of a mesh or stripes to pass.

These may be used alone, or two or more products may be mixed or stacked in combination. Moreover, a metal lead wire may be used in combination in order to decrease an electric resistance value.

Examples of materials of the metal lead wire include aluminum, copper, silver, gold, platinum, and nickel.

The metal lead wire can be used in combination by forming the metal lead wire on a substrate through, for example, vapor deposition, sputtering, or pressure bonding, and providing a layer of ITO or FTO thereon.

<Hole Blocking Layer>

The photoelectric conversion element preferably includes a hole blocking layer.

The hole blocking layer is formed between the first electrode and an electron transport layer that will be described hereinafter.

The hole blocking layer is very effective in improving output and its persistence.

The hole blocking layer includes a photosensitization compound, transports, to a first electrode, electrons transported to an electron transport layer, and minimizes contact with a hole transport layer. As a result, the hole blocking layer does not easily allow holes to flow to the first electrode and can minimize reductions in output due to recombining of electrons and holes.

A solid photoelectric conversion element including the hole transport layer has much greater effects achieved by formation of the hole blocking layer than a wet photoelectric conversion element including an electrolyte because of a higher recombining speed of holes in the hole transport material and electrons on the surface of the electrode.

The material of the hole blocking layer is not particularly limited and may be appropriately selected in accordance with the intended purpose as long as it is transparent to visible light and an electron transport property. Examples thereof include: semiconductors of simple substances such as silicon and germanium; compound semiconductors such as chalcogenides of metal, and compounds having a perovskite structure.

Examples of the chalcogenide of metal include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenide of cadmium and lead; and tellurides of cadmium. Examples of other compound semiconductors include: phosphides of zinc, gallium, indium, and cadmium; gallium arsenide, copper-indium selenide, and copper-indium sulfide.

Examples of the compound having a perovskite structure include strontium titanate, calcium titanate, sodium titanate, barium titanate, and potassium niobate.

Among them, an oxide semiconductor is preferable, titanium oxide, niobium oxide, magnesium oxide, aluminum oxide, zinc oxide, tungsten oxide, and tin oxide are more preferable, and titanium oxide is still more preferable.

These may be used alone or in combination. These may be a single layer or may be a stacked layer. The crystal type of these semiconductors is not particularly limited and may be appropriately selected in accordance with the intended purpose. The crystal type may be a single crystal, a polycrystal, or an amorphous crystal.

A method of producing the hole blocking layer is not particularly limited and may be appropriately selected in accordance with the intended purpose. Examples thereof include a method in which a thin film is formed in vacuum (vacuum film formation method); and a wet film formation method.

Examples of the vacuum film formation method include the sputtering method, the pulse laser deposition method (PLD method), the ion beam sputtering method, the ion assisted deposition method, the ion plating method, the vacuum deposition method, the atomic layer deposition method (ALD method), and the chemical vapor deposition method (CVD method).

Examples of the wet film formation method include a sol-gel method. The sol-gel method is the following method. Specifically, a solution is allowed to undergo a chemical reaction, such as hydrolysis or polymerization-condensation, to prepare a gel. Then, the gel is subjected to a heat treatment to facilitate compactness. When the sol-gel method is used, a method of coating the sol solution is not particularly limited and may be appropriately selected in accordance with the intended purpose. Examples thereof include the dip method, the spray method, the wire bar method, the spin coating method, the roller coating method, the blade coating method, the gravure coating method, and wet printing methods such as relief printing, offset printing, gravure printing, intaglio printing, rubber plate printing, and screen printing. A temperature at which the heat treatment is performed after the sol solution is coated is preferably 80° C. or more, and more preferably 100° C. or more.

The average thickness of the hole blocking layer is not particularly limited and may be appropriately selected in accordance with the intended purpose. The average thickness is preferably 5 nm or more and 1 μm or less. In the case of the wet film formation, the average thickness is more preferably 500 nm or more and 700 nm or less. In the case of the drying film formation, the average thickness is more preferably 5 nm or more and 30 nm or less.

<Photoelectric Conversion Layer>

The photoelectric conversion layer includes an electron transport layer and a hole transport layer, and includes other layers if necessary.

The photoelectric conversion layer may be a single layer or a multilayer in which a plurality of layers is stacked.

The photoelectric conversion layer preferably includes a basic compound.

The basic compound is included in any of layers constituting the photoelectric conversion layer, but is preferably included in, for example, the hole transport layer.

<<Electron Transport Layer>>

The photoelectric conversion element includes an electron transport layer.

The electron transport layer is formed for the purpose of transporting generated electrons to the hole blocking layer. Therefore, the electron transport layer is preferably disposed adjacent to the hole blocking layer.

The structure of the electron transport layer is not particularly limited and may be appropriately selected in accordance with the intended purpose. Preferably, in at least two photoelectric conversion elements adjacent to each other, the electron transport layers are not continuous and are separated. Separation of the electron transport layers is advantageous because diffusion of electrons is minimized to decrease leak current, resulting in improvement of photodurability.

The structure of the electron transport layer may be a continuous single layer or a multilayer in which a plurality of layers is stacked.

The electron transport layer includes an electron transport material, preferably includes a photosensitization compound, and includes, if necessary, other materials.

<<<Electron Transport Material>>>

The electron transport material is not particularly limited and may be appropriately selected in accordance with the intended purpose. The electron transport material is preferably a semiconductor material.

Preferably, the semiconductor material has a particulate shape, and these particles are joined to form a porous film. On the surfaces of semiconductor particles constituting the porous electron transport layer, a photosensitization compound is chemically or physically adsorbed. When the electron transport layer is porous, the amount of the photosensitization compound adsorbed on the surface can be drastically increased, which is effective in achieving high output.

The semiconductor material is not particularly limited and conventional materials may be used. Examples thereof include semiconductors of simple substances, compound semiconductors, and compounds having a perovskite structure.

Examples of the semiconductor of the simple substance include silicon and germanium.

Examples of the compound semiconductor include chalcogenides of metal. Specific examples thereof include oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Examples of other compound semiconductors include phosphides of, for example, zinc, gallium, indium, and cadmium, gallium arsenide, copper-indium selenide, and copper-indium sulfide.

Examples of the compound having a perovskite structure include strontium titanate, calcium titanate, sodium titanate, barium titanate, and potassium niobate.

Among the semiconductor materials, an oxide semiconductor is preferable, and titanium oxide, zinc oxide, tin oxide, and niobium oxide are more preferable. When the electron transport material of the electron transport layer is titanium oxide, a high open circuit voltage can be obtained because of its high conduction band level, resulting in high photoelectric conversion characteristics, which is advantageous. In addition, because titanium oxide has a high refractive index, a light confinement effect can be achieved, which makes it possible to obtain a high short circuit current. Moreover, because titanium oxide has high permittivity and high mobility, a high fill factor can be obtained, which is advantageous.

These may be used alone or in combination. The crystal type of the semiconductor material is not particularly limited and may be appropriately selected in accordance with the intended purpose. The crystal type may be a single crystal, a polycrystal, or an amorphous crystal.

A number average particle diameter of primary particles of the semiconductor material is not particularly limited and may be appropriately selected in accordance with the intended purpose. The number average particle diameter is preferably 1 nm or more and 100 nm or less, and more preferably 5 nm or more and 50 nm or less. Moreover, a semiconductor material having a number average particle diameter that is larger than the above upper limit of the number average particle diameter may be mixed or stacked. Such a semiconductor material can produce the effect of scattering incident light to improve conversion efficiency. In this case, the number average particle diameter is preferably 50 nm or more and 500 nm or less.

An average thickness of the electron transport layer is not particularly limited and may be appropriately selected in accordance with the intended purpose. The average thickness is preferably 50 nm or more and 100 μm or less, more preferably 100 nm or more and 50 μm or less, and still more preferably 120 nm or more and 10 μm or less.

An average thickness of the electron transport layer falling within the preferable range is advantageous because an amount of the photosensitization compound per unit projection area can be sufficiently secured, a high light trapping rate can be maintained, the diffusion distance of injected electrons does not easily increase, and the loss caused due to recombining of electric charges can be decreased.

A method of producing the electron transport layer is not particularly limited and may be appropriately selected in accordance with the intended purpose. Examples thereof include: a method in which a thin film is formed in vacuum such as sputtering; a wet film formation method; and a wet printing method. Among them, in terms of production costs, the wet film formation method is preferable, and a method, in which paste (dispersion liquid of the semiconductor material) obtained by dispersing powder or sol of the semiconductor material is prepared and is coated on the first electrode as an electron collecting electrode substrate or on the hole blocking layer, is more preferable.

The wet film formation method is not particularly limited and may be appropriately selected in accordance with the intended purpose. Examples thereof include the dip method, the spray method, the wire bar method, the spin coating method, the roller coating method, the blade coating method, the gravure coating method, and the die coating method.

The wet printing method is not particularly limited and may be appropriately selected in accordance with the intended purpose. For example, various methods such as relief printing, offset printing, gravure printing, intaglio printing, rubber plate printing, and screen printing can be used.

Examples of a method of preparing the dispersion liquid of the semiconductor material include a mechanically pulverizing method using, for example, a conventional milling device. This method makes it possible to prepare a dispersion liquid of a semiconductor material by dispersing, in water or a solvent, a particulate semiconductor material alone or a mixture of a semiconductor material and a resin.

The resin is not particularly limited and may be appropriately selected in accordance with the intended purpose. Examples thereof include polymers or copolymers of vinyl compounds such as styrene, vinyl acetate, acrylic ester, and methacrylate, silicon resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyarylate resins, polyamide resins, and polyimide resins. These may be used alone or in combination.

The solvent is not particularly limited and may be appropriately selected in accordance with the intended purpose. Examples thereof include water, alcohol solvents, ketone solvents, ester solvents, ether solvents, amide solvents, halogenated hydrocarbon solvents, and hydrocarbon solvents.

Examples of the alcohol solvent include methanol, ethanol, isopropyl alcohol, and α-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

In order to minimize reaggregation of particles, acid, a surfactant, a chelating agent, or the like may be added to the dispersion liquid including the semiconductor material or the paste including the semiconductor material obtained through, for example, the sol-gel method.

Examples of the acid include hydrochloric acid, nitric acid, and acetic acid.

Examples of the surfactant include polyoxyethylene octylphenyl ether.

Examples of the chelating agent include acetylacetone, 2-aminoethanol, and ethylenediamine.

For the purpose of improving the film forming property, addition of a thickener is an effective means.

Examples of the thickener include polyethylene glycol, polyvinyl alcohol, and ethyl cellulose.

After the semiconductor material is coated, particles of the semiconductor material may be electronically brought into contact with each other, the semiconductor material may be fired to improve the film strength or adhesiveness to a substrate, microwave or electron beams may be emitted, or laser light may be emitted. These treatments may be performed alone or in combination.

When the electron transport layer formed from the semiconductor material is fired, the firing temperature is not particularly limited and may be appropriately selected in accordance with the intended purpose. If the temperature is too high, a substrate may have a high resistance and melting may occur. Therefore, the firing temperature is preferably 30° C. or more and 700° C. or less, and more preferably 100° C. or more and 600° C. or less. The firing time is not particularly limited and may be appropriately selected in accordance with the intended purpose. The firing time is preferably 10 minutes or more and 10 hours or less.

When the electron transport layer formed from the semiconductor material is irradiated with microwave, the irradiation time is not particularly limited and may be appropriately selected in accordance with the intended purpose. The irradiation time is preferably 1 hour or less. In this case, irradiation may be performed from a surface side where the electron transport layer is formed, or irradiation may be performed from a surface side where no electron transport layer is formed.

After the electron transport layer formed of the semiconductor material is fired, a chemical plating treatment using a mixed solution of a titanium tetrachloride aqueous solution and an organic solvent or an electrochemical plating treatment using a titanium trichloride aqueous solution may be performed in order to increase the surface area of the electron transport layer or to enhance the electron injection efficiency from a photosensitization compound that will be described hereinafter to the semiconductor material.

A film obtained by firing the semiconductor material having a diameter of several tens of nanometers may be porous. Such a porous nanostructure has a considerably high surface area, and the surface area can be represented by a roughness factor. The roughness factor is a numerical value representing an actual area of the porous inner part relative to an area of the semiconductor particles coated on the first substrate. Therefore, the roughness factor is preferably larger, but is preferably 20 or more in relation to an average thickness of the electron transport layer.

The particles of the electron transport material may be doped with a lithium compound. Specifically, a solution of a lithium bis(trifluoromethanesulfonimide) compound is deposited on particles of the electron transport material through, for example, spin coating, followed by firing.

The lithium compound is not particularly limited and may be appropriately selected in accordance with the intended purpose. Examples thereof include lithium bis(trifluoromethanesulfonimide), lithium bis(fluoromethanesulfonimide), lithium bis(fluoromethanesulfonyl) (trifluoromethanesulfonyl)imide, lithium perchlorate, and lithium iodide.

<<<Photosensitization Compound>>>

The photosensitization compound is preferably provided on the electron transport layer.

As the photosensitization compound, compounds that can further improve the output or photoelectric conversion efficiency can be used. The photosensitization compound is preferably adsorbed on the surface of the semiconductor material constituting the electron transport layer.

The photosensitization compound is not particularly limited and may be appropriately selected in accordance with the intended purpose as long as it is photoexcited by light to be applied to the photoelectric conversion element. Examples thereof include the following conventional compounds.

Specific examples thereof include: metal complex compounds described in, for example, Japanese Translation of PCT International Application Publication No. 7-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062; coumarin compounds described in, for example, Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007); polyene compounds described in, for example, Japanese Unexamined Patent Application Publication No. 2004-95450 and Chem. Commun., 4887 (2007); indoline compounds described in, for example, Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, J. Am. Chem. Soc., 12218, Vol. 126 (2004), Chem. Commun., 3036 (2003), and Angew. Chem. Int. Ed., 1923, Vol. 47 (2008); thiophene compounds described in, for example, J. Am. Chem. Soc., 16701, Vol. 128 (2006), and J. Am. Chem. Soc., 14256, Vol. 128 (2006); cyanine dyes described in, for example, Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359; merocyanine dyes described in, for example, Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360; 9-aryl xanthene compounds described in, for example, Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273; triarylmethane compounds described in, for example, Japanese Unexamined Patent Application Publication No. 10-93118 and Japanese Unexamined Patent Application Publication No. 2003-31273; and phthalocyanine compounds and porphyrin compounds described in, for example, Japanese Unexamined Patent Application Publication No. 9-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

These may be used alone or in combination.

Among them, metal complex compounds, coumarin compounds, polyene compounds, indoline compounds, and thiophene compounds are preferable, and compounds expressed by the following Structural Formulas (1), (2), and (3) manufactured by Mitsubishi Paper Mills Limited are preferable.

Structural Formula (1)

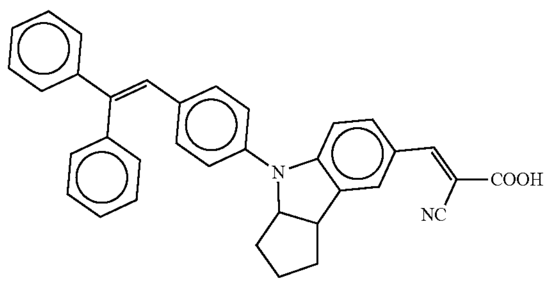

Structural Formula (2)

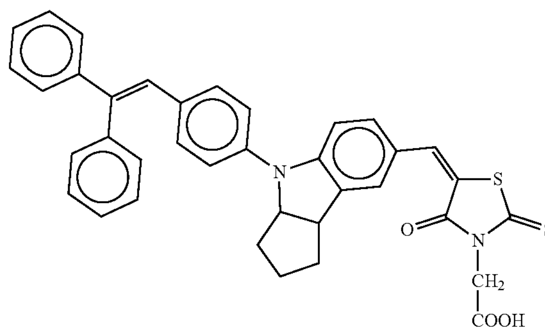

Structural Formula (3)

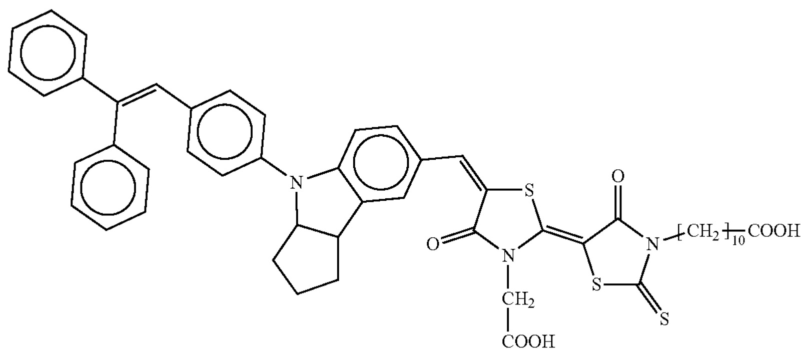

One example of a photosensitization compound that is more preferably used is, for example, a compound having the following Formula (5).

Formula (5)

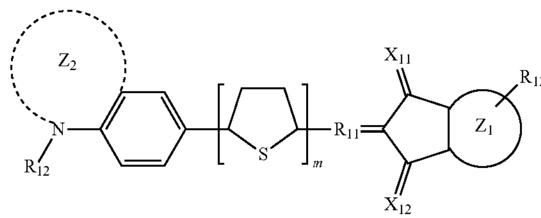

In Formula (5), $X_{11}$ and $X_{12}$ each independently represent an oxygen atom, a sulfur atom, or a selenium atom.

In Formula (5), $R_{11}$ represents a methine group that may have a substituent. Examples of the substituent include: aryl groups such as a phenyl group and a naphthyl group; and heterocycles such as a thienyl group and a furyl group.

In Formula (5), $R_{12}$ represents an alkyl group, an aryl group, or a heterocycle group, each of which may have a substituent. Examples of the alkyl group include a methyl group, an ethyl group, a 2-propyl group, and a 2-ethylhexyl group. Examples of the aryl group and the heterocycle group are exemplified above.

In Formula (5), $R_{13}$ represents an acidic group such as carboxylic acid, sulfonic acid, phosphonic acid, boronic acid, or phenols. $R_{13}$ may be one substituent or may be two or more substituents.

In Formula (5), $Z_1$ and $Z_2$ each independently represent a substituent that forms a cyclic structure. In Formula (5), examples of the $Z_1$ include condensed hydrocarbon-based compounds such as a benzene ring and a naphthalene ring; and heterocycles such as a thiophene ring and a furan ring, each of which may have a substituent. Specific examples of the substituent include: the aforementioned alkyl groups; and alkoxy groups such as a methoxy group, an ethoxy group, and a 2-isopropoxy group. Examples of a part including $Z_2$, a benzene ring fused to $Z_2$, and $R_{12}$ include the following (A-1) to (A-22).

Note that, m represents an integer of from 0 through 2.

(A-1)

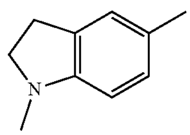

(A-2)

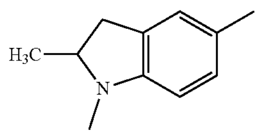

(A-3)

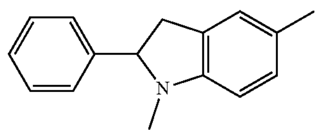

(A-4)

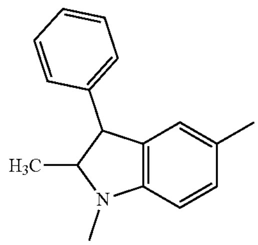

(A-5)

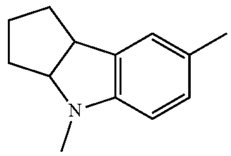

(A-6)

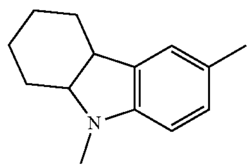

(A-7)

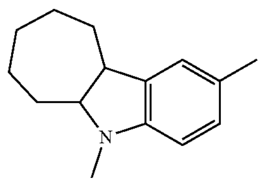

-continued (A-8)

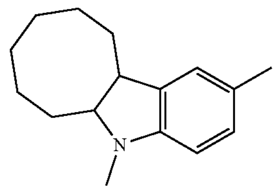

(A-9)

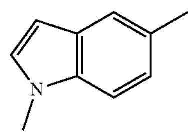

(A-10)

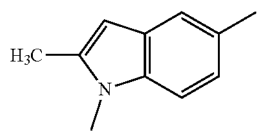

(A-11)

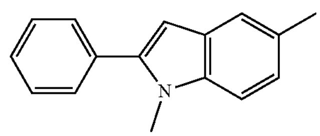

(A-12)

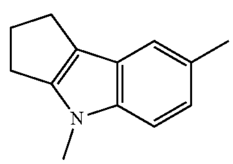

(A-13)

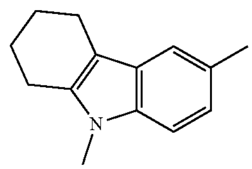

(A-14)

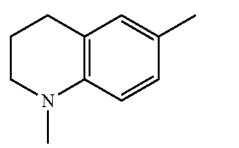

(A-15)

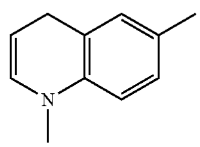

(A-16)

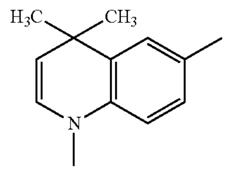

(A-17)

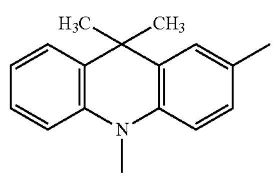

-continued (A-18)

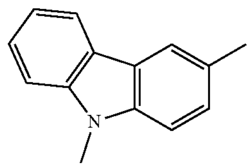

(A-19)

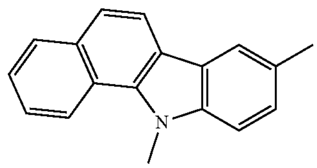

(A-20)

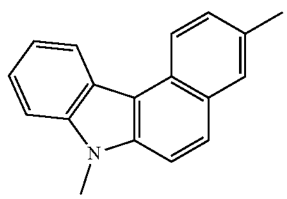

(A-21)

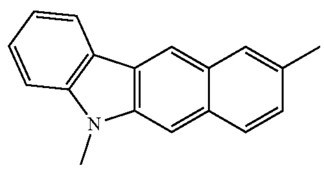

(A-22)

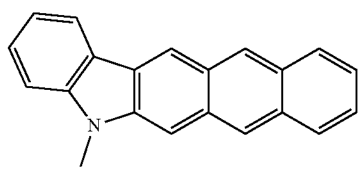

As the photosensitization compound, a compound represented by the following Formula (6) is more preferably used.

Formula (6)

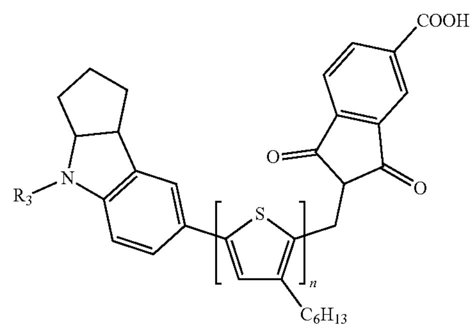

In Formula (6), n represents an integer of 0 or 1, and $R_3$ represent an aryl group that may have a substituent or one substituent selected from substituents expressed by the following three Structural Formulas.

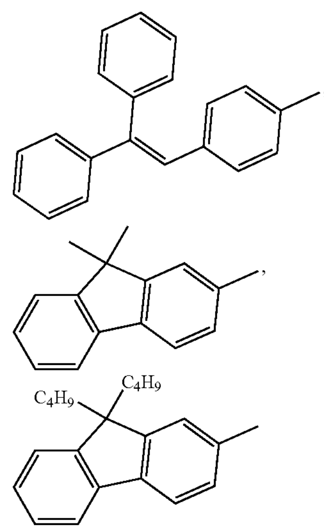

Specific examples of photosensitization compounds including Formula (5) and Formula (6) described above include the following (B-1) to (B-41), but are not limited thereto.

(B-1)

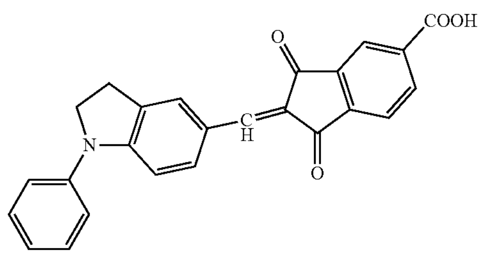

(B-2)

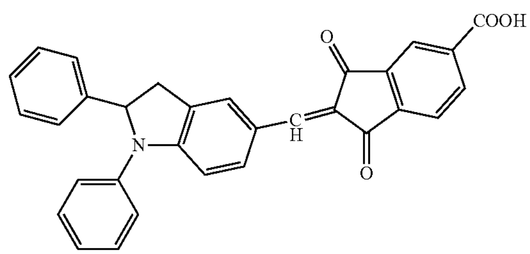

-continued
(B-3)
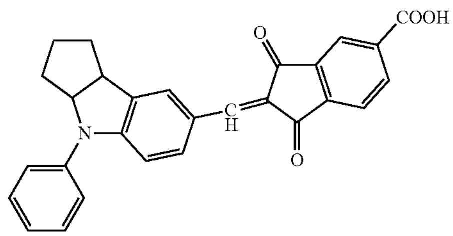
(B-4)
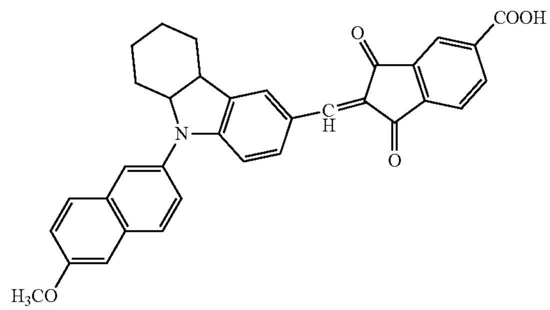
(B-5)
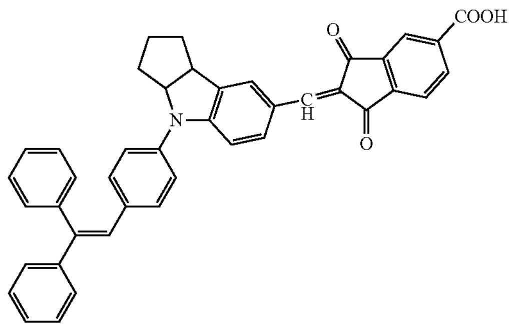
(B-6)
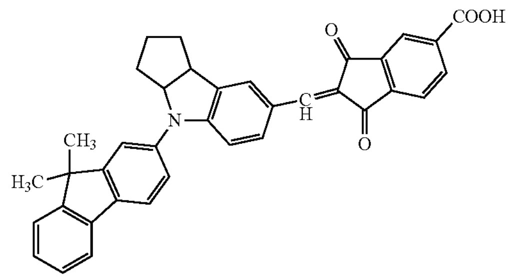
(B-7)
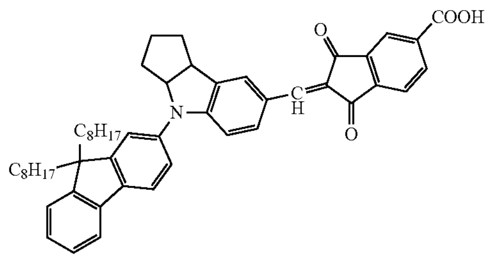
(B-8)
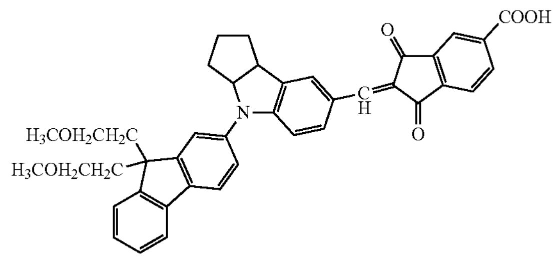
(B-9)
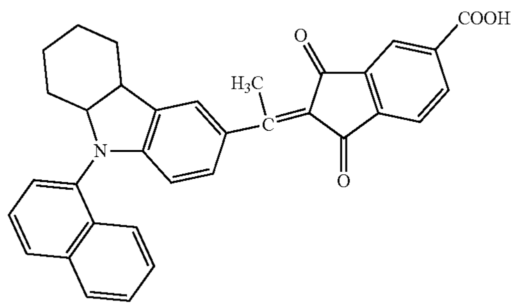
(B-10)
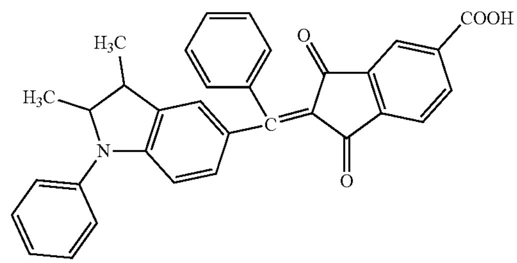
(B-11)
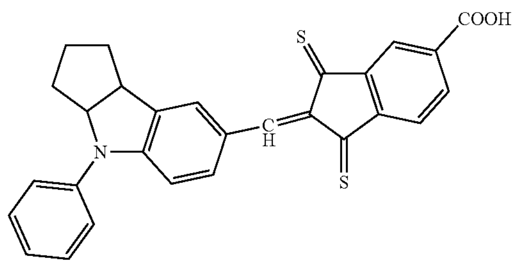
(B-12)
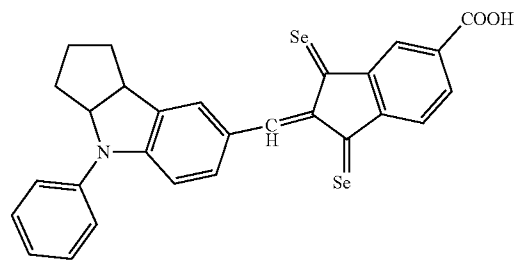

-continued
(B-13)
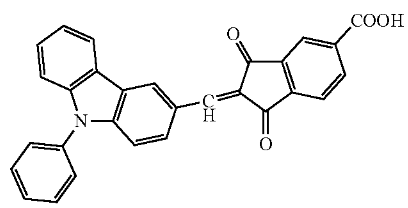
(B-14)
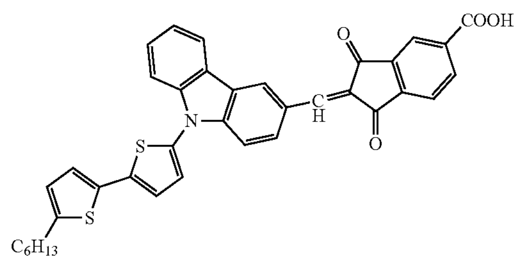
(B-15)
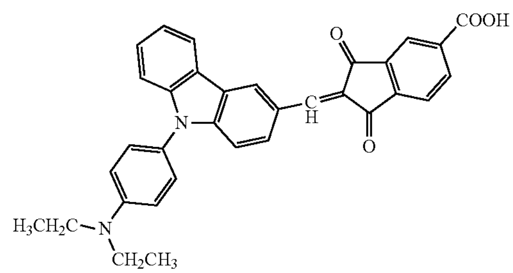
(B-16)
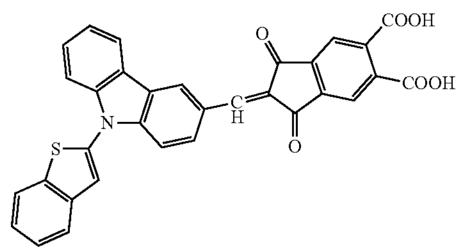
(B-17)
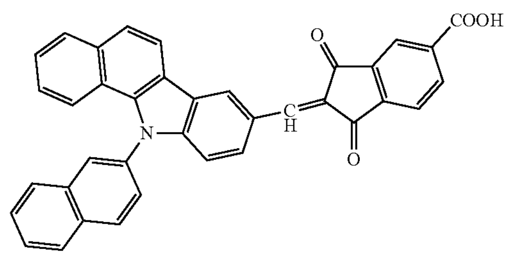
(B-18)
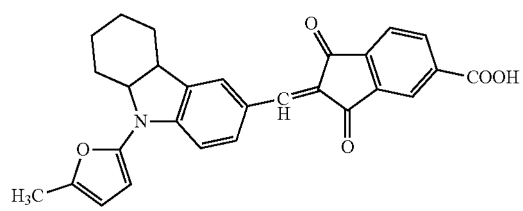
(B-19)
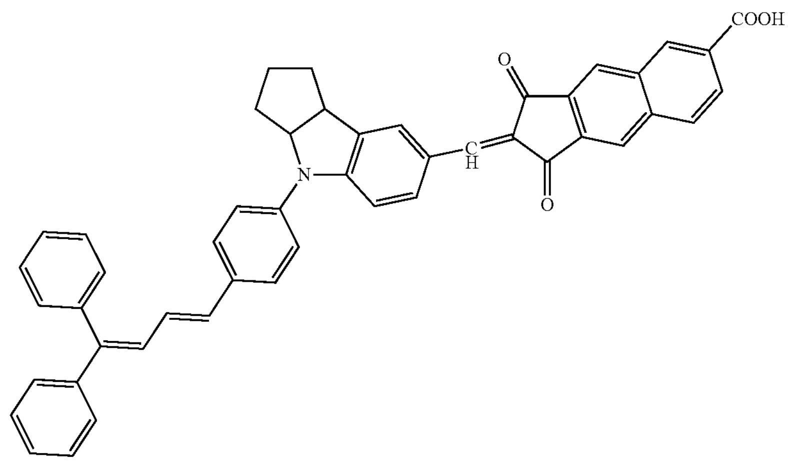

-continued
(B-20)
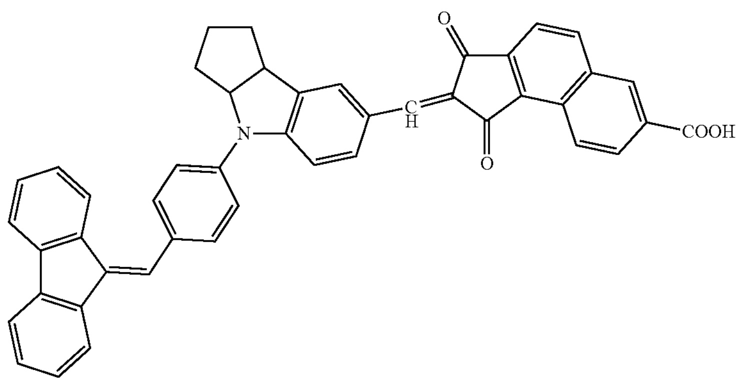
(B-21)
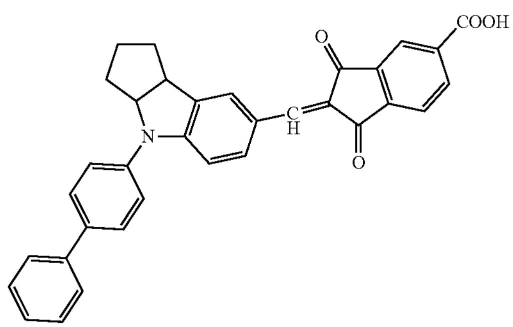
(B-22)
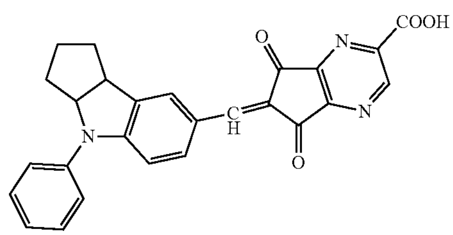
(B-23)
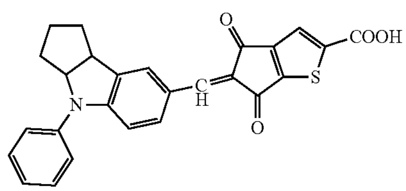
(B-24)
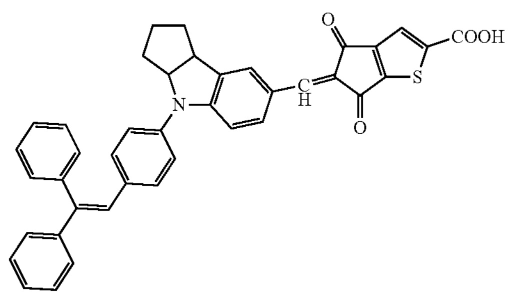
(B-25)
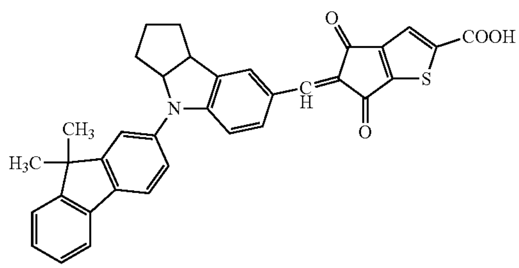
(B-26)
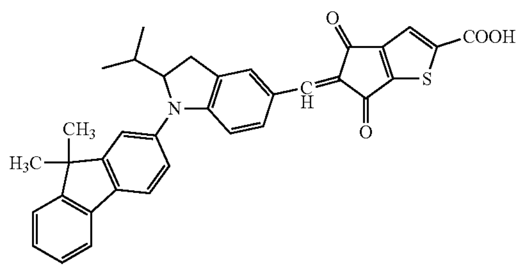
(B-27)
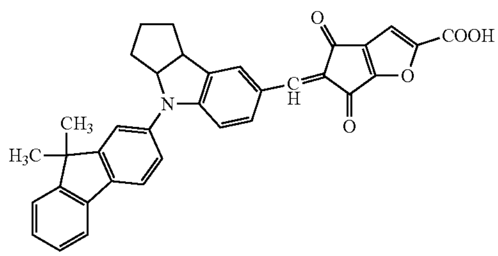
(B-28)
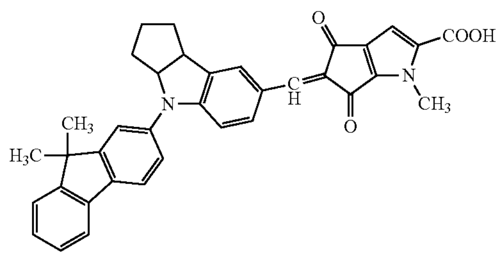

-continued
(B-29)
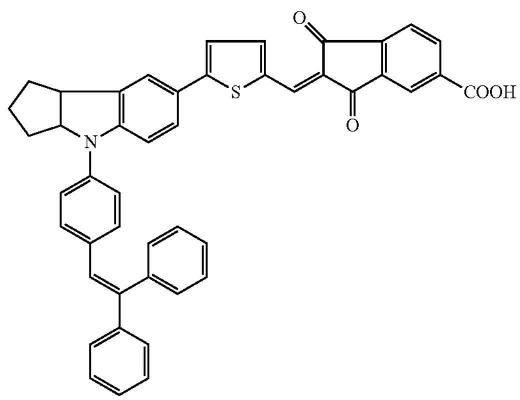
(B-30)
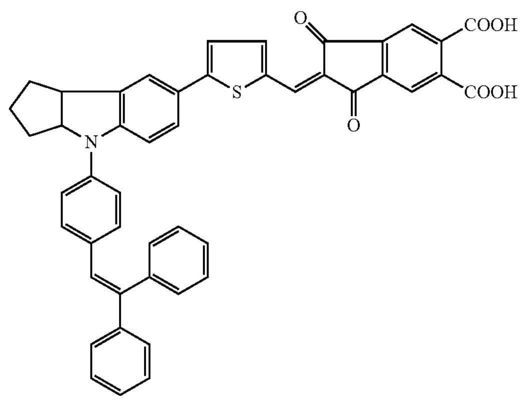
(B-31)
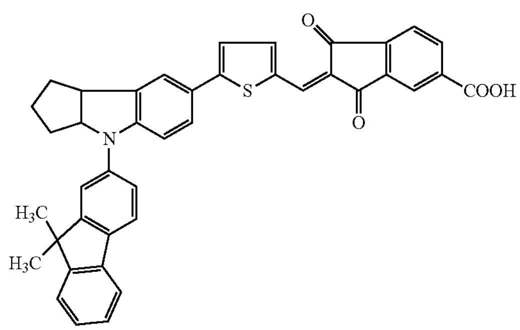
(B-32)
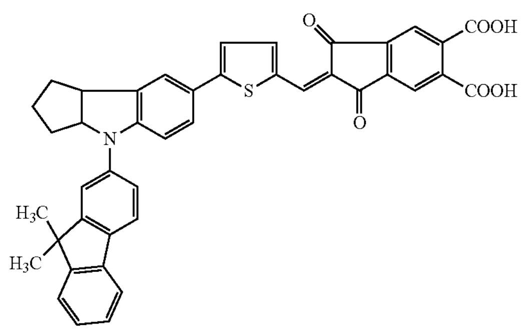
(B-33)
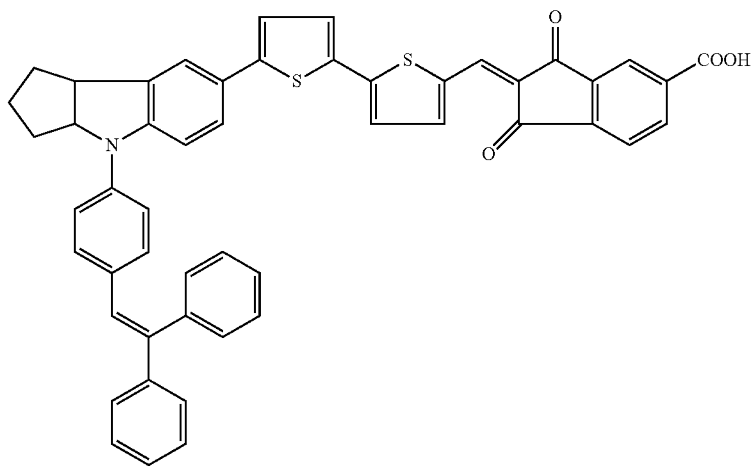

-continued
(B-34)
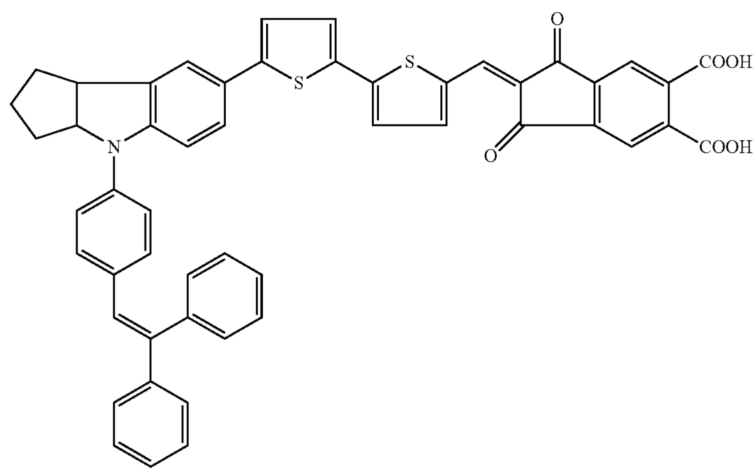
(B-35)
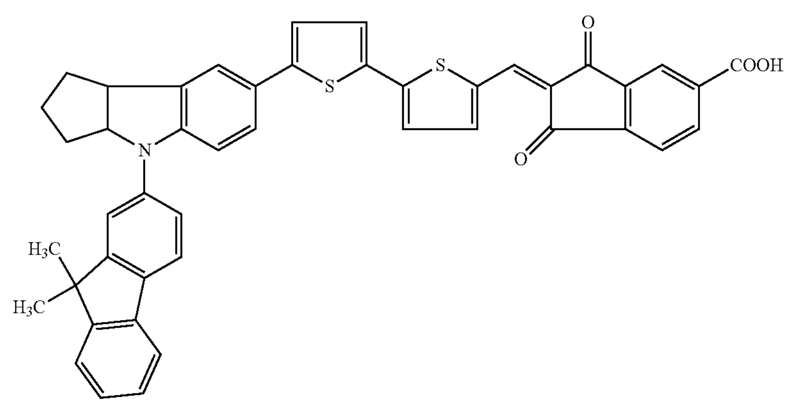
(B-36)
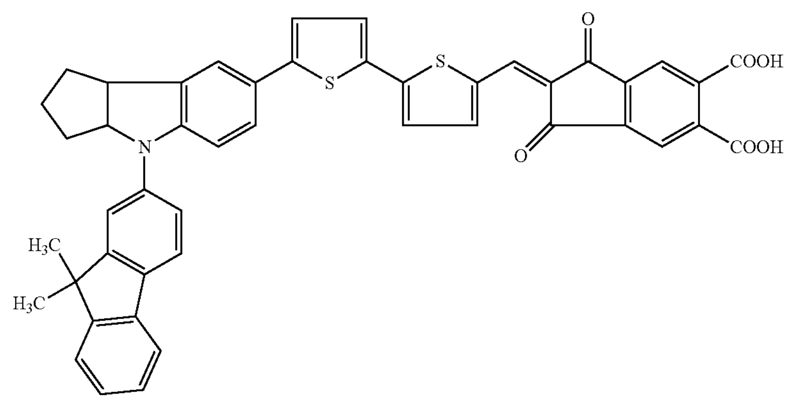
(B-37)
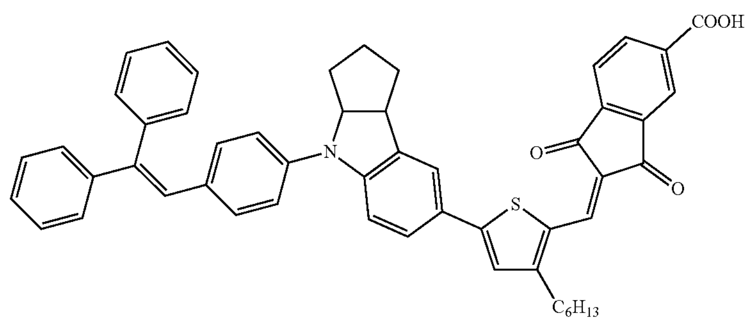

-continued (B-38)

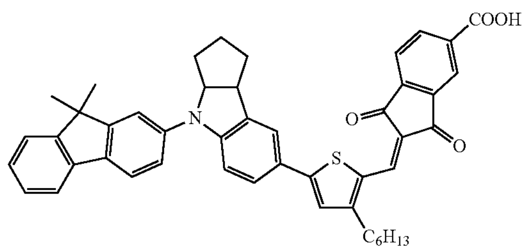

(B-39)

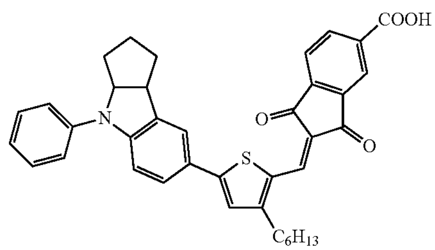

(B-40)

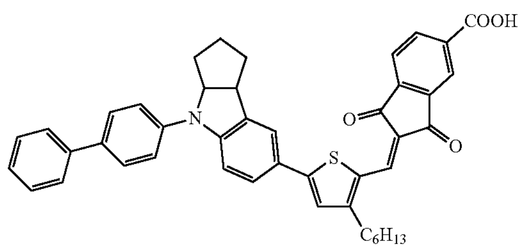

(B-41)

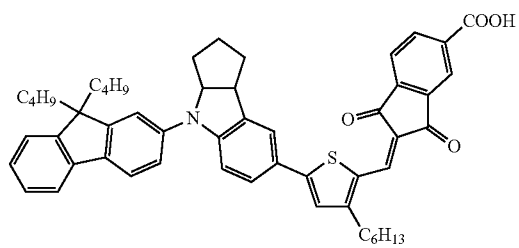

Moreover, examples of preferably used photosensitization compounds also include compounds including the following Formula (7).

Formula (7)

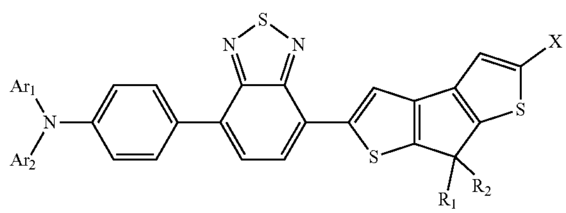

In Formula (7), $Ar_1$ and $Ar_2$ represent an aryl group that may have a substituent. In Formula (7), $R_1$ and $R_2$ represent a straight-chain or branched alkyl group having from 4 through 10 carbon atoms. In Formula (7), X represents a substituent expressed by any one of the following Structural Formulas.

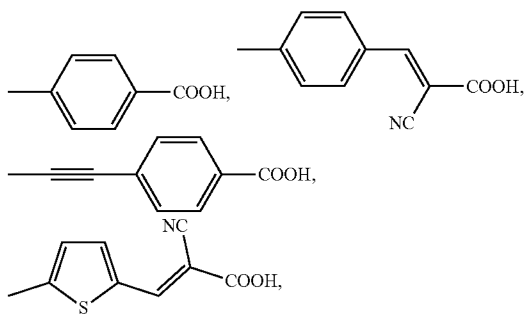

Among the photosensitization compounds represented by the above Formula (7), a compound represented by the following Formula (8) is more preferably used.

Formula (8)

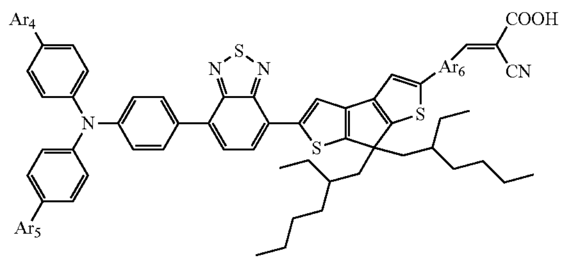

In Formula (8), $Ar_4$ and $Ar_5$ represent a phenyl group that may have a substituent or a naphthyl group that may have a substituent. In Formula (8), $Ar_6$ represents a phenyl group that may have a substituent or a thiophene group that may have a substituent.

As specific examples, exemplified compounds (B-42) to (B-58) of the photosensitization compounds represented by the above Formula (7) and the above Formula (8) are presented below, but the photosensitization compounds in the present disclosure are not limited thereto.

(B-42)
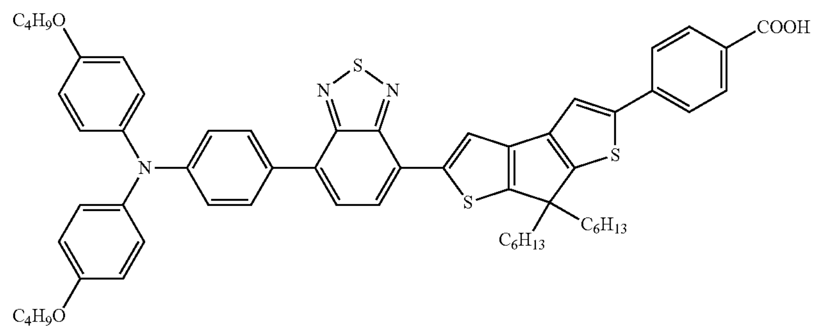
(B-43)
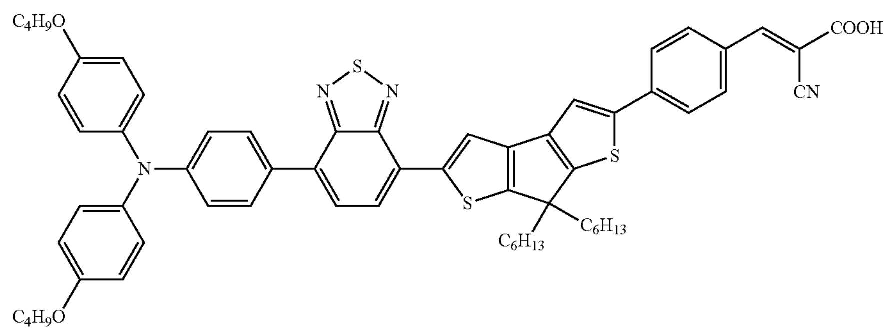
(B-44)
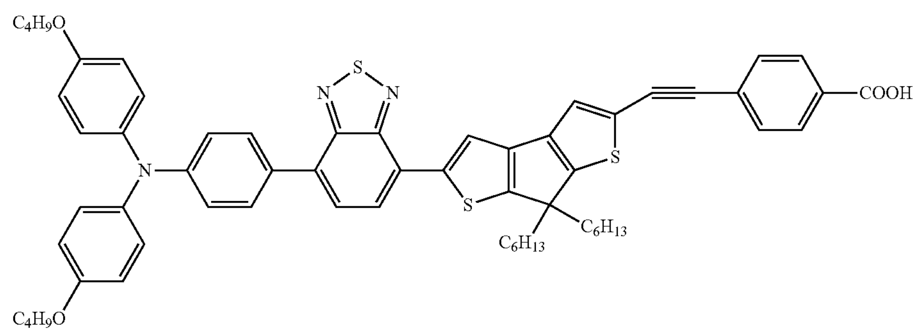
(B-45)
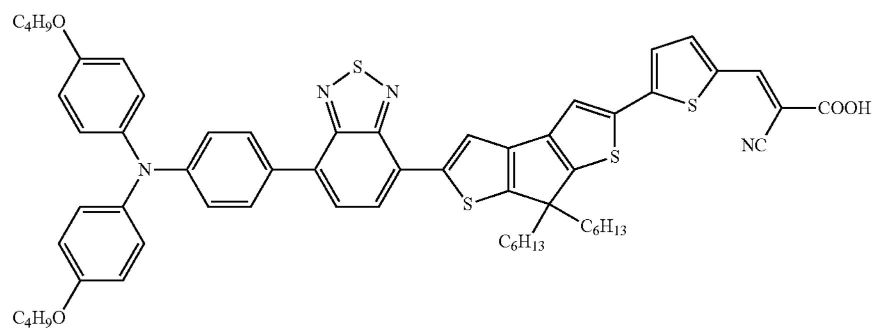

-continued
(B-46)
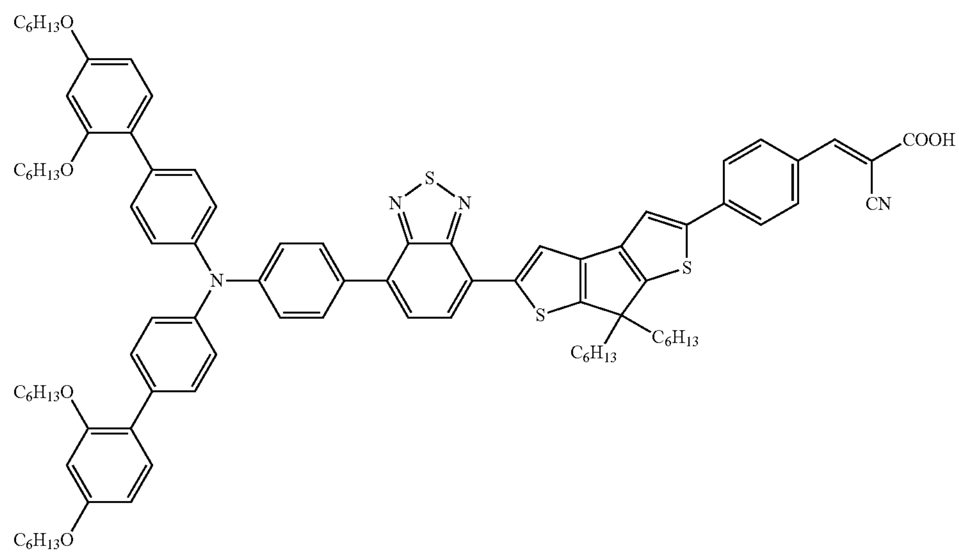
(B-47)
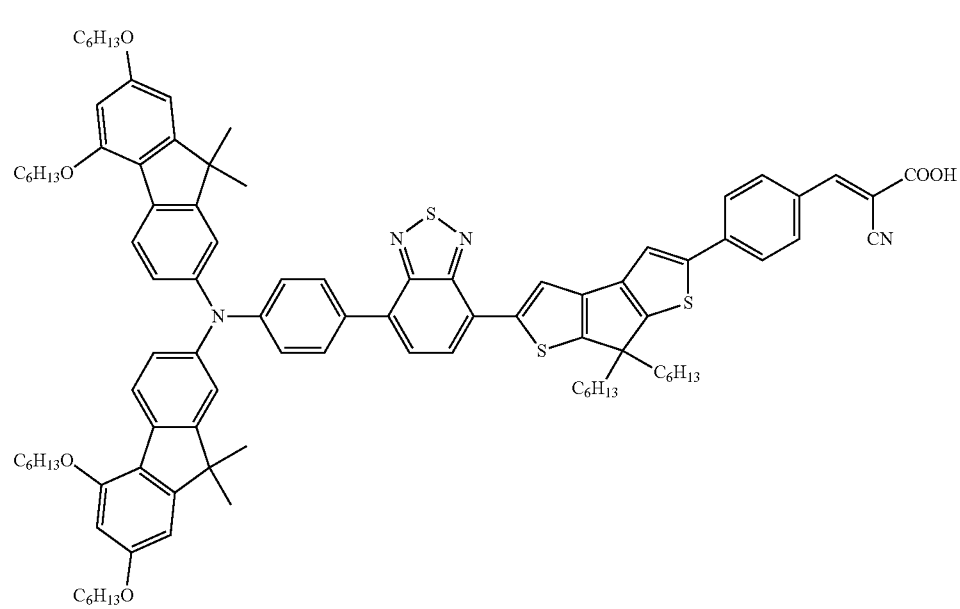

-continued
(B-48)
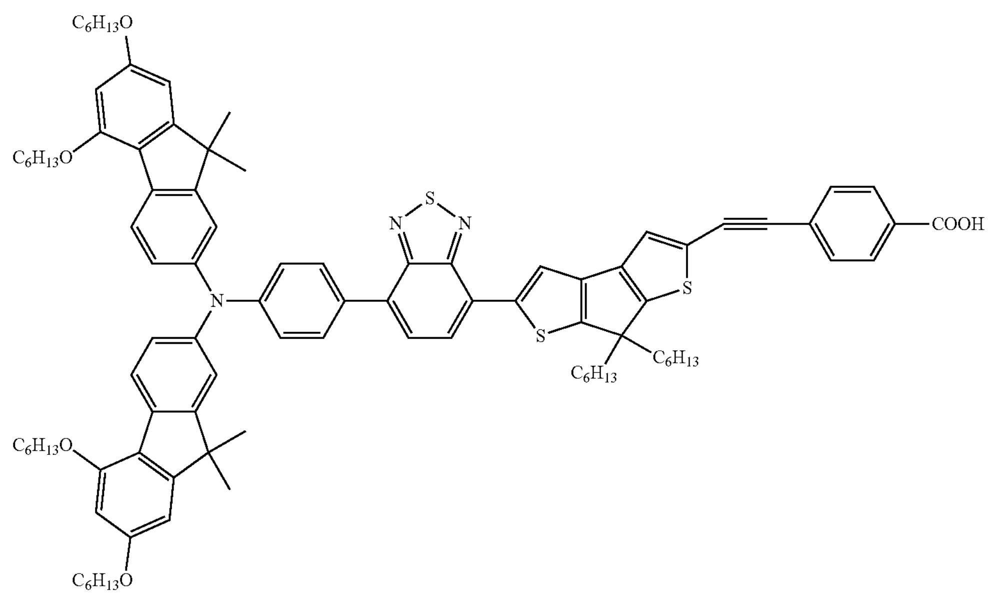
(B-49)
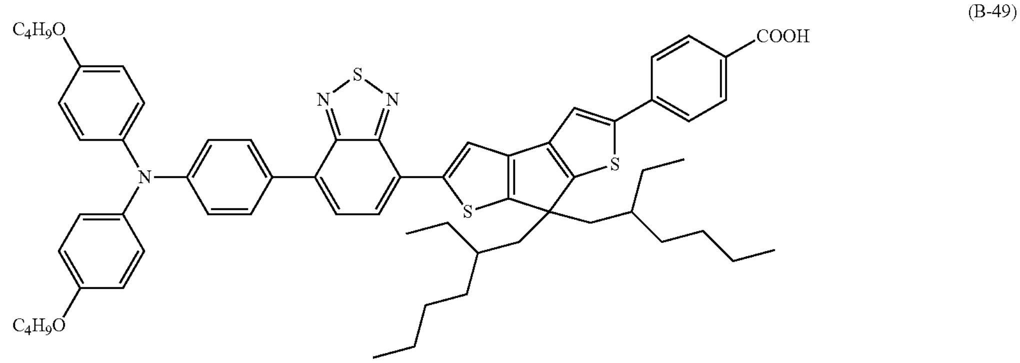
(B-50)
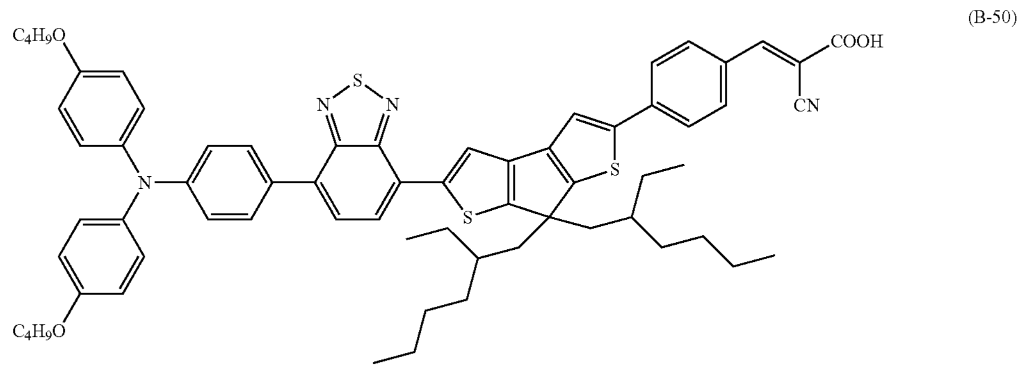

-continued
(B-51)
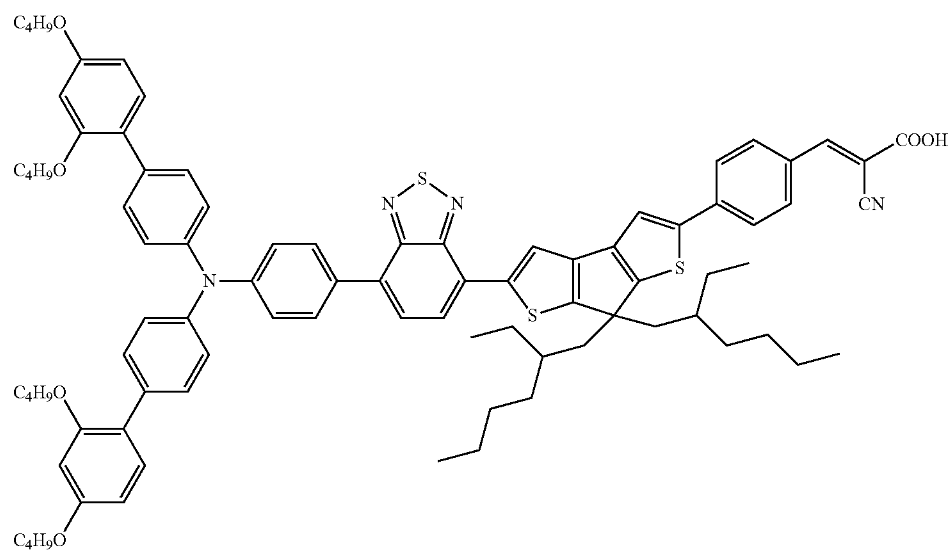
(B-52)
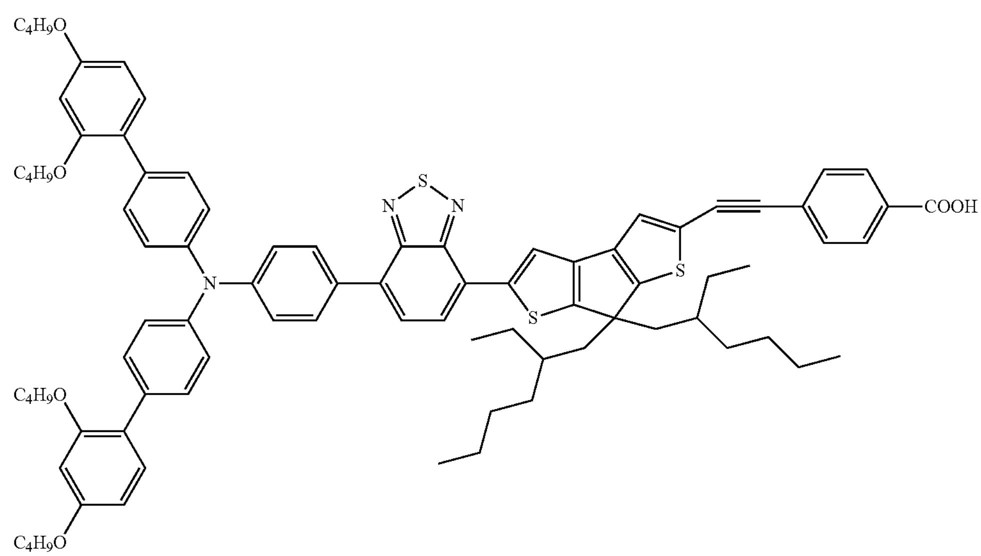
(B-53)
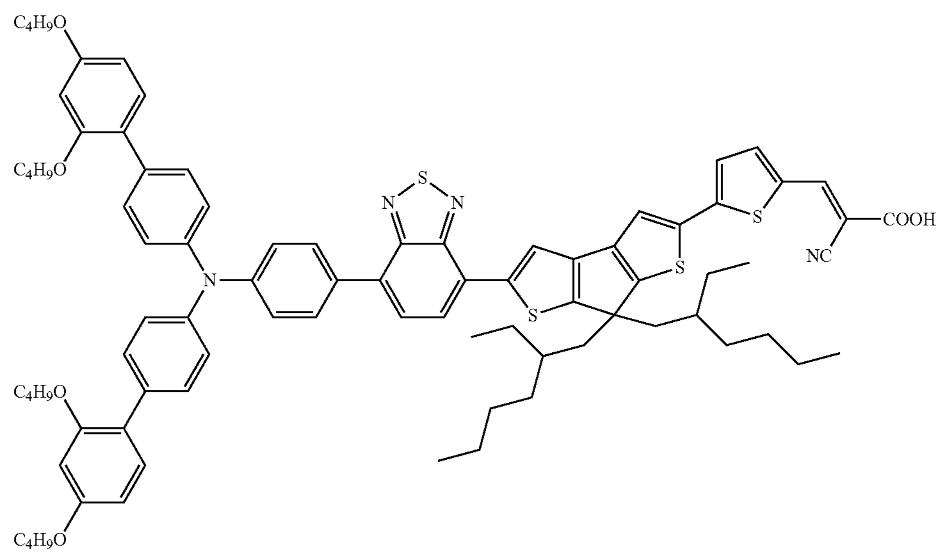

-continued
(B-54)
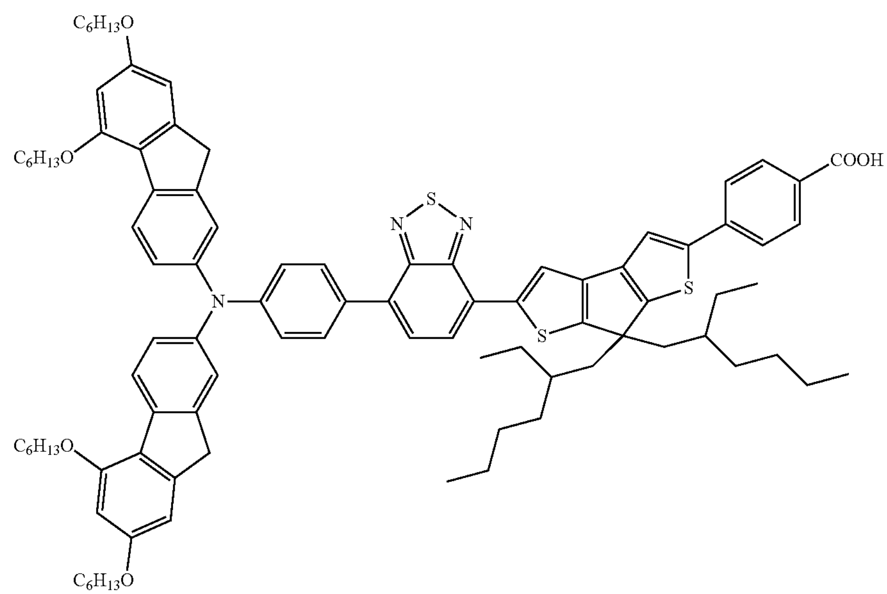
(B-55)
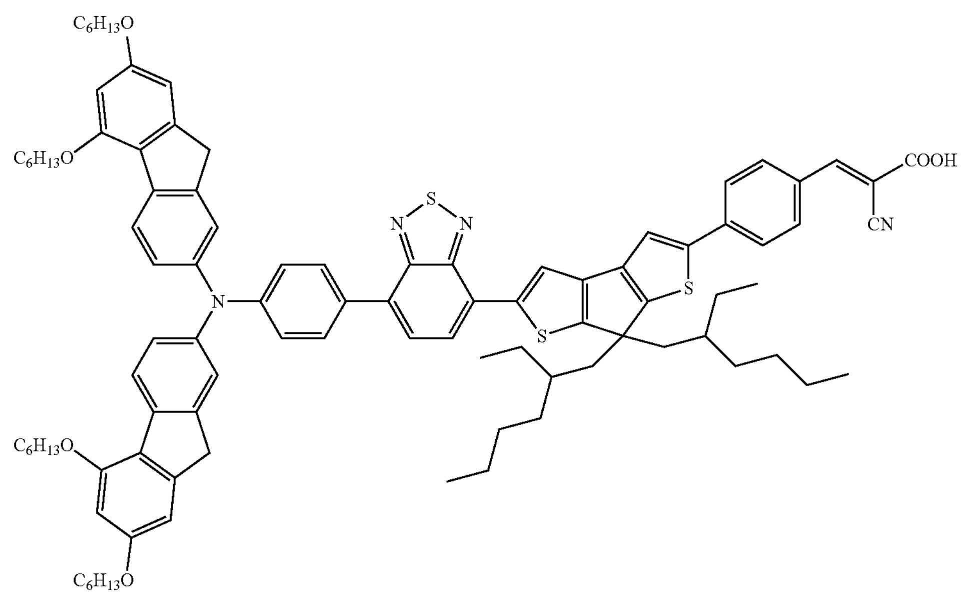

-continued
(B-56)
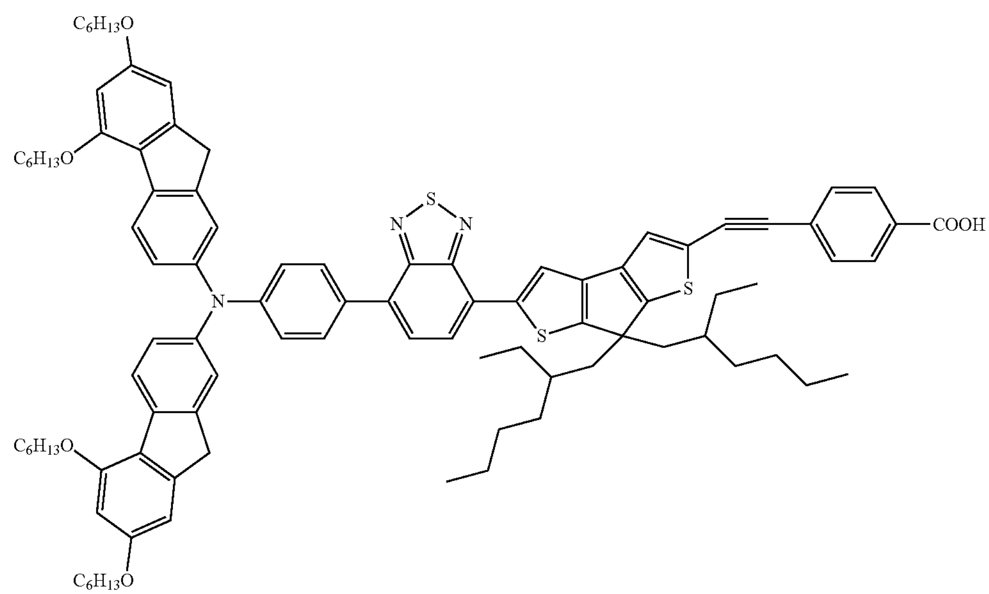
(B-57)
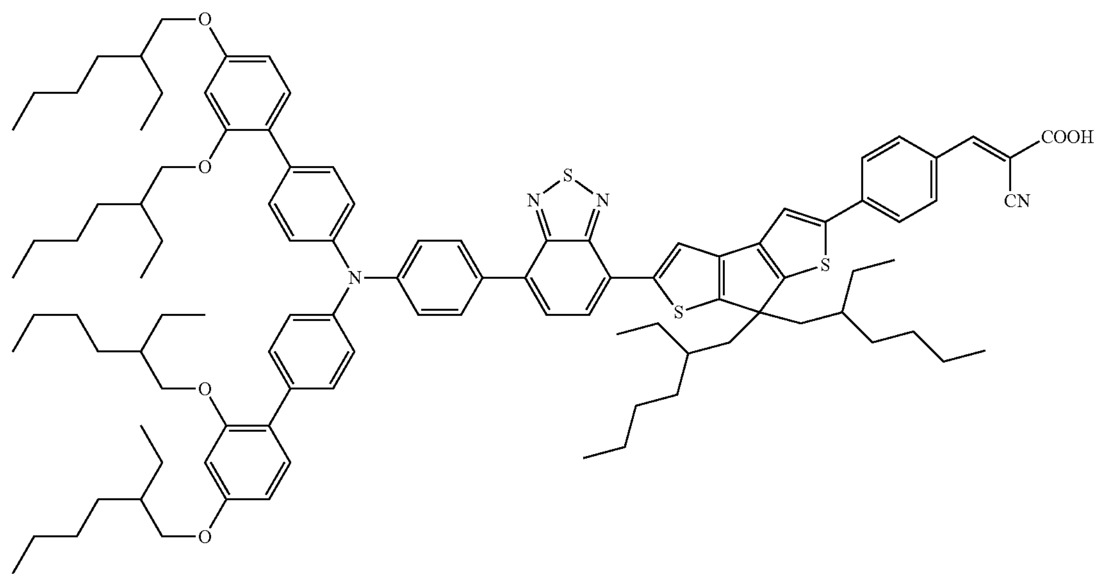

-continued (B-58)

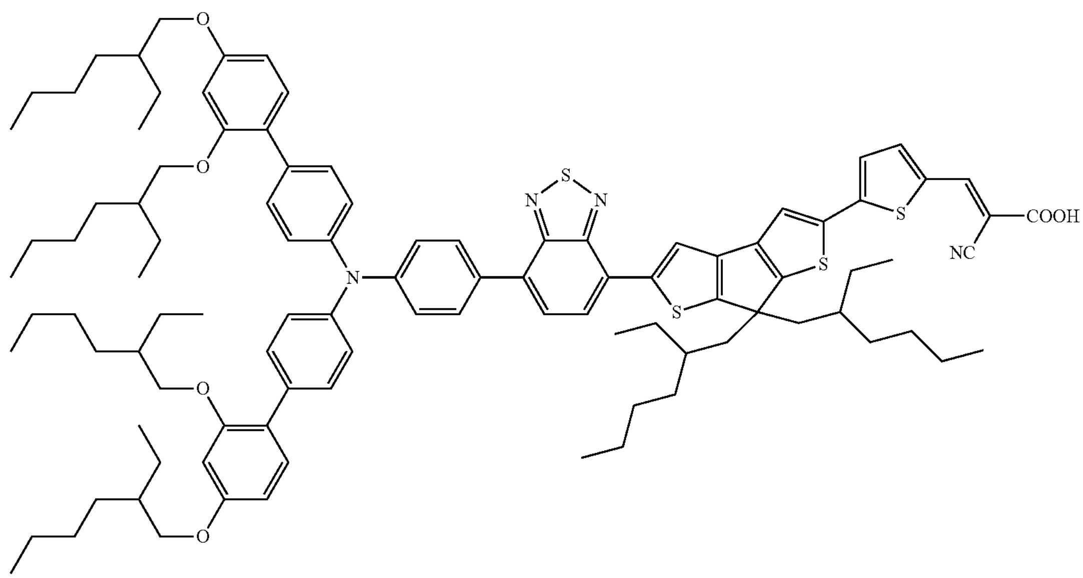

Formula (9)

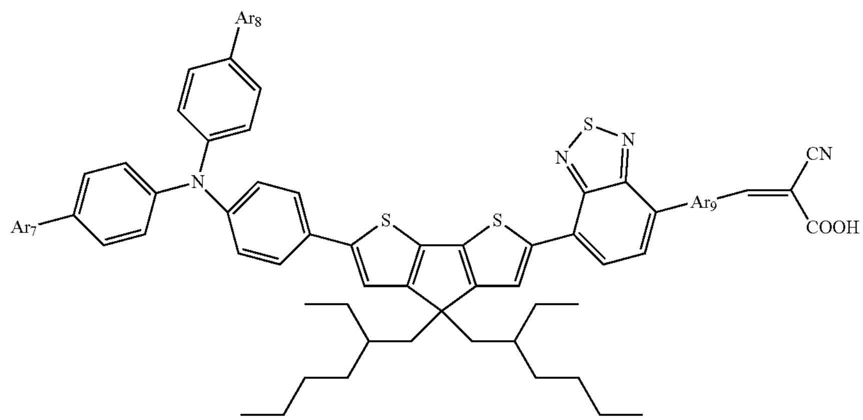

In Formula (9), $Ar_7$ and $Ar_8$ represent a phenyl group that may have a substituent or a naphthyl group that may have a substituent. In Formula (9), Arg represents a phenyl group that may have a substituent or a thiophene group that may have a substituent.

Specific examples of the photosensitization compound represented by Formula (9) include exemplified compounds (B-59) to (B-62) as presented below, but the photosensitization compound of the present disclosure is not limited thereto.

(B-59)
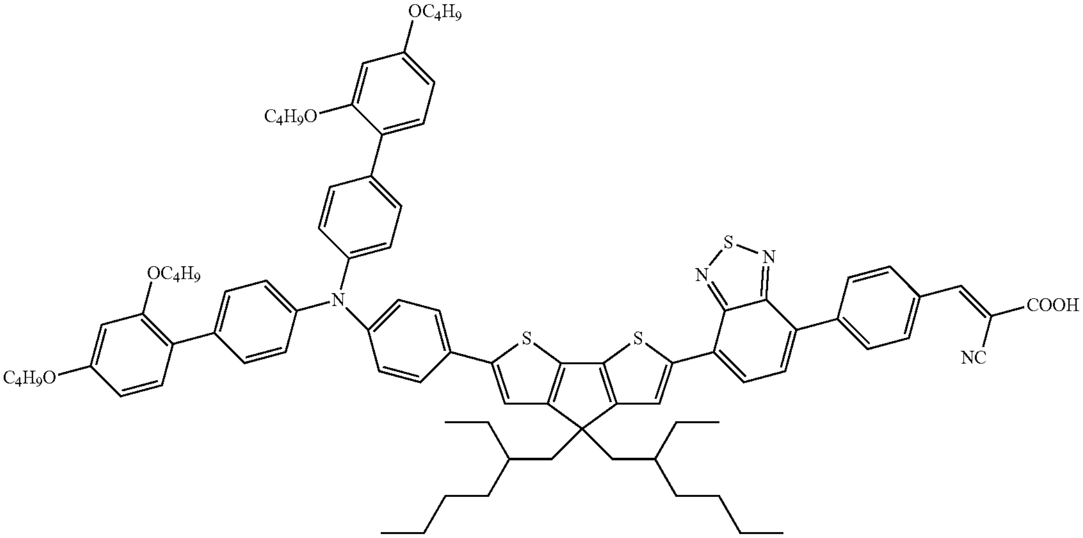
(B-60)
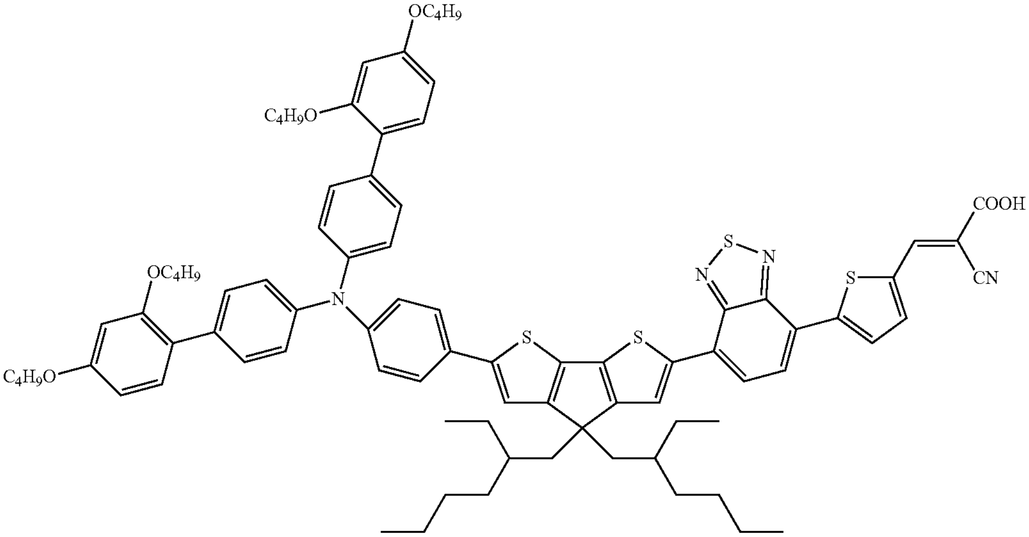
(B-61)
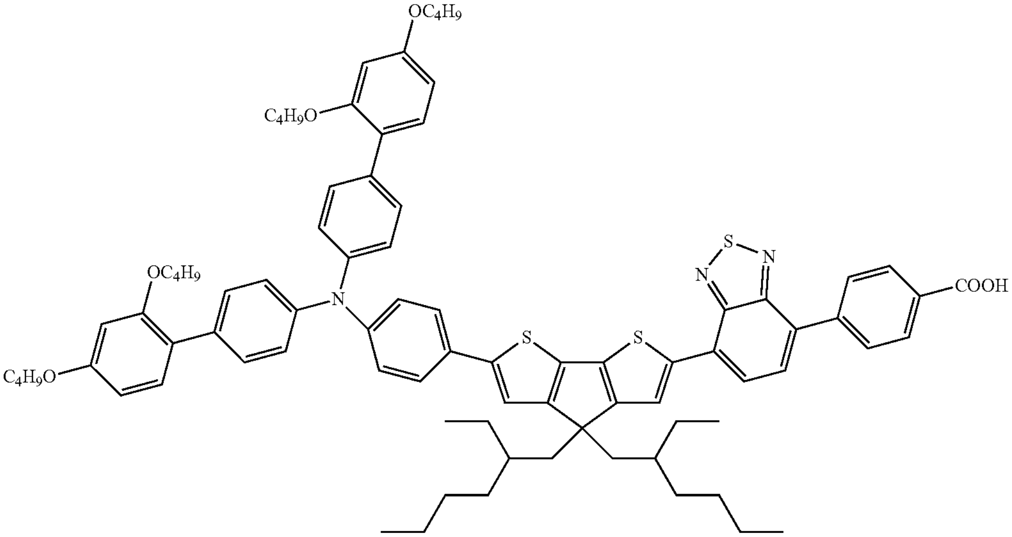

-continued (B-62)

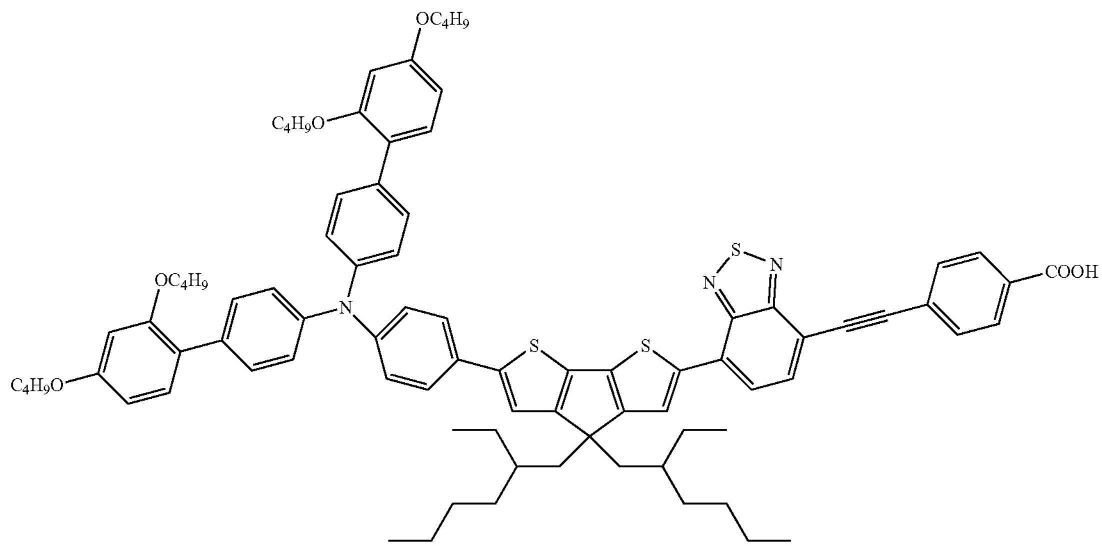

One kind of the photosensitization compound or two kinds or more of the photosensitization compounds may be included.

A LED light source used as a light source has different colors such as warm colors, cold colors, or white color. The spectra differ depending on colors.

For example, a color temperature of 3,000 K results in a relatively strong wavelength in a region of 600 nm, exhibiting a reddish light bulb color. Moreover, a color temperature of 5,000 K results in a well-balanced neutral white color as a whole. In addition, a color temperature of more than 6,500 K results in a relatively strong wavelength in a region of 450 nm, exhibiting a bluish daylight color.

Therefore, the photoelectric conversion element can preferably maintain high output even when an LED having a different color temperature is used. In this case, inclusion of mixed photosensitization compounds different in absorption wavelength in the photoelectric conversion layer is effective because the output difference caused by color temperatures can be decreased.

Examples of a method of adsorbing the photosensitization compound on the surface of the semiconductor material of the electron transport layer include: a method in which the electron transport layer including the semiconductor material is immersed in a solution of the photosensitization compound or a dispersion liquid of the photosensitization compound; and a method in which a solution of the photosensitization compound or a dispersion liquid of the photosensitization compound is coated and adsorbed on the electron transport layer.

In the case of the method in which the electron transport layer including the semiconductor material is immersed in the solution of the photosensitization compound or the dispersion liquid of the photosensitization compound, for example, any of the following methods may be used: the immersion method, the dip method, the roller method, or the air knife method.

In the case of the method in which the solution of the photosensitization compound or the dispersion liquid of the photosensitization compound is coated and adsorbed on the electron transport layer, for example, any of the following methods may be used: the wire bar method, the slide hopper method, the extrusion method, the curtain method, the spin method, or the spray method.

The photosensitization compound can be adsorbed in a supercritical fluid including carbon dioxide.

When the photosensitization compound is adsorbed on the semiconductor material, a condensation agent may be used in combination.

The condensation agent may be a substance exhibiting a catalytic action that physically or chemically binds the photosensitization compound on the surface of the semiconductor material, or may be a substance that acts stoichiometrically and advantageously transfers chemical equilibrium. As an auxiliary condensation agent, thiol or a hydroxy compound may be added.

Examples of solvents that dissolve or disperse the photosensitization compound include water, alcohol solvents, ketone solvents, ester solvents, ether solvents, amide solvents, halogenated hydrocarbon solvents, hydrocarbon solvents, and other solvents.

Examples of the alcohol solvent include methanol, ethanol, isopropyl alcohol, and t-butanol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

Examples of the other solvents include acetonitrile.

These may be used alone or in combination.

The photosensitization compound may work more effectively depending on its kind when aggregation between the compounds is minimized. Therefore, an aggregation dissociation agent may be used in combination.

The aggregation dissociation agent is not particularly limited and may be appropriately selected in accordance with a dye to be used. Preferable examples thereof include steroid compounds such as cholic acid and chenodeoxycholic acid, long chain alkylcarboxylic acid, and long chain alkylphosphonic acid.

The amount of the aggregation dissociation agent is preferably 0.01 parts by mass or more and 500 parts by mass or less, and more preferably 0.1 parts by mass or more and 100 parts by mass or less, relative to 1 part by mass of the photosensitization compound.

When the photosensitization compound, or the photosensitization compound and the aggregation dissociation agent are adsorbed on the surface of the semiconductor material constituting the electron transport layer, its temperature is preferably −50° C. or more and 200° C. or less. The adsorption time is preferably 5 seconds or more and 1,000 hours or less, more preferably 10 seconds or more and 500 hours or less, and still more preferably 1 minute or more and 150 hours or less. The adsorption step is preferably performed in a dark place. The adsorption step may be performed statically or under stirring.

The stirring method is not particularly limited and may be appropriately selected in accordance with the intended purpose. The method is, for example, a method using, for example, a stirrer, a ball mill, a paint conditioner, a sand mill, an attritor, a disperser, or ultrasonic dispersion.

The electron transport layer preferably includes a perovskite layer adjacent to the electron transport layer and a bulk heterojunction layer.

<<<Perovskite Layer>>>

The perovskite layer means a layer that contains a perovskite compound and absorbs light to sensitize the electron transport layer. Therefore, the perovskite layer is preferably disposed adjacent to the electron transport layer.

The shape and size of the perovskite layer are not particularly limited and may be appropriately selected in accordance with the intended purpose.

The perovskite compound is a complex substance of an organic compound and an inorganic compound, and is represented by the following Formula (X).

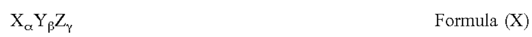

$X_\alpha Y_\beta Z_\gamma$ Formula (X)

In Formula (X), a ratio of α:β:γ is 3:1:1; β and γ are each an integer of more than 1; X represents halogen; Y represents an organic compound including an amino group; and Z represents a metal ion.

X in Formula (X) is not particularly limited and may be appropriately selected in accordance with the intended purpose. Examples thereof include halogen such as chlorine, bromine, and iodine. These may be used alone or in combination.

Y in the above Formula (X) is not particularly limited and may be appropriately selected in accordance with the intended purpose as long as it is an organic cation. Examples thereof include: ions of alkyl amine compounds (e.g., methyl amine, ethyl amine, n-butylamine, and formamidine); and inorganic alkali metal cations (e.g., antimony ions, cesium ions, potassium ions, and rubidium ions). These may be used alone or in combination. The inorganic alkali metal cation and the organic cation may be each used in combination. Among them, an organic compound including an amino group (an ion of an alkyl amine compound) is preferable.

In the case of the perovskite compound of lead halide and methylammonium, a peak λmax of the optical absorption spectrum is about 350 nm when the halogen ion is Cl, the peak λmax is about 410 nm when the halogen ion is Br, and the peak λmax is about 540 nm when the halogen ion is I. As described above, the peak λmax is shifted to a longer wavelength side, so a usable spectrum width (band width) varies.

Z in the above Formula (X) is not particularly limited and may be appropriately selected in accordance with the intended purpose. Examples thereof include ions of metals such as lead, indium, antimony, tin, copper, and bismuth. These may be used alone or in combination.

The perovskite layer preferably has a stacked perovskite structure where a layer formed of metal halide and a layer of arranged organic cation molecules are stacked on top of one another.

An average film thickness of the perovskite layer is 50 nm or more and 2 μm or less, and more preferably 100 nm or more and 600 nm or less.

A method of forming the perovskite layer is not particularly limited and may be appropriately selected in accordance with the intended purpose. Examples of the method include a method in which a solution obtained by dissolving or dispersing, for example, metal halide and halogenated alkylamine or cesium halide is coated, followed by drying.

Moreover, examples of the method of forming the perovskite layer include a two-step precipitation method as described below. Specifically, for example, a solution obtained by dissolving or dispersing metal halide is coated, followed by drying. Then, the dried product is immersed in a solution obtained by dissolving halogenated alkylamine, to form the perovskite compound.

Moreover, examples of the method of forming the perovskite layer include a method in which a poor solvent (solvent having a small solubility) for the perovskite compound is added while a solution obtained by dissolving or dispersing, for example, metal halide and halogenated alkylamine is coated thereon, to precipitate crystals.

In addition, examples of the method of forming the perovskite layer include a method in which metal halide is deposited in a gas filled with, for example, methylamine.

Among them, it is preferable to use a method in which a poor solvent for the perovskite compound is added while a solution obtained by dissolving or dispersing, for example, metal halide and halogenated alkylamine is coated thereon, to precipitate crystals.

A method of coating the solution is not particularly limited and may be appropriately selected in accordance with the intended purpose. Examples of the method include the immersion method, the spin coating method, the spray method, the dip method, the roller method, and the air knife method. As the method of coating the solution, a method of performing precipitation in a supercritical fluid using, for example, carbon dioxide may be used.

The perovskite layer may include a photosensitization dye (photosensitization compound).

A method of forming the perovskite layer including the photosensitization dye (photosensitization compound) is not particularly limited and may be appropriately selected in accordance with the intended purpose. Examples of the method include: a method in which the perovskite compound and the photosensitization dye (photosensitization compound) are mixed; and a method in which the perovskite layer is formed, followed by adsorbing the photosensitization dye (photosensitization compound).

The photosensitization dye (photosensitization compound) is not particularly limited and may be appropriately selected in accordance with the intended purpose, as long as it is a compound photoexcited by excitation light to be used.

Examples of photosensitization dyes (photosensitization compound) include metal complex compounds, coumarin compounds, polyene compounds, indoline compounds, thiophene compounds, cyanine dyes, merocyanine dyes, 9-aryl xanthene compounds, triarylmethane compounds, phthalocyanine compounds, and porphyrin compounds.

Examples of metal complex compounds include metal complex compounds described in, for example, Japanese Translation of PCT International Application Publication No. 7-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062.

Examples of coumarin compounds include coumarin compounds described in, for example, Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007).

Examples of polyene compounds include polyene compounds described in, for example, Japanese Unexamined Patent Application Publication No. 2004-95450 and Chem. Commun., 4887 (2007).

Examples of indoline compounds include indoline compounds described in, for example, Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, J. Am. Chem. Soc., 12218, Vol. 126 (2004), Chem. Commun., 3036 (2003), and Angew. Chem. Int. Ed., 1923, Vol. 47 (2008).

Examples of thiophene compounds include thiophene compounds described in, for example, J. Am. Chem. Soc., 16701, Vol. 128 (2006) and J. Am. Chem. Soc., 14256, Vol. 128 (2006).

Examples of cyanine dyes include cyanine dyes described in, for example, Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359.

Examples of merocyanine dyes include merocyanine dyes described in, for example, Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360.

Examples of 9-aryl xanthene compounds include 9-aryl xanthene compounds described in, for example, Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273.

Examples of triarylmethane compounds include triarylmethane compounds described in, for example, Japanese Unexamined Patent Application Publication No. 10-93118 and Japanese Unexamined Patent Application Publication No. 2003-31273.

Examples of phthalocyanine compounds and porphyrin compounds include phthalocyanine compounds and porphyrin compounds described in, for example, Japanese Unexamined Patent Application Publication No. 9-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008).

Among them, metal complex compounds, indoline compounds, thiophene compounds, and porphyrin compounds are preferable.

<<<Bulk Heterojunction Layer>>>

The bulk heterojunction layer includes an electron-donating organic material and an electron-withdrawing organic material.

In the bulk heterojunction layer, the electron-donating organic material (P-type organic semiconductor) and the electron-withdrawing organic material (N-type organic semiconductor) are mixed, and thus the bulk heterojunction, which is the nano-sized PN junction, will occur. As a result, photocharge separation occurring at the junction surface can be used to obtain electric current.

<<<<Electron-Donating Organic Material (P-Type Organic Semiconductor)>>>>

Examples of the P-type organic semiconductor include conjugated polymers and low-molecular-weight compounds such as polythiophene or derivatives thereof, arylamine derivatives, stilbene derivatives, oligothiophene or derivatives thereof, phthalocyanine derivatives, porphyrin or derivatives thereof, polyphenylene vinylene or derivatives thereof, polyphenylene vinylene or derivatives thereof, benzodithiophene derivatives, and diketo-pyrrolo-pyrrole derivatives. These may be used alone or in combination.

Among the above, polythiophene or derivatives thereof, which are n-conjugated conductive polymers, are preferable. The polythiophene and derivatives thereof are advantageous because they can ensure an excellent stereoregularity and have a relatively high solubility to a solvent.

The polythiophene and the derivatives thereof are not particularly limited and may be appropriately selected in accordance with the intended purpose, as long as they have a thiophene skeleton. Examples thereof include: polyalkylthiophene such as poly-3-hexylthiophene; polyalkylisothionaphthene such as poly-3-hexylisothionaphthene, poly-3-octylisothionaphthene, and poly-3-dichlorothionaphthene; and polyethylenedioxythiophene.

In recent years, derivatives such as PTB7 (poly[{4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl}]) and PCDTBT (poly[N-9"-heptadecanyl-2,7-carbazole-alt-5,5-(4',7'-di-2-thienyl-2',1',3'-benzothiadiazole])), which are copolymers including benzodithiophene, carbazole, benzothiadiazole, and thiophene, have been exemplified as compounds that can achieve an excellent photoelectric conversion efficiency.

In addition to the conjugated polymers, even in the low-molecular-weight compounds obtained by binding an electron-donating unit with an electron-withdrawing unit, compounds that can achieve an excellent photoelectric conversion efficiency have been known and can also be used in the present disclosure (see, for example, ACSAppl. Mater. Interfaces 2014, 6, 803-810).

Among the low-molecular-weight compounds as the electron-donating organic material, a compound represented by the following Formula (A) is preferable.

Formula (B)

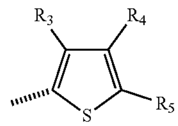

In Formula (B), $R_3$ and $R_4$ represent a hydrogen atom or an alkyl group having from 6 through 12 carbon atoms.

In Formula (B), R; represents an alkyl group that may include a branched chain having from 6 through 22 carbon Formula (A)

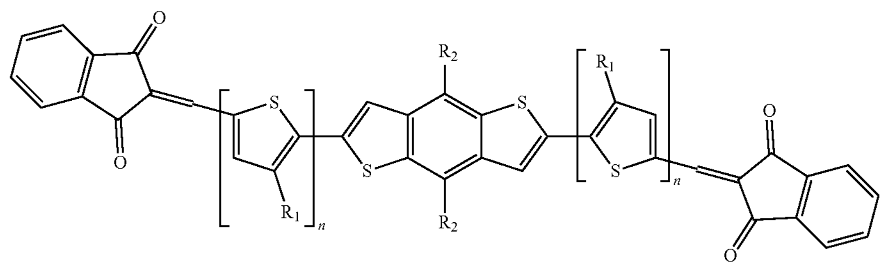

In Formula (A), n represents an integer of from 1 through 3.

atoms. Among them, an alkyl group that may include a branched chain having from 6 through 12 carbon atoms is preferable.

In Formula (A), $R_1$ represents an n-butyl group, an n-hexyl group, an n-octyl group, an n-decyl group, or an n-dodecyl group.

More specific examples of the low-molecular-weight compound as the electron-donating organic material are preferably compounds represented by the following Formula (C).

Formula (C)

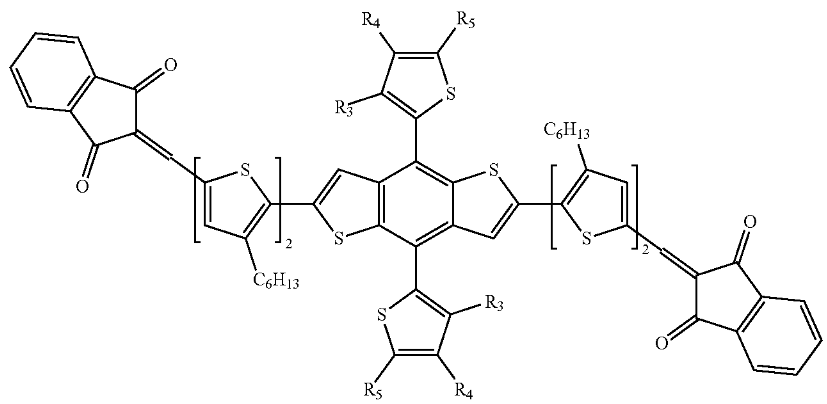

In Formula (A), $R_2$ represents an oxygen atom that has an alkyl group having from 6 through 22 carbon atoms, a sulfur atom that has an alkyl group having from 6 through 22 carbon atoms, a carbon atom that has an alkyl group having from 6 through 22 carbon atoms, or a group represented by the following Formula (B). Among them, an oxygen atom that has an alkyl group having from 6 through 20 carbon atoms, a sulfur atom that has an alkyl group having from 6 through 20 carbon atoms, a carbon atom that has an alkyl group having from 6 through 20 carbon atoms, and a group represented by the following Formula (B) are preferable.

In Formula (C), $R_3$ and $R_4$ represent a hydrogen atom or an alkyl group having from 6 through 12 carbon atoms, and preferably represent a hydrogen atom or an alkyl group having from 6 through 10 carbon atoms.

In Formula (C), $R_5$ represents an alkyl group that may include a branched chain having from 6 through 22 carbon atoms, and preferably represents an alkyl group that may include a branched chain having from 6 through 12 carbon atoms.

Specific examples of the compound represented by Formula (C) will be described below. However, the present disclosure is not limited thereto.

TABLE 1

| Exemplified compounds | $R_3$ | $R_4$ | $R_5$ |
|---|---|---|---|
| 1 | H | H | 2-ethylhexyl |
| 2 | H | n-hexyl | n-hexyl |
| 3 | H | H | n-hexyl |
| 4 | n-hexyl | H | n-hexyl |
| 5 | H | H | 2-butyloctyl |
| 6 | H | n-octyl | n-octyl |
| 7 | H | H | n-octyl |
| 8 | n-octyl | H | n-octyl |
| 9 | H | H | 2-decyldodecyl |
| 10 | H | n-dodecyl | n-dodecyl |
| 11 | H | H | n-dodecyl |
| 12 | n-dodecyl | H | n-dodecyl |

<<<<Electron-Withdrawing Organic Material (N-Type Organic Semiconductor)>>>>

Examples of the electron-withdrawing organic material include imide derivatives, fullerene, and fullerene derivatives. Among them, fullerene derivatives are preferable in terms of charge separation and charge transport.

As the fullerene derivative, an appropriately synthesized product may be used or a commercially available product may be used. Examples thereof include product names of PC71BM (phenyl C71 butyric acid methyl ester, manufactured by Frontier Carbon Corporation), PC61BM (phenyl C61 butyric acid methyl ester, manufactured by Frontier Carbon Corporation), PC85BM (phenyl C85 butyric acid methyl ester, manufactured by Frontier Carbon Corporation), and ICBA (fullerene indene 2 adduct, manufactured by Frontier Carbon Corporation). In addition to the above, fluoropyrrolidine-based fullerene derivatives represented by the following Formula (D) may be used.

Formula (D)

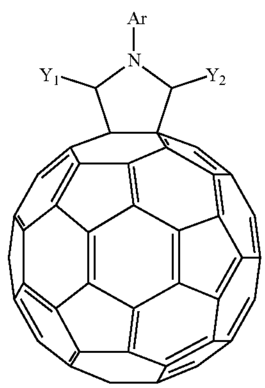

In Formula (D), $Y_1$ and $Y_2$, which may be identical to or different from each other, represent a hydrogen atom, an alkyl group that may have a substituent, an alkenyl group that may have a substituent, an alkynyl group that may have a substituent, an aryl group that may have a substituent, or an aralkyl group that may have a substituent.

Note that, in Formula (D), $Y_1$ and $Y_2$ are not a hydrogen atom at the same time.

In Formula (D), the Ar represents an aryl group that may have a substituent.

Specific examples of the aryl group include a phenyl group, a naphthyl group, an anthryl group, and a phenanthryl group. Among them, a phenyl group is preferable.

In Formula (D), as the substituent in the aryl group that has a substituent represented by the Ar, the substituent preferably excludes an oxygen atom. Examples of the substituent in the aryl group that has the substituent represented by the Ar include an aryl group, an alkyl group, a cyano group, an alkoxy group, and an alkoxycarbonyl group. Among these substituents, examples of the aryl group include a phenyl group.

The alkyl group and the alkyl group portion of the alkoxy group are, for example, an alkyl group having from 1 through 22 carbon atoms similarly with alkyl groups represented by $Y_1$ and $Y_2$ that will be described below.

The number and substitution site of these substituents are not particularly limited. For example, one to three substituent(s) can exist at any position of the aryl group represented by Ar.

In Formula (D), among the groups represented by the $Y_1$ and the $Y_2$, the alkyl group is preferably an alkyl group having from 1 through 22 carbon atoms, more preferably an alkyl group having from 1 through 12 carbon atoms, and particularly preferably an alkyl group having from 6 through 12 carbon atoms. These alkyl groups may be a straight-chain alkyl group or may be a branched alkyl group, but are particularly preferably a straight-chain alkyl group.

The alkyl group may further include one or two or more hetero elements such as S and O in the carbon chain thereof.

In Formula (D), among the groups represented by the $Y_1$ and the $Y_2$, the alkenyl group is preferably an alkenyl group having from 2 through 10 carbon atoms. More preferable specific examples thereof include straight-chain or branched alkenyl groups having from 2 through 4 carbon atoms such as a vinyl group, a 1-propenyl group, an allyl group, an isopropenyl group, a 1-butenyl group, a 2-butenyl group, a 3-butenyl group, a 1-methyl-2-propenyl group, and a 1,3-butadienyl group.

In Formula (D), among the groups represented by the $Y_1$ and the $Y_2$, the alkynyl group is preferably an alkynyl group having from 1 through 10 carbon atoms. More preferable specific examples thereof include straight-chain or branched alkynyl groups having from 2 through 4 carbon atoms such as an ethynyl group, a 1-propynyl group, a 2-propynyl group, a 1-methyl-2-propynyl group, a 1-butynyl group, a 2-butynyl group, and a 3-butynyl group.

In Formula (D), among the groups represented by the $Y_1$ and the $Y_2$, examples of the aryl group include a phenyl group, a naphthyl group, an anthryl group, and a phenanthryl group.

In Formula (D), among the groups represented by the $Y_1$ and the $Y_2$, examples of the aralkyl group include aralkyl groups having from 7 through 20 carbon atoms such as 2-phenylethyl, benzyl, 1-phenylethyl, 3-phenylpropyl, and 4-phenylbutyl.

As described above, in Formula (D), the alkyl group, the alkenyl group, the alkynyl group, the aryl group, and the aralkyl group of the groups represented by the $Y_1$ and the $Y_2$ include a case of including a substituent and a case of including no substituent.

In Formula (D), examples of the substituents that can be included in the groups represented by the $Y_1$ and the $Y_2$ include an alkyl group, an alkoxycarbonyl group, a polyether group, an alkanoyl group, an amino group, an aminocarbonyl group, an alkoxy group, an alkylthio group, a group: —CONHCOR' (wherein R' is an alkyl group), a group: —C(=NR')—R" (wherein R' and R" are an alkyl group), and a group: —NR'=CR"R'" (wherein R', R", and R are an alkyl group).

In Formula (D), among the substituents that can be included in the groups represented by the $Y_1$ and the $Y_2$, examples of the polyether group include a group represented by the formula: $Y_3$—$(OY_4)$n-O—. Here, $Y_3$ represents a monovalent hydrocarbon group such as an alkyl group, and $Y_4$ represents a bivalent aliphatic hydrocarbon group.

In the polyether group represented by the above formula, specific examples of recurring units represented by —$(OY_4)_n$— include alkoxy chains such as —$(OCH_2)_n$—, —$(OC_2H_4)_n$—, and —$(OC_3H_6)_n$—. The recurring number n of these recurring units is preferably from 1 through 20, and more preferably from 1 through 5. The recurring unit represented by —$(OY_4)_n$— may include not only the same recurring unit but also two or more kinds of different recurring units. Among the aforementioned recurring units, —$OC_2H_4$— and —$OC_3H_6$—may have a straight chain or a branched chain.

In Formula (D), among the substituents that can be included in the groups represented by the $Y_1$ and the $Y_2$, the alkyl group portion (R', R") in the alkoxycarbonyl group, the alkanoyl group, the alkoxy group, the alkylthio group, the polyether group, the group: —CONHCOR', the group: —C(=NR')—R", and the group: —NR'=CR"R'" are preferably an alkyl group having from 1 through 22 carbon atoms, more preferably an alkyl group having from 1 through 12 carbon atoms, and particularly preferably an alkyl group having from 6 through 12 carbon atoms, similarly with the aforementioned alkyl group.

The amino group, and the amino group portion in the aminocarbonyl group are particularly preferably an amino group to which one or more alkyl groups having from 1 through 20 carbon atoms are bound.

Among the fullerene derivatives represented by the Formula (D), examples of the compound having preferable performances include compounds represented by the Formula (D), where, in the Formula (D), Ar represents a phenyl group that has a substituent or a phenyl group that has no substituent; and one of $Y_1$ and $Y_2$ is a hydrogen atom, and the other is an alkyl group including an alkoxycarbonyl group as a substituent, an alkyl group including an alkoxy group as a substituent, an alkyl group including a polyether group as a substituent, an alkyl group including an amino group as a substituent, or a phenyl group that includes a substituent or includes no substituent.

Among such compounds, examples of the compound having particularly preferable performances include compounds represented by Formula (D), where Ar is a phenyl group that includes, as a substituent, a phenyl group, a cyano group, an alkoxy group, an alkoxycarbonyl group, or an alkyl group, or is a phenyl group without a substituent; and one of $Y_1$ and $Y_2$ is a hydrogen atom, and the other is an alkyl group including an alkoxycarbonyl group as a substituent, an alkyl group including an alkoxy group as a substituent, an alkyl group including a polyether group as a substituent, a phenyl group, a phenyl group including an alkyl group as a substituent, a phenyl group including an alkoxycarbonyl group as a substituent, or a phenyl group including an alkoxycarbonyl group as a substituent.

These compounds include a group having an appropriate polarity on the pyrrolidine skeleton and are excellent in a self-assembling property. Therefore, when a photoelectric conversion layer having a bulk heterojunction structure is formed, it is possible to form a photoelectric conversion part that has a bulk heterojunction structure having an appropriate layer separation structure. As a result, it is believed that, for example, the electron mobility is improved to exhibit a high conversion efficiency.

Examples of the most preferable compound include compounds represented by Formula (D), where Ar is a phenyl group; one of $Y_1$ and $Y_2$ represents a hydrogen atom, and the other represents a non-substituted alkyl group (alkyl group having from 4 through 6 carbon atoms), a non-substituted phenyl group, a 1-naphthyl group, or a 2-naphthyl group.

The method of forming the bulk heterojunction layer is not particularly limited and may be appropriately selected in accordance with the intended purpose. Examples of the method include spin coating, blade coating, slit die coating, screen-print coating, bar coater coating, mold coating, transfer printing method, dip drawing method, the inkjet method, the spray method, and vacuum deposition method. The method can be appropriately selected from the above depending on the characteristics (e.g., thickness control and orientation control) of the thin film of the organic material to be produced.

In order to remove an organic solvent from the produced thin film of the organic material, an annealing treatment may be performed under reduced pressure or under an inert atmosphere (under nitrogen or argon atmosphere). The temperature of the annealing treatment is preferably 40° C. or more and 300° C. or less, and more preferably 50° C. or more and 200° C. or less. The annealing treatment can increase an effective area where stacked layers permeate at the boundary to contact each other. Therefore, the short circuit current can be increased. Note that, the annealing treatment may be performed after formation of electrodes.

The organic solvent is not particularly limited and may be appropriately selected in accordance with the intended purpose. Examples of the solvent include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, chloronaphthalene, dimethylformamide, dimethyl sulfoxide, N-methylpyrrolidone, and γ-butyrolactone. These may be used alone or in combination. Among them, chlorobenzene, chloroform, and o-dichlorobenzene are preferable.

In order to control the phase separation structure of the P-type organic semiconductor and the N-type organic semiconductor, an additive may be added to the organic solvent in an amount of 0.1% by mass or more and 10% by mass or less. Examples of the additive include diiodoalkanes (e.g., 1,8-diiodooctane, 1,6-diiodohexane, and 1,10-diiododecane), alkane dithiols (e.g., 1,8-octanedithiol, 1,6-hexanedithiol, and 1,10-decanedithiol), 1-chloronaphthalene, and polydimethylsiloxane derivatives.

The average thickness of the photoelectric conversion layer is preferably 50 nm or more and 400 nm or less, and more preferably 60 nm or more and 250 nm or less. When the average thickness of the photoelectric conversion layer is 50 nm or more, insufficient generation of carriers, which is caused by decreasing light absorption in the photoelectric conversion layer, does not occur. When the average thickness is 400 nm or less, the transport efficiency of carriers generated by light absorption is not further decreased.

<<Hole Transport Layer>>

The photoelectric conversion element preferably includes a hole transport layer.

The hole transport layer is a layer that transports holes and includes a basic compound. The hole transport layer preferably includes a hole transport material and an alkali metal salt, and may further include other materials if necessary.

<<<Basic Compound>>>

The basic compound preferably has an acid dissociation constant (pKa) of 6 or more and 10 or less. Examples of the basic compound having the aforementioned range of the acid dissociation constant (pKa) include pyridine compounds and imidazole compounds. Among them, pyridine compounds are preferable.

The pyridine compound is a compound represented by at least one selected from the following Formula (10) and the following Formula (11).

Formula (10)

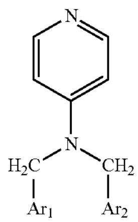

Formula (11)

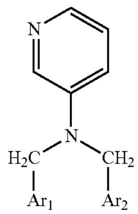

In Formula (10) and Formula (11), $Ar_1$ and $Ar_2$ represent an aryl group that may have a substituent, and the $Ar_1$ and the $Ar_2$, which may be identical to or different from each other, may be bound to each other.

Specific examples of the aryl group include phenyl groups, naphthyl groups, and biphenyl groups. Examples of the substituent include alkyl groups and alkoxy groups.

Hereinafter, specific exemplified compounds (H-1) to (H-8) of the pyridine compounds represented by Formula (10) are presented, but the pyridine compounds in the present disclosure are not limited thereto.

(H-1)

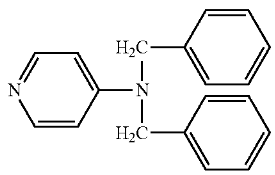

(H-2)

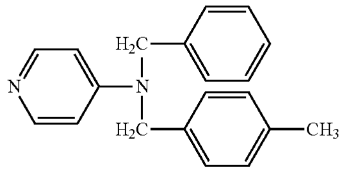

(H-3)

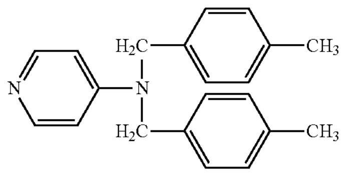

-continued (H-4)

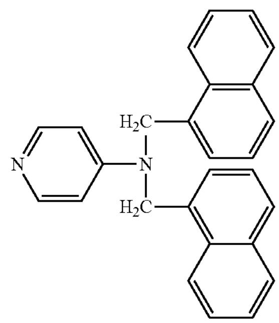

(H-5)

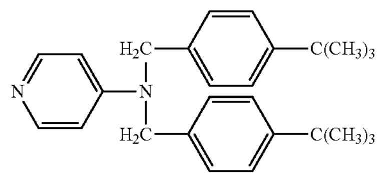

(H-6)

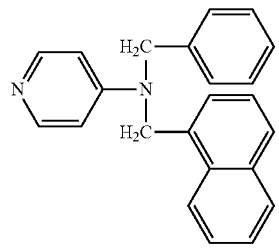

(H-7)

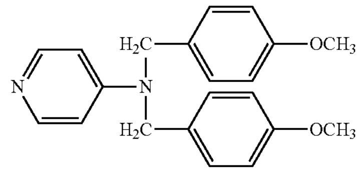

(H-8)

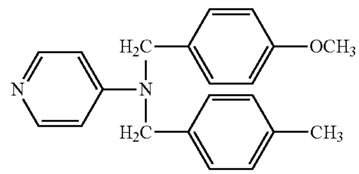

The amount of the above pyridine compound in the hole transport layer is preferably 20 mol % or more and 65 mol % or less, and more preferably 35 mol % or more and 50 mol % or less, relative to the hole transport material. When the amount of the pyridine compound satisfies the preferable range, high open circuit voltage can be maintained, high output can be obtained, and high stability and durability can be obtained even after long-term use under various conditions (particularly, low temperature environment).

<<<Hole Transport Material>>>

In order to obtain the function of transporting holes, the hole transport layer preferably includes, for example, a hole transport material or a p-type semiconductor material as a hole transport material.

As the hole transport material or the p-type semiconductor material, a conventional organic hole transport compound can be used.

Specific examples of the organic hole transport compound include oxadiazole compounds, triphenylmethane compounds, pyrazoline compounds, hydrazone compounds, oxadiazole compounds, tetraarylbenzidine compounds, stilbene compounds, and spiro-type compounds. Among them, spiro-type compounds are more preferable.

The spiro-type compound is preferably a compound including the following Formula (12).

Formula (12)

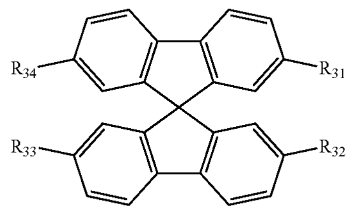

Note that, in Formula (12), $R_{31}$ to $R_{34}$ each independently represent a substituted amino group such as a dimethylamino group, a diphenylamino group, or a naphthyl-4-tolylamino group.

Specific examples of the spiro-type compound include the following (D-1) to (D-20), but are not limited thereto.

(D-1)

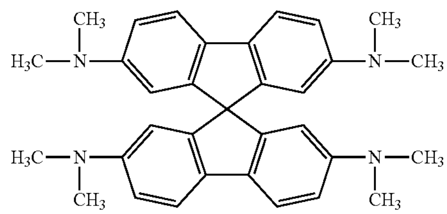

(D-2)

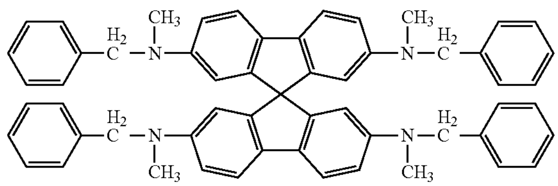

(D-3)

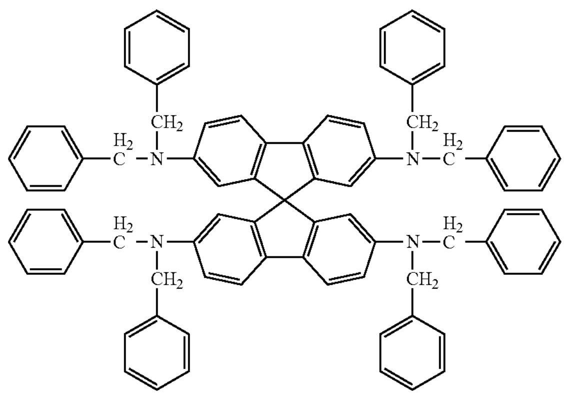

-continued (D-4)

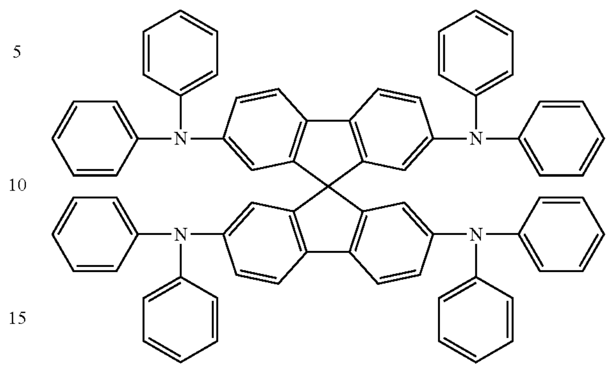

(D-5)

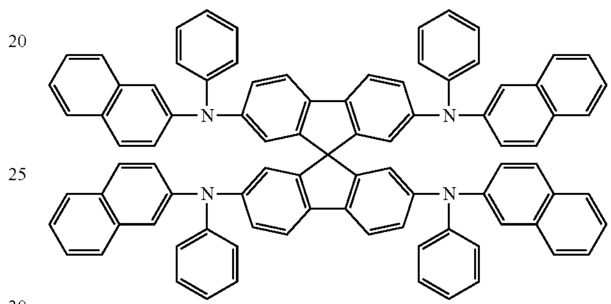

(D-6)

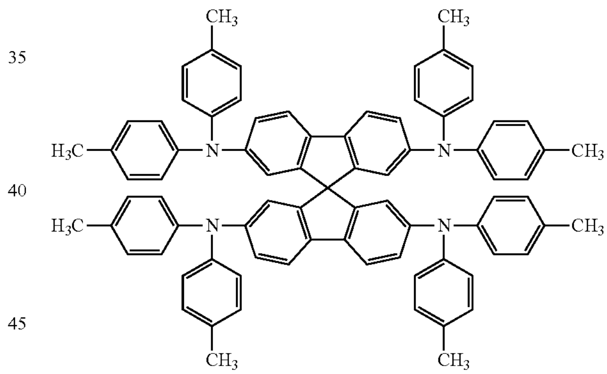

(D-7)

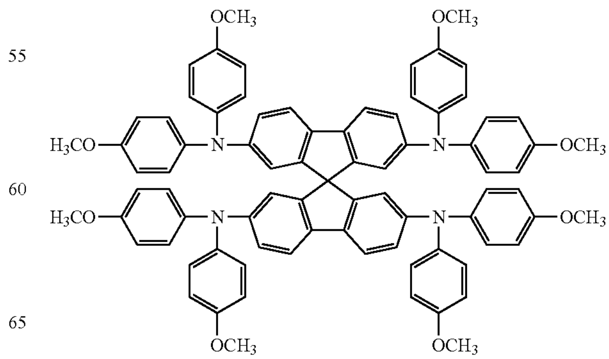

-continued
(D-8)
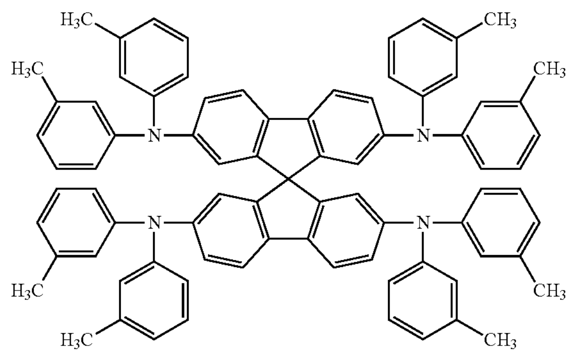
(D-9)
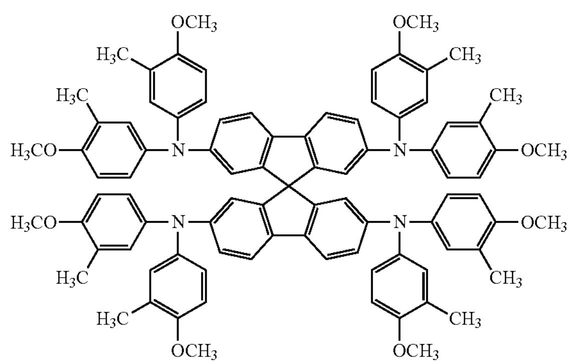
(D-10)
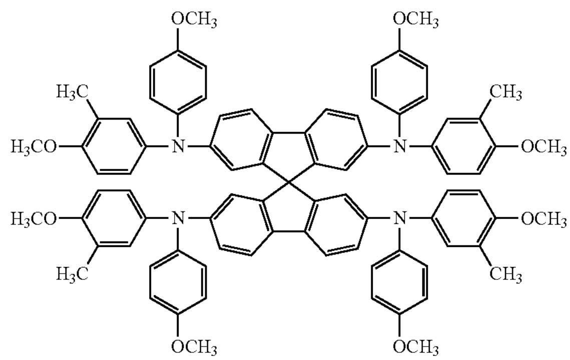
(D-11)
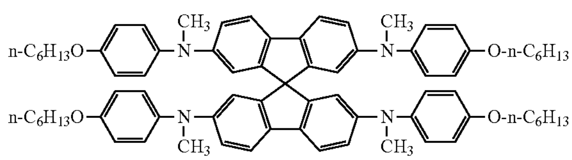
-continued
(D-12)
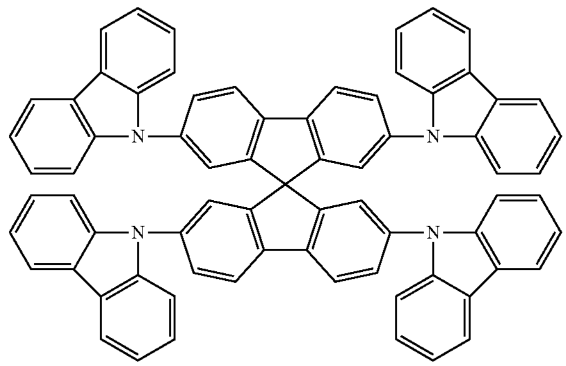
(D-13)
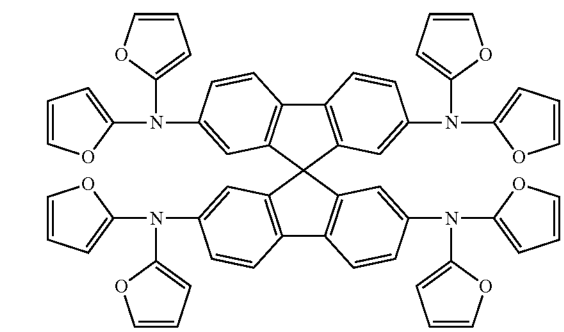
(D-14)
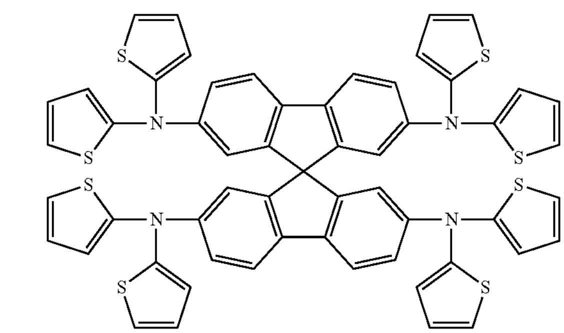
(D-15)
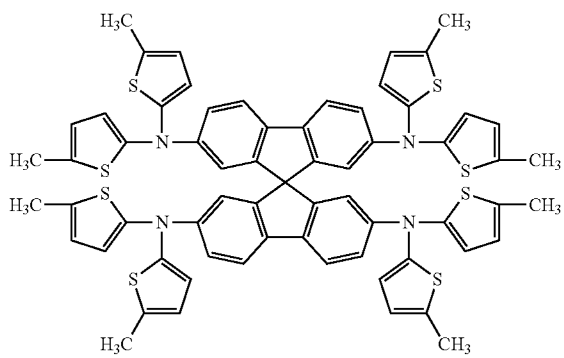

-continued (D-16)

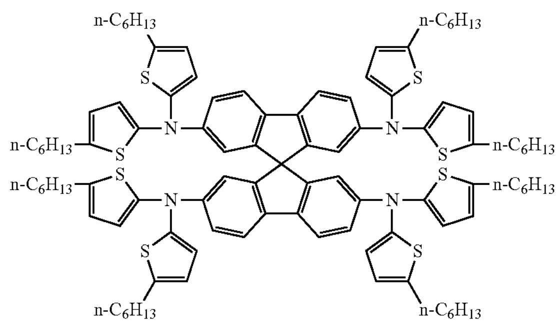

(D-17)

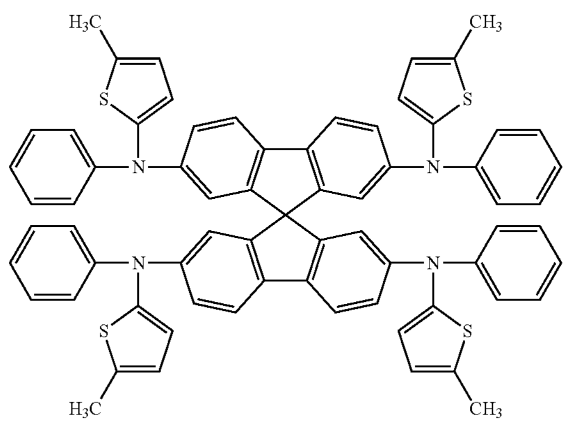

(D-18)

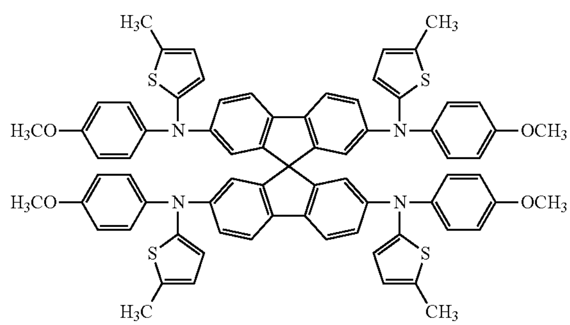

(D-19)

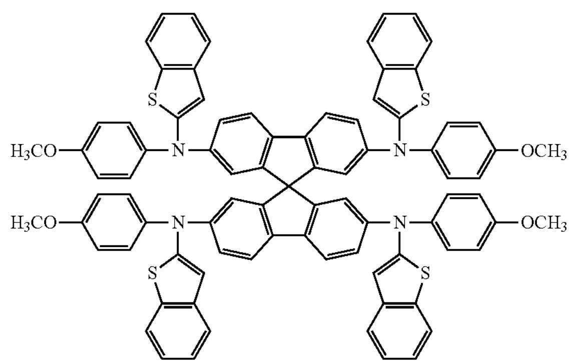

-continued (D-20)

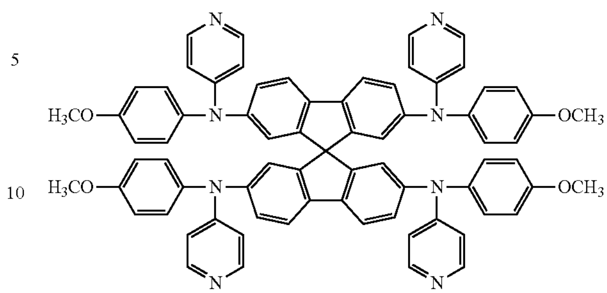

As the spiro-type compound as the hole transport material, a compound represented by the following Formula (13) is particularly suitably used.

Formula (13)

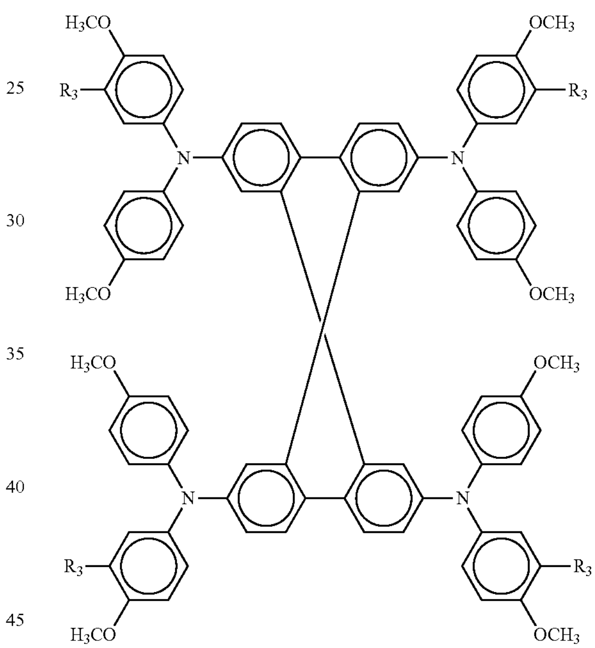

In Formula (13), $R_3$ represents a hydrogen atom or an alkyl group.

For example, among the above (D-1) to (D-20), those represented by the above Formula (13) are (D-7) and (D-10).

These spiro-type compounds have a high hole mobility. In addition, the spiro-type compounds exhibit excellent a photoelectric conversion characteristic because two benzidine skeleton molecules are bound with being twisted to thereby form almost spherical electron cloud, and intermolecular hopping conductivity is good. Moreover, the spiro-type compounds are dissolved in various organic solvents because of high solubility, and are easily densely filled in the porous electron transport layer because of its amorphous property (amorphous substance having no crystal structure). The spiro-type compounds allow the photosensitization compound to efficiently absorb light because they have no light absorption characteristics of 450 nm or more. Therefore, such spiro-type compounds are particularly preferable for solid-type dye sensitized solar cells.

<<<Alkali Metal Salt>>>

Examples of the alkali metal salt include lithium salts, sodium salts, and potassium salts.

Examples of the lithium salt include lithium chloride, lithium bromide, lithium iodide, lithium perchlorate, lithium bis(trifluoromethanesulfonyl)diimide, lithium diisopropylamide, lithium acetate, lithium tetrafluoroborate, lithium pentafluorophosphate, and lithium tetracyanoborate.

Examples of the sodium salt include sodium chloride, sodium bromide, sodium iodide, sodium perchlorate, sodium bis(trifluoromethanesulfonyl)diimide, sodium acetate, sodium tetrafluoroborate, sodium pentafluorophosphate, and sodium tetracyanoborate.

Examples of the potassium salt include potassium chloride, potassium bromide, potassium iodide, and potassium perchlorate.

Among them, lithium salt is preferable, and lithium bis(trifluoromethanesulfonyl)diimide and lithium diisopropylamide are more preferable because electric conductivity can be improved and the durability and the stability of output characteristics can be improved.

The lithium salt is preferably a compound represented by the following Formula (14).

Formula (14)

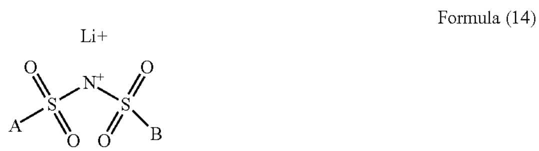

In Formula (14), A and B represent any one of substituents F, $CF_3$, $C_2F_5$, $C_3F_7$, and $C_4F_9$. The substituent A and the substituent B are preferably different from each other.

Examples of the lithium salt include lithium (fluorosulfonyl)(trifluoromethanesulfonyl)imide (Li-FTFSI), lithium (fluorosulfonyl)(pentafluoroethanesulfonyl)imide (Li—FPFSI), lithium (fluorosulfonyl)(nonafluorobutanesulfonyl) imide (Li—FNFSI), lithium (nonafluorobutanesulfonyl) (trifluoromethanesulfonyl)imide (Li-NFTFSI), and lithium (pentafluoroethanesulfonyl)(trifluoromethanesulfonyl)imide (Li-PFTFSI). Among them, lithium (fluorosulfonyl) (trifluoromethylsulfonyl)imide (Li-FTFSI) is preferable.

The Structural Formulas of the specific examples of the lithium salts are, for example, as follows.

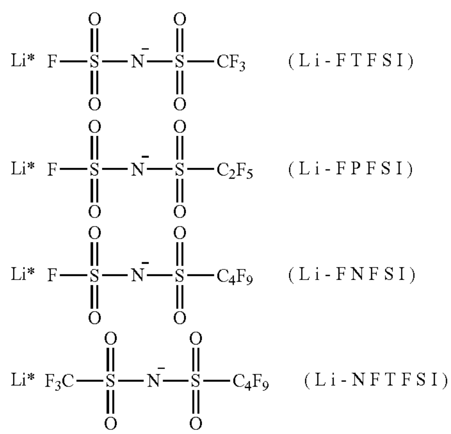

(Li-FTFSI)

(Li-FPFSI)

(Li-FNFSI)

(Li-NFTFSI)

-continued

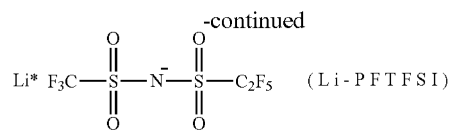

(Li-PFTFSI)

Here, when a coating liquid for forming the hole transport layer that includes the lithium salt is coated, the above lithium salt does not need to be contained in the formed film in a salt state where a cation and an anion are bound to each other, and may be included in the state where a cation and an anion are separated. Specifically, the present inventors found that when the hole transport layer is formed with the lithium salt being included in the coating liquid for the hole transport layer, lithium cations migrate to the electron transport layer, and therefore the electron transport layer includes more lithium cations than the hole transport layer. On the other hand, the present inventors found that anions partially migrate to the electron transport layer, but the hole transport layer includes more anions than the electron transport layer.

Preferably, in the present disclosure, cations and anions of the lithium salt are separated, and each have a different distribution state. When they are included in the photoelectric conversion layer, high output can be obtained with light having a low illuminance under low temperature environments and the effect such as excellent persistence of the output can be further improved.

The hole transport layer in the photoelectric conversion layer may include a lithium salt having another structure in addition to the lithium salt represented by the above Formula (14). Examples of the lithium salts include, in addition to the aforementioned lithium salts, lithium salts having symmetric anion species. Specific examples thereof include: lithium bis(fluorosulfonyl)imide (Li—FSI), lithium bis(trifluoromethanesulfonyl)imide (Li-TFSI), lithium bis(pentafluoroethanesulfonyl)imide (Li-BETI), and lithium bis(nonafluorobutanesulfonyl)imide; and cyclic imides such as lithium (cyclohexafluoropropane)(disulfone)imide.

These lithium salts, however, have a low solubility because anions are symmetric. Therefore, its addition amount is not easily increased, and is preferably a small amount even when the lithium salt is added.

An amount of the lithium salt represented by the above Formula (14) is preferably 5 mol % or more and 50 mol % or less, and more preferably 20 mol % or more and 35 mol % or less, relative to the hole transport material. When the amount of the lithium salt represented by the above Formula (14) falls within the aforementioned range, a high output with respect to light having a low illuminance can be achieved, the maintenance rate of the output can be improved, and high durability can be achieved.

In particular, a molar ratio (a/b) of the pyridine compound to the lithium salt in the photoelectric conversion layer is preferably less than 2.0, more preferably 1.8 or less, and still more preferably 1.7 or less, where the a is a molar amount of the pyridine compound in the photoelectric conversion layer and the b is an amount of the lithium salt in the photoelectric conversion layer.

The molar ratio (a/b) of the pyridine compound to the lithium salt falling less than 2.0 is advantageous because high output can be maintained for longer period of time when light having a low illuminance is emitted under low temperature environments and the durability of the photoelectric conversion element can be further improved.

In addition to the hole transport material or the lithium salt, an oxidizing agent is preferably added to the hole transport layer. Addition of the oxidizing agent improves the hole transport property and can enhance output characteristics or its durability or stability.

<<<Oxidizing Agent>>>

Examples of the oxidizing agent include tris(4-bromophenyl) aminium hexachloroantimonate, silver hexafluoroantimonate, nitrosonium tetrafluoroborate, nitric acid silver, metal complexes, and hypervalent iodine compounds. Among them, metal complexes and hypervalent iodine compounds are suitably used.

When the oxidizing agent is a metal complex or a hypervalent iodine compound, a large amount of the oxidizing agent can be added to the hole transport layer because of its high solubility in an organic solvent. As a result, the hole transport property is improved and the persistence of the hole transport property is excellent.

The metal complex includes a metal cation, a ligand, and an anion.

Examples of the metal cation include cations such as chromium, manganese, iron, cobalt, nickel, copper, molybdenum, ruthenium, rhodium, palladium, silver, tungsten, rhenium, osmium, iridium, gold, and platinum. Among them, a cation such as cobalt, iron, nickel, or copper is preferable, and a cobalt complex is more preferable.

The ligand preferably includes a 5-membered and/or 6-membered heterocycle including at least one nitrogen, which may have a substituent. Specific examples thereof include the following (E-1) to (E-33) but are not limited thereto.

(E-1)

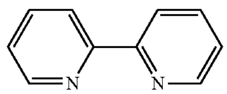

(E-2)

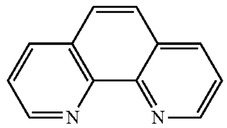

(E-3)

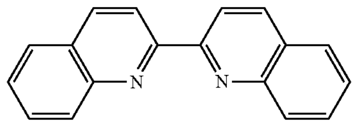

(E-4)

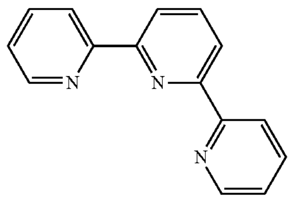

(E-5)

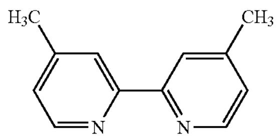

(E-6)

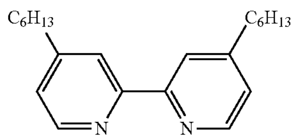

-continued (E-7)

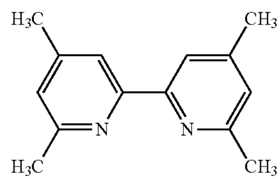

(E-8)

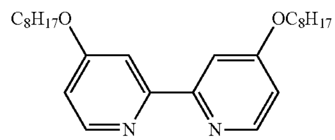

(E-9)

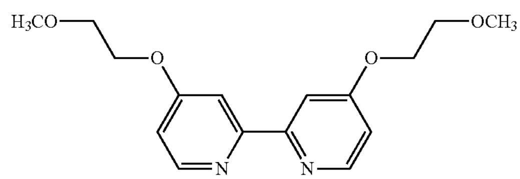

(E-10)

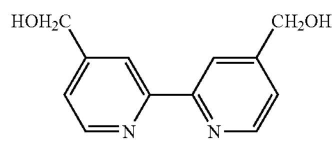

(E-11)

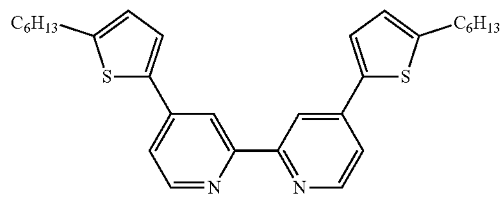

(E-12)

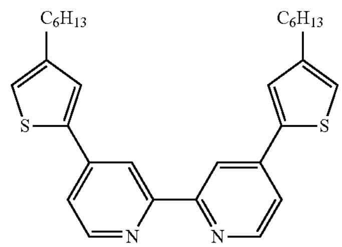

(E-13)

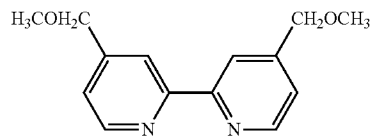

(E-14)

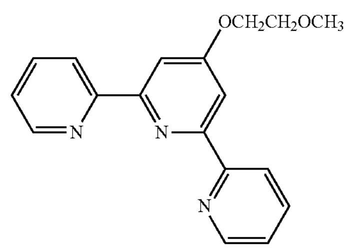

-continued
(E-15)
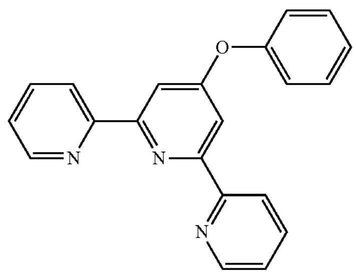
(E-16)
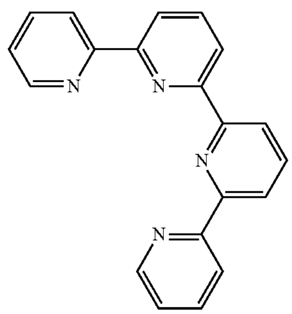
(E-17)
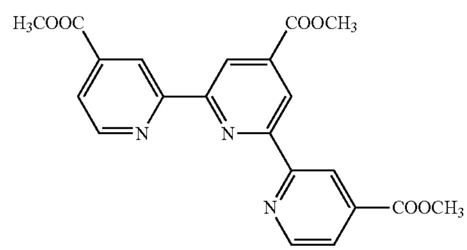
(E-18)
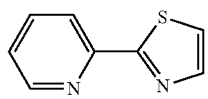
(E-19)
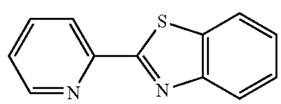
(E-20)
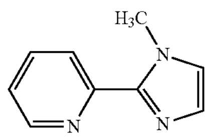
(E-21)
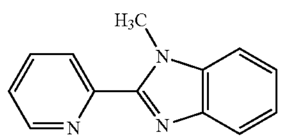
(E-22)
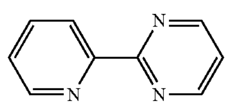
(E-23)
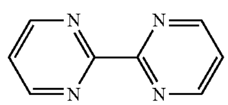
-continued
(E-24)
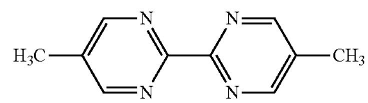
(E-25)
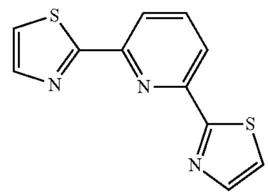
(E-26)
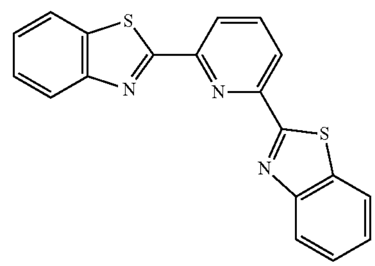
(E-27)
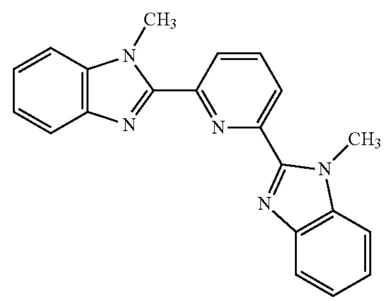
(E-28)
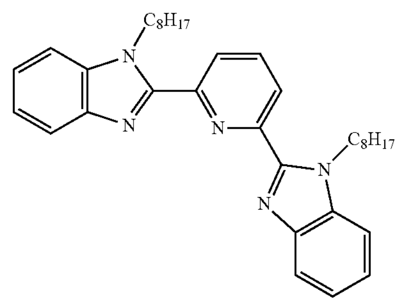
(E-29)
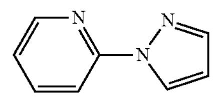
(E-30)
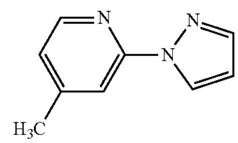
(E-31)
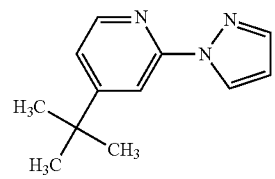

-continued (E-32)

(E-33)

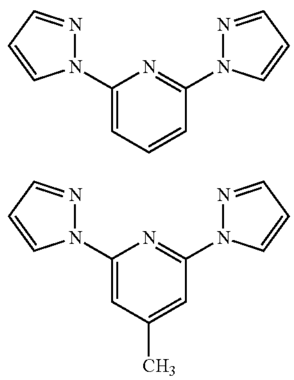

Examples of the suitable anion include hydride ions ($H^-$), fluoride ions ($F^-$), chloride ions ($Cl^-$), bromide ions ($Br^-$), iodide ions ($I^-$), hydroxide ions ($OH^-$), cyanide ions ($CN^-$), nitric acid ions ($NO_3^-$), nitrous acid ions ($NO_2^-$), hypochlorous acid ions ($ClO^-$), chlorous acid ions ($ClO_2^-$), chloric acid ions ($ClO_3^-$), perchloric acid ions ($ClO_4^-$), permanganic acid ions ($MnO_4^-$), acetic acid ions ($CH_3COO^-$), hydrogen carbonate ions ($HCO_3^-$), dihydrogen phosphate ions ($H_2PO_4^-$), hydrogen sulfate ions ($HSO^-$), hydrogen sulfide ions ($HS^-$), thiocyanic acid ions ($SCN^-$), tetrafluoroboric acid ions ($BF_4^-$), hexafluorophosphate ions ($PF_6^-$), tetracyanoborate ions ($B(CN)_4^-$), dicyanoamine ions ($N(CN)_2^-$), p-toluenesulfonic acid ions ($TsO^-$), trifluoromethyl sulfonate ions ($CF_3SO_2^-$), bis(trifluoromethylsulfonyl)amine ions ($N(SO_2CF_3)^{2-}$), tetrahydroxoaluminate ions ($[Al(OH)_4]^-$ or $[Al(OH)_4(H_2O)_2]^-$), dicyanoargentate (I) ions ($[Ag(CN)_2]^-$), tetrahydroxochromate(III) ions ($[Cr(OH)_4]^-$), tetrachloroaurate(III) ions ($[AuCl_4]^-$), oxide ions ($O^{2-}$), sulfide ions ($S^{2-}$), peroxide ions ($O_2^{2-}$), sulfuric acid ions ($SO_4^{2-}$), sulfurous acid ions ($SO_3^{2-}$), thiosulfuric acid ($S_2O_3^{2-}$), carbonic acid ions ($CO_3^{2-}$), chromic acid ions ($CrO_4^{2-}$), dichromic acid ions ($Cr_2O_7^{2-}$), monohydrogen phosphate ions ($HPO_4^{2-}$), tetrahydroxyzincate (II) ions ($[Zn(OH)_4]^{2-}$), tetracyanozincate(II) ions ($[Zn(CN)_4]^{2-}$), tetrachlorocuprate(II) ions ($[CuCl_4]^{2-}$), phosphoric acid ions ($PO_4^{3-}$), hexacyanoferrate(III) ions ($[Fe(CN)_6]^{3-}$), bis(thiosulfate)argentite(I) ions ($[Ag(S_2O_3)_2]^{3-}$), and hexacyanoferrate (II) ions ($[Fe(CN)_6]^{4-}$).

These may be used alone or in combination.

Among them, tetrafluoroboric acid ions, hexafluorophosphate ions, tetracyanoborate ions, bis(trifluoromethylsulfonyl)amine ions, and perchloric acid ions are preferable.

Among these metal complexes, a trivalent cobalt complex is preferably added. When the trivalent cobalt complex as the oxidizing agent is added, the hole transport material can be oxidized and stabilized, resulting in improvement of the hole transport property.

In the present disclosure, a trivalent cobalt complex is preferably used for, for example, the cobalt complex to be added to a coating liquid for forming the hole transport layer. However, the hole transport layer of the photoelectric conversion element obtained by using the coating liquid for forming the hole transport layer preferably includes a bivalent cobalt complex. The reason for this is because when the trivalent cobalt complex is mixed with the hole transport material, the hole transport material is oxidized, and therefore the trivalent cobalt complex turns into a bivalent cobalt complex. In other words, in the present disclosure, preferably, the photoelectric conversion layer further includes a bivalent cobalt complex.

In particular, more preferably, in the hole transport layer of the photoelectric conversion element, almost no trivalent cobalt complexes remain and almost all cobalt complexes are bivalent. This improves and stabilizes the hole transport property, improves high output and its persistence, and can further achieve the effect even under low temperature environment.

The valence of the cobalt complex included in the hole transport layer can be determined through, for example, XAFS analysis. The XAFS analysis is an abbreviation of X-ray Absorption Fine Structure and is referred to as X-ray absorption fine structure analysis. For example, the XAFS spectrum can be obtained when a sample is irradiated with X-rays and its absorption dose is measured.

In the XAFS spectrum, an absorption near edge structure is referred to as XANES (X-ray Absorption Near Edge Structure), and an extended X-ray absorption fine structure is referred to as EXAFS (Extended X-ray Absorption Fine Structure) that appears on the energy side about 100 eV higher than the absorption edge. Information about the valence and the structure of a targeted atom can be mainly obtained using the XANES of the former. In this case, for example, the XAFS spectra of bivalent cobalt complex powder and trivalent cobalt complex powder are separately measured, and are compared with the XAFS spectrum of the cobalt complex included in the hole transport layer. Then, the valence of the cobalt complex included in the hole transport layer can be determined.

As the trivalent cobalt complex added to the coating liquid for forming the hole transport layer, cobalt complexes expressed by the following Structural Formulas (15) and (16) can be preferably used.

Structural Formula (15)

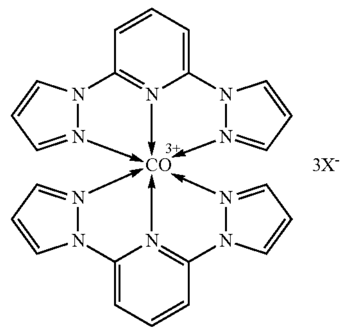

Structural Formula (16)

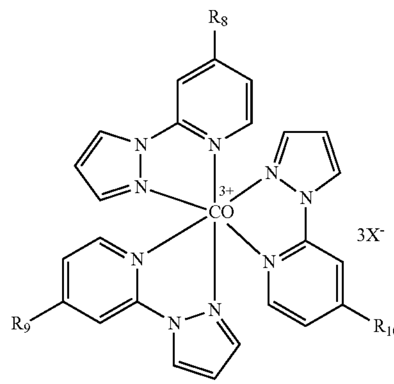

In the Structural Formula (16), $R_8$ to $R_{10}$ represent a hydrogen atom, a methyl group, an ethyl group, a tertiary butyl group, or a trifluoromethyl group. In the Structural Formula (16), X represents any one of the following Structural Formulas (17) to (20).

Structural Formula (17)

$BF_4$

Structural Formula (18)

$PF_6$

Structural Formula (19)

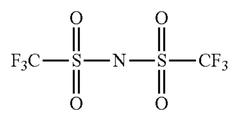

Structural Formula (20)

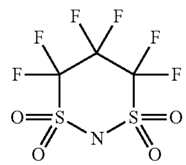

In the Structural Formula (16), the X is preferably the Structural Formula (19) among the Structural Formulas (17) to (20). Use of the Structural Formula (19) is effective because the hole transport material can be safely maintained in an oxidation state.

Specific examples of these cobalt complexes include the following (F-1) to (F-24), but are not limited thereto.

(F-1)

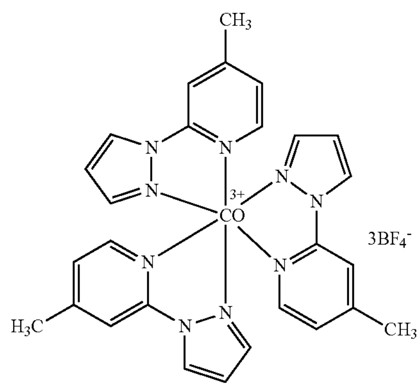

(F-2)

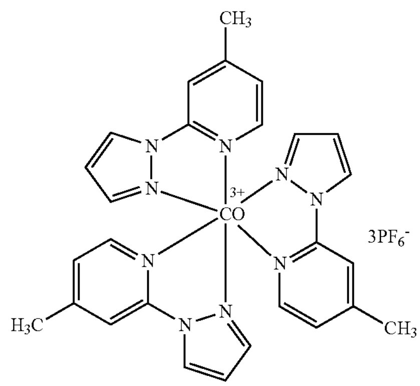

-continued (F-3)

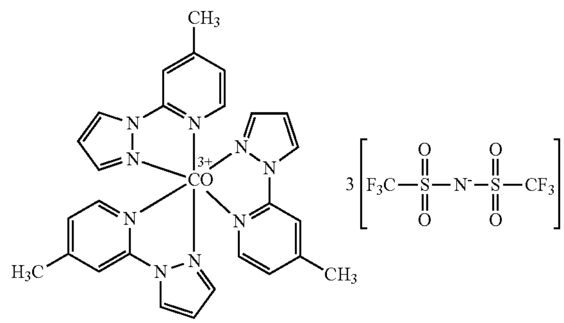

(F-4)

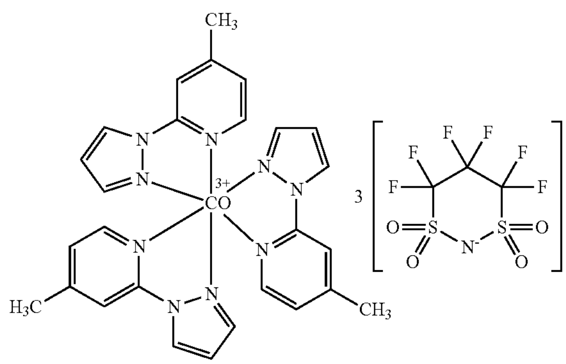

(F-5)

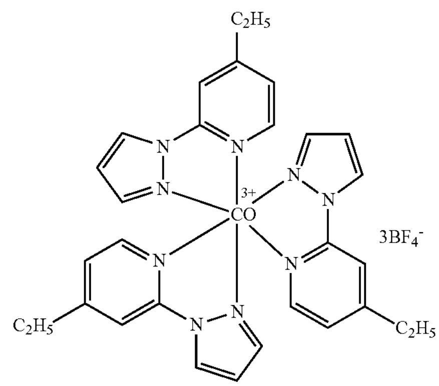

(F-6)

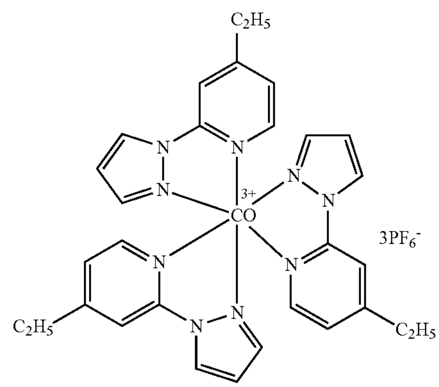

-continued
(F-7)
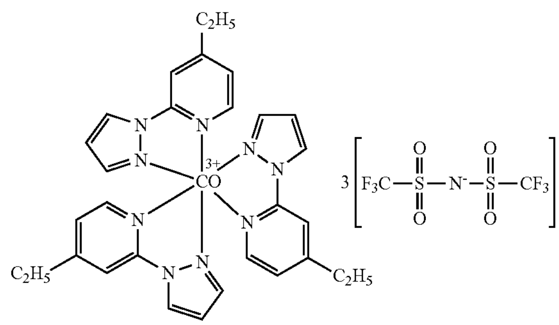
(F-8)
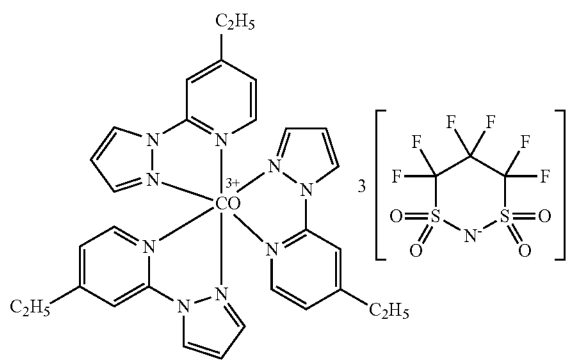
(F-9)
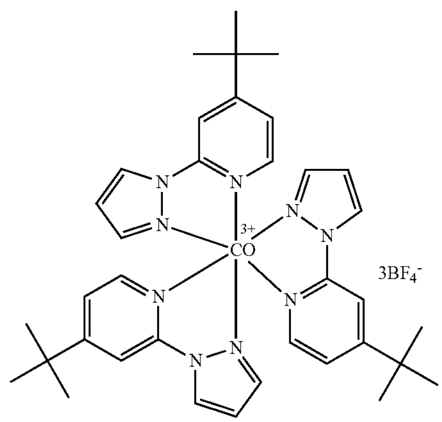
(F-10)
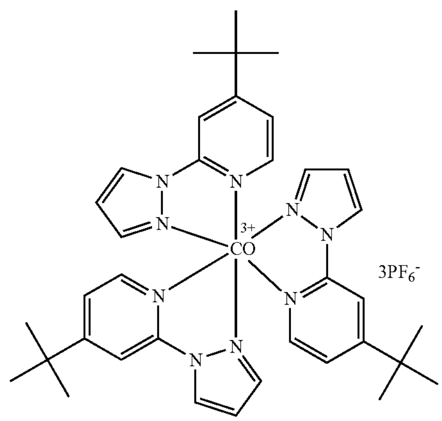
-continued
(F-11)
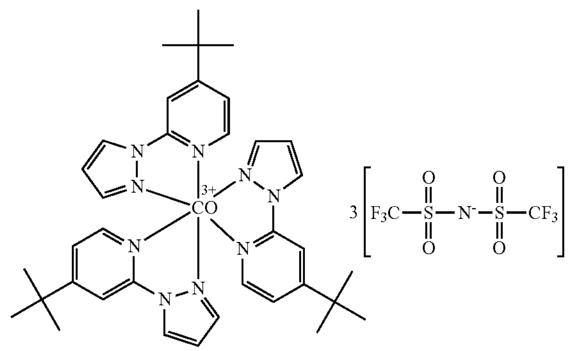
(F-12)
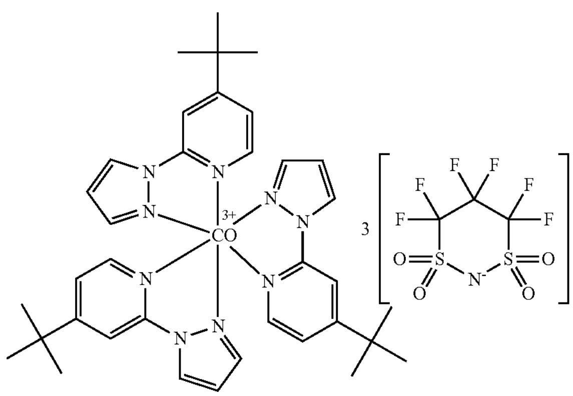
(F-13)
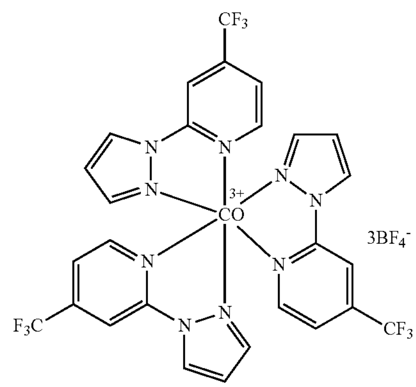
(F-14)
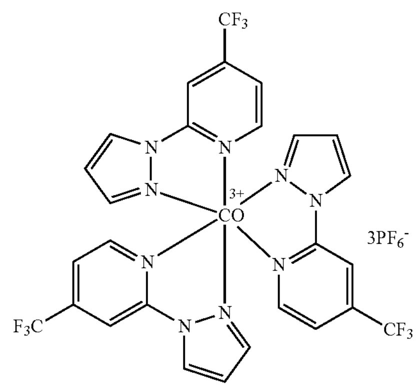

-continued
(F-15)
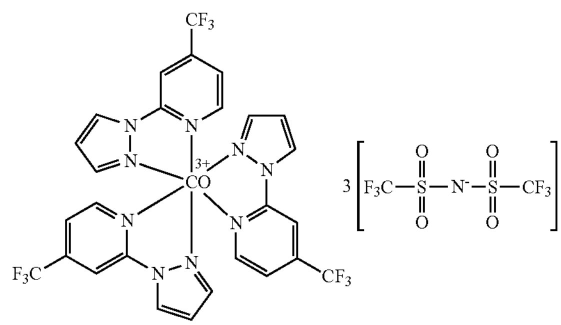
(F-16)
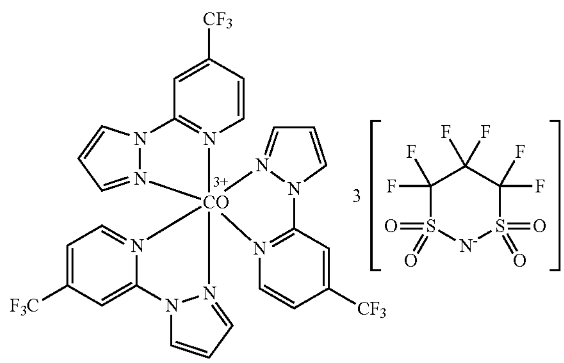
(F-17)
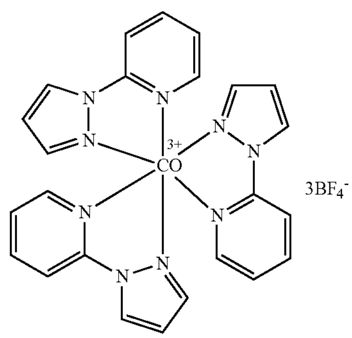
(F-18)
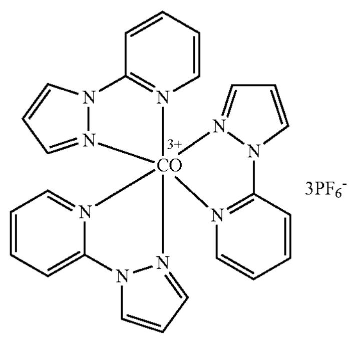
-continued
(F-19)
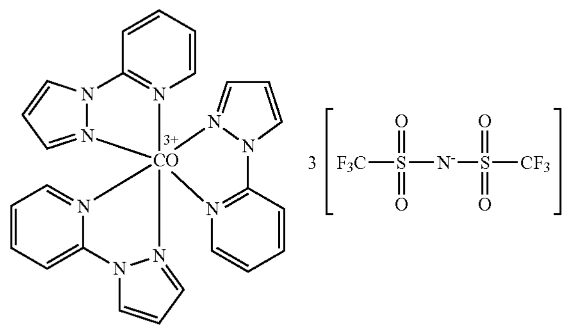
(F-20)
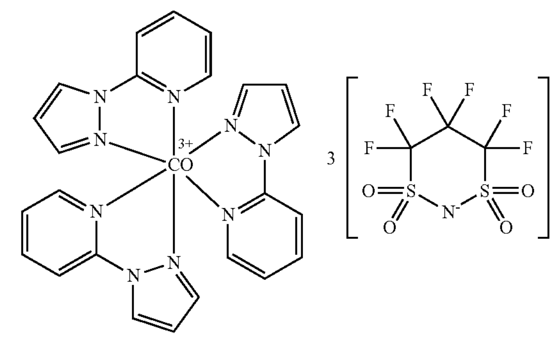
(F-21)
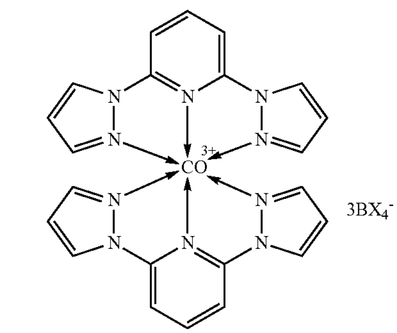
(F-22)
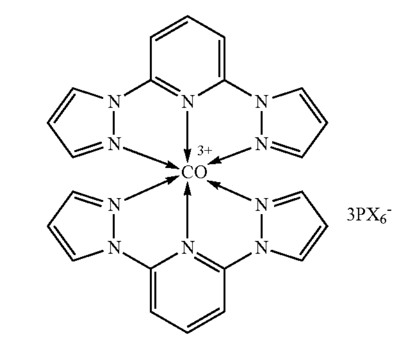

-continued (F-23)

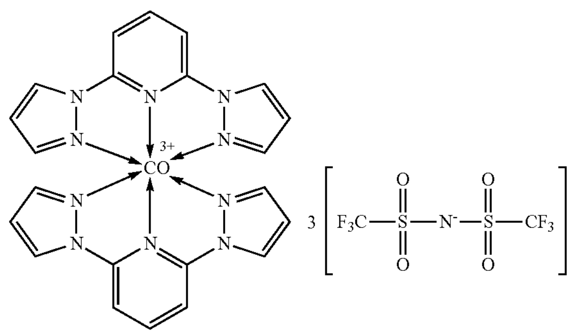

(F-24)

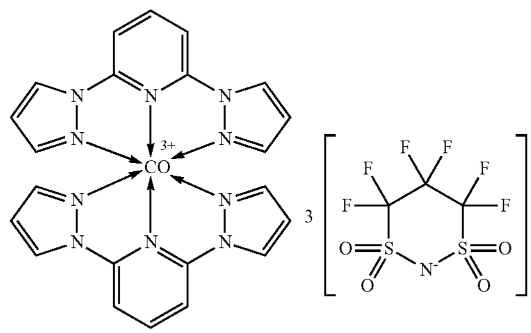

An amount of the oxidizing agent is preferably 1 mol % or more and 30 mol % or less, and more preferably 5 mol % or more and 20 mol % or less relative to the hole transport material.

The oxidizing agent may be used alone or in combination. When two or more kinds of oxidizing agents are used in combination, the hole transport layer is not easily crystalized, which may achieve high heat resistance in some cases.

The hole transport layer may have a single layer structure formed of a single material or may have a stacked layer structure including a plurality of compounds.

When the hole transport layer has a stacked layer structure, it is preferable to use a polymer material in the hole transport layer near the second electrode.

Use of the polymer material excellent in a film formation property in the hole transport layer is advantageous because it is possible to make the surface of the porous electron transport layer smoother and to improve the photoelectric conversion characteristics.

In addition, the polymer material does not easily permeate into the inside of the porous electron transport layer. Therefore, the polymer material has an excellent property of covering the surface of the porous electron transport layer, and may achieve an effect of minimizing short circuit when electrodes are provided.

<<<Polymer Material>>>

Examples of the polymer material used in the hole transport layer include conventional hole transport polymer materials.

Examples of the hole transport polymer material include polythiophene compounds, polyphenylene vinylene compounds, polyfluorene compounds, polyphenylene compounds, polyarylamine compounds, and polythiadiazole compounds.

Examples of the polythiophene compound include poly(3-n-hexylthiophene), poly(3-n-octyloxythiophene), poly(9,9'-dioctyl-fluorene-co-bithiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene).

Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylene-vinylene)].

Examples of the polyfluorene compound include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyarylamine compound include poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole).

Among the hole transport polymer materials, polythiophene compounds and polyarylamine compounds are preferable in terms of carrier mobility and ionization potential.

The average thickness of the hole transport layer is not particularly limited and may be appropriately selected in accordance with the intended purpose. The hole transport layer preferably has such a structure that the hole transport layer enters pores of the porous electron transport layer. The hole transport layer having an average thickness of 0.01 μm or more and 20 μm or less is more preferably disposed on the electron transport layer, the hole transport layer having an average thickness of 0.1 μm or more and 10 μm or less is still more preferably disposed on the electron transport layer, and the hole transport layer having an average thickness of 0.2 μm or more and 2 m or less is particularly preferably disposed on the electron transport layer.

The hole transport layer can be directly formed on the electron transport layer to which the photosensitization compound is adsorbed.

The method of producing the hole transport layer is not particularly limited and may be appropriately selected in accordance with the intended purpose. Examples of the method include a method of forming a thin film under vacuum such as vacuum deposition and a wet film formation method. Among them, particularly, the wet film formation method is preferable, and a method of performing coating on the electron transport layer is preferable, in terms of, for example, production cost.

When the wet film formation method is used, the coating method is not particularly limited and can be performed according to the conventional methods. Examples thereof include the dip method, the spray method, the wire bar method, the spin-coating method, the slit die coating method, the roller coating method, the blade coating method, and the gravure coating method. Examples of the wet printing method include various methods such as relief printing, offset printing, gravure printing, intaglio printing, rubber plate printing, and screen printing.

The film may be formed in a supercritical fluid or subcritical fluid having a lower temperature and pressure than a critical point.

The supercritical fluid is not particularly limited and may be appropriately selected in accordance with the intended purpose, as long as it is a fluid, which exists as a non-condensable high-dense fluid in a temperature and pressure region exceeding the limit (critical point) at which a gas and a liquid can coexist, does not condense even when being compressed, and is a fluid in a state of being equal to or higher than the critical temperature and the critical pressure. However, the supercritical fluid preferably has a lower critical temperature.

Examples of the supercritical fluid include carbon monoxide, carbon dioxide, ammonia, nitrogen, water, alcohol solvents, hydrocarbon solvents, halogen solvents, and ether solvents.

Examples of the alcohol solvent include methanol, ethanol, and n-butanol.

Examples of the hydrocarbon solvent include ethane, propane, 2,3-dimethylbutane, benzene, and toluene.

Examples of the halogen solvent include methylene chloride and chlorotrifluoromethane.

Examples of the ether solvent include dimethyl ether.

These may be used alone or in combination.

Among them, carbon dioxide, which has a critical pressure of 7.3 MPa and a critical temperature of 31° C., is preferable because carbon dioxide easily generates a supercritical state, and it is incombustible and is easily handled.

The subcritical fluid is not particularly limited and may be appropriately selected in accordance with the intended purpose, as long as it is present as a high-pressure liquid in a temperature and pressure region near the critical point.

The compounds as exemplified as the supercritical fluid can be suitably used as the subcritical fluid.

The critical temperature and the critical pressure of the supercritical fluid are not particularly limited and may be appropriately selected in accordance with the intended purpose.

The critical temperature is preferably −273° C. or more and 300° C. or less, and more preferably 0° C. or more and 200° C. or less.

In addition to the supercritical fluid and the subcritical fluid, an organic solvent or an entrainer may be used in combination.

Solubility in the supercritical fluid can be easily adjusted by addition of the organic solvent and the entrainer.

The organic solvent is not particularly limited and may be appropriately selected in accordance with the intended purpose. Examples of the organic solvent include ketone solvents, ester solvents, ether solvents, amide solvents, halogenated hydrocarbon solvents, and hydrocarbon solvents.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

After the hole transport material is stacked on the electron transport layer to which the photosensitization compound is adsorbed, a press processing step may be performed.

The press processing allows the hole transport material to closely adhere to the electron transport layer that is a porous electrode, which may improve efficiency in some cases.

The press processing method is not particularly limited and may be appropriately selected in accordance with the intended purpose. Examples of the method include: the press molding method using a plate, which is represented by the infrared spectroscopy (IR) tablet molding device; and the roll press method using, for example, a roller.

The pressure is preferably 10 kgf/$cm^2$ or more, and more preferably 30 kgf/$cm^2$ or more.

The duration of the press processing is not particularly limited and may be appropriately selected in accordance with the intended purpose. The duration thereof is preferably 1 hour or less. Moreover, heat may be applied at the time of the press processing. At the time of the press processing, a release agent may be disposed between a pressing machine and the electrode.

Examples of the release agent include fluororesins, such as polyethylene tetrafluoride, polychloro ethylene trifluoride, ethylene tetrafluoride-propylene hexafluoride copolymers, perfluoroalkoxy fluoride resins, polyvinylidene fluoride, ethylene-ethylene tetrafluoride copolymers, ethylene-chloroethylene trifluoride copolymers, and polyvinyl fluoride. These may be used alone or in combination.

After the press processing but before disposition of the second electrode, a metal oxide may be disposed between the hole transport layer and the second electrode.

Examples of the metal oxide include molybdenum oxide, tungsten oxide, vanadium oxide, and nickel oxide. These may be used alone or in combination. Among them, molybdenum oxide is preferable.

A method of disposing the metal oxide on the hole transport layer is not particularly limited and may be appropriately selected in accordance with the intended purpose. Examples of the method include: a method in which a thin film is formed in vacuum, such as sputtering and vacuum vapor deposition; and a wet film forming method.

Preferable examples of the wet film forming method include a method in which paste obtained by dispersing powder or sol of the metal oxide is prepared, followed by coating the paste on the hole transport layer.

A coating method used in the wet film forming method is not particularly limited and may be performed according to conventional methods. For example, various methods such as the dip method, the spray method, the wire bar method, the spin coating method, the roller coating method, the blade coating method, and the gravure coating method, or the wet printing method, such as relief printing, offset printing, gravure printing, intaglio printing, rubber plate printing, or screen printing may be used.

The average thickness of the coated metal oxide is preferably 0.1 nm or more and 50 nm or less, and more preferably 1 nm or more and 10 nm or less.

<Second Electrode>

The photoelectric conversion element of the present disclosure includes a second electrode.

The second electrode may be formed on the hole transport layer or on the metal oxide on the hole transport layer.

The second electrode in the photoelectric conversion element of the present disclosure includes a conductive nanowire and a conductive polymer, and further includes other materials if necessary.

A visible light transmittance of the second electrode is preferably 50, or more and 90, or less, and more preferably 605 or more and 80% or less.

When the visible light transmittance is 50% or more and 90, or less, the electric resistance can be decreased and the durability can be improved. In addition, when the visible light transmittance is 60% or more and 80% or less, the photodurability can be further improved.

The visible light transmittance of the second electrode can be determined by measuring, for example, the second electrode provided on the second substrate by a measurement method of visible light transmittance $t_v$ using an ultraviolet and visible spectrophotometer (apparatus name: ISR-3100, manufactured by SHIMADZU CORPORATION) according to JIS A5759.

<<Conductive Nanowire>>

The conductive nanowire is a wire structure that has a cross-sectional diameter of less than 1 μm and has an average aspect ratio (long axis length/diameter) of 10 or more.

An average diameter of the conductive nanowire is preferably 5 nm or more and 250 nm or less, and more preferably 10 nm or more and 150 nm or less. When the average diameter of the conductive nanowire is 5 nm or more and 250 nm or less, transparency of the second electrode can be improved.

An average long axis length of the conductive nanowire is preferably 0.5 μm or more and 500 μm or less, and more preferably 2.5 μm or more and 100 m or less. When the average long axis length of the conductive nanowire is 0.5 μm or more and 500 μm or less, dispersibility of the conductive nanowire is excellent, and the conductivity or transparency is excellent when such a conductive nanowire is used as a transparent conductive film.

Examples of materials of the conductive nanowire include metal-coated organic fibers and inorganic fibers, conductive metal oxide fibers, metal nanowires, carbon fibers, and carbon nanotubes. Among them, metal nanowires are preferable because the conductivity is satisfied.

A metal composition of the metal nanowire is not particularly limited and may be appropriately selected in accordance with the intended purpose. The metal nanowire can include, for example, one kind of metal or two or more kinds of metals of noble metal elements or base metal elements. The metal nanowire preferably includes at least one kind of metal selected from the group consisting of noble metals (e.g., gold, platinum, silver, palladium, rhodium, iridium, ruthenium, and osmium), iron, cobalt, copper, and tin, and is more preferably a silver nanowire that includes silver, in terms of conductivity.

A structure of the conductive nanowire is not particularly limited and may be appropriately selected in accordance with the intended purpose.

A method of producing the conductive nanowire is not particularly limited and those obtained by conventional production methods can be used.

For example, when the conductive nanowire is a silver nanowire, it is possible to use such a production method that includes allowing a silver compound to react in polyol at 25° C. to 180° C. using an N-substituted acrylamide-including polymer as a wire growth controlling agent.

A method of producing the second electrode formed of the conductive nanowire is, for example, a method in which a conductive nanowire dispersion liquid is applied on the hole transport layer.

The conductive nanowire dispersion liquid includes a conductive nanowire, a dispersion medium, and other components.

Examples of the dispersion medium include water and alcohols. Examples of the alcohols include methanol, ethanol, 1-propanol, 2-propanol, 1-butanol, 2-butanol, 2-methylpropanol, 1,1-dimethylethanol, and cyclohexanol. These may be used alone or in combination.

Examples of the other components include surfactants, polymerizable compounds, antioxidants, anti-sulfurizing agents, corrosion inhibitors, viscosity modifiers, and preservatives.

A method of applying the conductive nanowire dispersion liquid on the hole transport layer is not particularly limited and may be appropriately selected in accordance with the intended purpose. Examples thereof include the spin coating method, the slit coating method, the dip coating method, the blade coating method, the bar coating method, the spray method, the relief printing method, the intaglio printing method, the screen printing method, the lithography method, the dispensing method, and the inkjet method.

<<Conductive Polymer>>

The conductive polymer is not particularly limited and may be appropriately selected in accordance with the intended purpose. Examples thereof include polythiophene or derivatives thereof, polyaniline or derivatives thereof, polypyrrole or derivatives thereof, polyacetylene or derivatives thereof, polycarbazole or derivatives thereof, polyvinylpyridine or derivatives thereof, poly(n-vinylcarbazole) or derivatives thereof, polyfluorene or derivatives thereof, polyphenylene or derivatives thereof, poly(p-phenylenevinylene) or derivatives thereof, poly(pyridinevinylene) or derivatives thereof, polyquinoxaline or derivatives thereof, polyquinoline or derivatives thereof, polyoxadiazole derivatives, polybathophenanthroline derivatives, polytriazole derivatives, or compounds obtained by appropriately substituting these polymers with a substituent such as an amine group, a hydroxy group, a nitrile group, or a carbonyl group. These may be used alone or in combination. Among them, polythiophene or derivatives thereof, polyaniline or derivatives thereof, and polypyrrole or derivatives thereof are preferable because of a high conductivity.

When the conductive polymer includes polythiophene, polyaniline, polypyrrole, or a derivative thereof, adhesiveness between the second electrode and the hole transport layer can be improved. Particularly, when flexibility is imparted to the photoelectric conversion element, peeling of the second electrode from the hole transport layer can be minimized.

A structure of the second electrode is not particularly limited and may be appropriately selected in accordance with the intended purpose. The structure may be a single layer structure or may be such a structure that a plurality of materials is stacked.

An average thickness of the second electrode is not particularly limited and may be appropriately selected in accordance with the intended purpose as long as transmission of desired visible light can be achieved. The average thickness of the second electrode is preferably 10 nm or more and 200 nm or less, and more preferably 20 nm or more and 70 nm or less.

The average thickness of the second electrode can be measured using, for example, a stylus-type film thickness measuring apparatus (apparatus name: Dektak XT-E, manufactured by Bruker).

<Electrode Protection Layer (Passivation Layer)>

The photoelectric conversion element of the present disclosure preferably includes the electrode protection layer (may be referred to as a passivation layer).

The electrode protection layer is a layer disposed between a sealing part that will be described later and the second electrode.

The electrode protection layer is a layer that minimizes peeling of the second electrode that is caused by the sealing part.

The electrode protection layer is not particularly limited as long as it is disposed on a surface side of the second electrode where the sealing part is to be disposed. The electrode protection layer may be disposed so that the second electrode does not completely contact with the sealing part. The electrode protection layer may be disposed so that the second electrode partially contacts with the sealing part as long as the effect of the present disclosure can be achieved.

Examples of materials of the electrode protection layer include oxides and fluorine compounds.

Examples of the oxide include aluminum oxide.

Examples of the fluorine compound include silicon nitride and silicon oxide. Among them, as the fluorine compound, silicon oxide that is a fluorine compound having a silane structure is preferable.

An average thickness of the electrode protection layer is preferably 10 nm or more, and more preferably 50 nm or more.

<Sealing Part>

The sealing part includes a drying agent.

The drying agent is a material having a function of removing moisture.

When the photoelectric conversion element includes an electrode formed of a metal nanowire and a conductive polymer like the second electrode of the present disclosure, moisture, which is associated with vaporization heat derived from an electrode coating liquid for forming electrodes, remains inside the electrodes. In particular, moisture contained in the second electrode may cause deterioration of the electrode in some cases. Therefore, inclusion of the drying agent in the sealing part in the present disclosure can remove the moisture.

Examples of the drying agent include water-absorbing materials and water-absorbing resins.

Examples of the water-absorbing material include materials having a moisture reactivity and materials having a moisture-adsorbing property.

Specific examples of the drying agent having the moisture reactivity include calcium oxide, barium oxide, magnesium oxide, magnesium sulfate, sodium sulfate, and calcium chloride.

Specific examples of the drying agent having the moisture-adsorbing property include silica gel, molecular sieve, zeolite, and activated carbon.

Among them, the drying agent having the moisture reactivity is preferable because moisture is not released again after heating. In addition, calcium oxide or zeolite that absorbs a large amount of moisture is preferable. These may be used alone or in combination.

A moisture-trapping property of the drying agent measured is preferably 20 mg/100 $mm^2$ or more, and more preferably 70 mg/100 $mm^2$ or more. The "moisture-trapping property" in the present specification refers to a moisture-trapping property at a surface where the sealing part contacts with the second electrode.

A method of measuring the moisture-trapping property of the drying material is not particularly. For example, the moisture-trapping property can be measured by a change in weight between the weight obtained before a sample is left to stand for a certain period of time and the weight obtained after the sample is left to stand for a certain period of time under high temperature and high humidity environment of, for example, 85° C., 85% RH.

An amount of the drying agent is not particularly limited and can be appropriately set so that a moisture-trapping property at a surface where the sealing part contacts with the second electrode satisfies the above preferable numerical range.

The sealing part is provided so as to cover the photoelectric conversion layer and the second electrode, and is a layer that shields the photoelectric conversion layer and the second electrode from the external environment. The sealing part can shield at least the photoelectric conversion layer and the second electrode from the external environment of the photoelectric conversion element.

Here, "shield the photoelectric conversion layer and the second electrode from the external environment" means that at least the photoelectric conversion layer and the second electrode are placed under an environment different from the external environment of the photoelectric conversion element.

Examples of a method of shielding the photoelectric conversion layer and the second electrode from the external environment include a method of "frame sealing" and a method of "surface sealing".

The "frame sealing" is a sealing method in which a sealing member is provided at side surfaces of the photoelectric conversion layer and the second electrode of the photoelectric conversion element.

The "surface sealing" means a sealing method in which the sealing part contacts with a side surface of the photoelectric conversion layer and an upper surface of the second electrode.

The second substrate preferably contacts with the upper surface of the sealing part.

The upper surface refers to a surface side at which the second substrate is provided with respect to the first substrate in a layered direction of the photoelectric conversion element. The lower surface refers to a surface opposite to the upper surface in the layered direction. The side surface refers to a surface excluding the upper surface and the lower surface.

Among them, in terms of improvement of the durability, the "surface sealing" is preferable. It is considered that the "surface sealing" can increase an area where the sealing part contacts with the second electrode, to efficiently remove moisture contained in the second electrode, compared to the "frame sealing". It is also considered that the "surface sealing" can minimize entry of excessive water or oxygen from the outside compared to the "frame sealing". Note that, when the sealing part is provided through "surface sealing", the sealing part may be referred to as "adhesive layer".

The sealing part has a 180° peel strength of 5 N/1 cm or more when the 180° peel strength is measured under the following conditions.

When the peel strength of the sealing part falls within the above range, durability after storage under high temperature and high humidity environment and after continuous irradiation of light can be improved. It is assumed that the reason for this is as follows. Specifically, when the peel strength of the sealing part falls within the above range, the shielding property from the external environment can be enhanced because the sealing part has a strong adhesive force. Moreover, it is assumed that curing an UV curable resin or a thermosetting resin can cause contraction, forming a gap between the sealing part and the substrate or the like.

<Condition>

The 180° peel strength means the peel strength obtained by measuring glass that is pasted with a film attached to a sealing part by the measuring method according to the JIS standard K6854-2.

A material of the sealing part is not particularly limited and may be appropriately selected in accordance with the intended purpose as long as the material can decrease entry of excessive water or oxygen from the external environment and is a material corresponding to the above sealing part.

The sealing part has an effect of minimizing mechanical destruction caused through external pressing, and conventional materials can be used as long as this effect can be achieved.

Examples of the material of the sealing part include polymerized resins, low-melting-point glass resins, and pressure-sensitive adhesives. Among them, pressure-sensitive adhesives are preferable. The pressure-sensitive adhesive can minimize peeling or deformation of the second electrode and the photoelectric conversion layer because volumetric shrinkage through curing does not occur. The pressure-sensitive adhesive does not generate outgas generated at the time of curing in a polymerizable composition. Therefore, the pressure-sensitive adhesive can minimize deterioration of the photoelectric conversion layer and can stably maintain high electric power generation.

—Polymerized Resin—

The polymerized resin is a polymer of monomers or oligomers having a functional group that polymerizes upon light or heat in a molecule. The polymerized resin is not particularly limited and may be appropriately selected in accordance with the intended purpose as long as it is a resin that can function as the sealing part. Examples thereof include acrylic resins and epoxy resins.

Examples of the epoxy resin include bisphenol A-based epoxy resins, bisphenol F-based epoxy resins, novolac-based epoxy resins, alicyclic epoxy resins, long-chain aliphatic epoxy resins, glycidyl amine-based epoxy resins, glycidyl ether-based epoxy resins, and glycidyl ester-based epoxy resins. These may be used alone or in combination.

A curing agent or various additives are preferably mixed with the epoxy resin if necessary.

The curing agents are classified into, for example, amine-based curing agents, acid anhydride-based curing agents, polyamide-based curing agents, and other curing agents, and are appropriately selected in accordance with the intended purpose.

Examples of the amine-based curing agent include: aliphatic polyamines such as diethylenetriamine and triethylenetetramine; and aromatic polyamines such as metaphenylenediamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of the other curing agents include imidazoles and polymercaptan. These may be used alone or in combination.

Examples of the additive include fillers, gap agents, coupling agents, flexibilizers, colorants, flame retardant auxiliaries, antioxidants, and organic solvents. Among them, fillers and gap agents are preferable, and fillers are more preferable.

The filler is effective in minimizing entry of moisture or oxygen, and is very effective in achieving effects such as reduction in volumetric shrinkage at the time of curing, reduction in an amount of outgas at the time of curing or heating, improvement of mechanical strength, and control of thermal conductivity or fluidity and in maintaining stable output under various environments. Particularly, regarding output properties or durability of a photoelectric conversion element, not only influence of passing of moisture or oxygen, but also influence of outgas generated at the time of curing or heating the sealing member cannot be ignored. Particularly, the influence of outgas generated at the time of heating greatly affects output properties stored under a high temperature environment.

In this case, inclusion of the filler, the gap agent, or the drying agent in the sealing part can minimize entry of moisture or oxygen, and can decrease an amount of the sealing part to be used, which can achieve an effect of decreasing outgas. This is effective not only at the time of curing but also at the time when the photoelectric conversion element is stored under a high temperature environment.

The filler is not particularly limited and may be appropriately selected in accordance with the intended purpose. Preferable examples of the filler include inorganic fillers such as crystalline or amorphous silica, talc, alumina, aluminum nitride, silicon nitride, calcium silicate, and calcium carbonate. These may be used alone or in combination.

The average primary particle diameter of the filler is preferably 0.1 μm or more and 10 μm or less, and more preferably 1 μm or more and 5 μm or less.

The amount of the filler is preferably 10 parts by mass or more and 90 parts by mass or less, and more preferably 20 parts by mass or more and 70 parts by mass or less, relative to 100 parts by mass of the whole sealing member.

When the amount of the filler falls within the above range, an effect of minimizing entry of moisture or oxygen can be sufficiently obtained, the viscosity becomes appropriate, adhesiveness to a substrate and a defoaming property are improved, and workability are effective.

The coupling agent enhances cohesion between molecules. Examples of the coupling agent include silane coupling agents. Specific examples thereof include: silane coupling agents such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)3-aminopropylmethyldimethoxysilane, N-(2-aminoethyl)3-aminopropylmethyltriethoxysilane, 3-aminopropyltriethoxysilane, 3-mercaptopropyltrimethoxysilane, vinyltrimethoxysilane, N-(2-(vinylbenzylamino)

ethyl)3-aminopropyltrimethoxysilane hydrochloride, and 3-methacryloxypropyltrimethoxysilane. These may be used alone or in combination.

As the sealing part, epoxy resin compositions that are commercially available as sealing members, seal materials, or adhesives have been known, and such commercially available products can be effectively used in the present disclosure. Among them, there are also epoxy resin compositions that are developed and are commercially available to be used in solar cells or organic EL elements, and such commercially available products can be particularly effectively used in the present disclosure.

Examples of the commercially available products of the epoxy resin compositions include: TB3118, TB3114, TB3124, and TB3125F (manufactured by ThreeBond); World Rock 5910, World Rock 5920, and World Rock 8723 (manufactured by Kyoritsu Chemical Co., Ltd.); and WB90US (P) (manufactured by MORESCO Corporation).

—Low-Melting-Point Glass Resin—

The low-melting-point glass resin is not particularly limited and may be appropriately selected in accordance with the intended purpose.

Examples of the low-melting-point glass resin include combinations including, for example, $SiO_2$, $B_2O_3$, PbO, $Bi_2O_3$, ZnO, $TeO_2$, $V_2O_5$, SnO, $P_2O_5$, $TiO_2$, $Al_2O_3$, $Li_2O$, $Na_2O$, $K_2O$, MgO, CaO, and SrO as a main component. Other components may be included in accordance with the intended purpose.

Depending on combination of components, glass frit absorbs infrared rays to generate heat, and melts. Therefore, the glass frit can be subjected to sealing by irradiation of laser such as infrared rays. An average particle diameter of the glass frit is not particularly limited and may be appropriately selected in accordance with the intended purpose. The average particle diameter is preferably 10 nm or more and 20 μm or less.

The glass transition temperature and the softening temperature are preferably 1,000° C. or less, more preferably 600° C. or less, and still more preferably 500° C. or less. The low melting point described herein refers to a temperature equal to or lower than 600° C.

After the low-melting-point glass resin is coated, the resin component is decomposed at about 550° C. in a firing step. Then, the low-melting-point glass resin component is allowed to closely adhere to a glass substrate while being melted with, for example, infrared laser. At this time, the low-melting-point glass resin component is diffused inside the metal oxide layer and is physically joined, resulting in achievement of a high sealing performance. In addition, elimination of the resin component is effective because outgases such as acrylic resins or epoxy resins do not form, and therefore a photoelectric conversion element is not deteriorated.

—Pressure-Sensitive Adhesive—

The pressure-sensitive adhesive is not particularly limited and may be appropriately selected in accordance with the intended purpose as long as it is an adhesive exhibiting three actions of tackiness, cohesive force, and adhesive force and is a material that exhibits a curing reaction at the time of adhesion.

Examples of the pressure-sensitive adhesive include olefin-based resins, rubber-based resins, silicon-based resins, and acrylic resins.

As the sealing part, a sheet-type sealing material can be used.

The sheet-type sealing material is, for example, a material obtained by forming a sealing part such as an epoxy resin or a pressure-sensitive adhesive on a sheet in advance, and the sheet used is, for example, glass or a film having a high gas barrier property. The sheet-type sealing material corresponds to a second substrate in the present disclosure.

The sheet-type sealing material is pasted on a second electrode, and pressure is applied thereon while the sheet-type sealing material is warmed, which can form a sealing part and a second substrate at one time.

Depending on the formation pattern of the sealing part formed on the sheet, the photoelectric conversion element can have such a structure that a gap part is provided, and such a structure is effective.

When the sealing part formed on the sheet is formed on the whole surface, such a configuration can be "surface sealing". Depending on the formation pattern of the sealing part, when the sealing part is formed through patterning so that a gap part is provided inside the photoelectric conversion element, such a configuration can be "frame sealing".

Examples of the second substrate (barrier film) of the sheet part of the sheet-type sealing material of include GL FILM (manufactured by Toppan Inc.), MS-F0025P (manufactured by LINTEC Corporation), MS-F0050P (manufactured by LINTEC Corporation), and MS-F2050P (manufactured by LINTEC Corporation).

Examples of materials of the sealing part of the sheet-type sealing material include 61533 (manufactured by Tesa, pressure-sensitive adhesive: including drying agent), 61563 (manufactured by Tesa, pressure-sensitive adhesive), 61562 (manufactured by Tesa, pressure-sensitive adhesive), FD21 (manufactured by Ajinomoto Fine-Techno Co., Inc., pressure-sensitive adhesive), MS-A3010P (manufactured by LINTEC Corporation, pressure-sensitive adhesive), and MS-A3010Q (manufactured by LINTEC Corporation, pressure-sensitive adhesive).

Use of the sheet-type sealing material can impart functions such as weight reduction (portability), reduction of scattering of glass at the time of breakage, and reduction of leakage of contents.

When a gap part is formed through sealing using the sealing part, inclusion of oxygen in the gap part can stably maintain a hole transport property of the hole transport layer for a long period of time, and may be effective in improving the durability of the photoelectric conversion element.

In the present disclosure, the gap part may preferably include oxygen in some cases. In this case, the oxygen concentration is more preferably 10.0% by volume or more and 21.0% by volume or less.

The oxygen concentration in the gap part can be controlled by performing the sealing (formation of the sealing part) in a glove box in which the oxygen concentration has been adjusted. The oxygen concentration can be adjusted by a method using a gas cylinder having a specific oxygen concentration or by a method using a nitrogen gas generator. The oxygen concentration in a glove box can be measured using a commercially available oxygen concentration meter or oxygen monitor.

The oxygen concentration in the gap part formed through sealing using the sealing part can be measured through, for example, internal vapor analysis (IVA). Specifically, in high vacuum, a photoelectric conversion element is loaded and drilled. The generated gases or moisture is subjected to mass spectrometry. This method can determine the oxygen concentration contained in the gap part of the photoelectric conversion element. Examples of the mass spectrometer include a quadrupole mass spectrometer and a time-of-flight mass spectrometer. The latter enables measurement with higher sensitivity.

A gas other than oxygen contained in the gap part is preferably an inert gas, and nitrogen or argon is preferable.

When the sealing is performed, the oxygen concentration and the dew point in a glove box are preferably controlled because the output or the durability can be effectively improved. The dew point is defined as a temperature at which condensation starts when water vapor-containing gas is cooled.

The dew point is not particularly limited, but is preferably 0° C. or less, and more preferably −20° C. or less. The lower limit thereof is preferably −50° C. or more.

A method of forming the sealing part is not particularly limited and can be performed according to conventional methods. Examples of the method include various methods such as the dispensing method, the wire bar method, the spin-coating method, the roller coating method, the blade coating method, the gravure coating method, the relief printing, the offset printing, the intaglio printing, the rubber plate printing, and the screen printing.

EMBODIMENTS

Hereinafter, one example of a photoelectric conversion element of the present disclosure will be described with reference to drawings. However, the present disclosure is not limited thereto, those that are not described in the embodiments of the present disclosure regarding the number, the position, and the shape of the following constituent components can be also included in the scope of the present disclosure.

FIG. 1 is a schematic view illustrating one example of a photoelectric conversion element of the present disclosure.

As presented in FIG. 1, in a photoelectric conversion element 101, a first electrode 2 is formed on a first substrate 1, and a hole blocking layer 3 is formed on the first electrode 2. An electron transport layer 4 is formed on the hole blocking layer 3, and a photosensitization compound 5 is adsorbed on a surface of an electron transport material constituting the electron transport layer 4. A hole transport layer 6 is formed on and in the electron transport layer 4, and a second electrode 7 is formed on the hole transport layer 6. A second substrate 9 is provided above the second electrode 7, and the second substrate 9 is fixed by a sealing part 8 between the second substrate 9 and the hole blocking layer 3. Formation of the hole blocking layer 3 can minimize recombining of electrons and holes, thereby improving the power generation performance.

The photoelectric conversion element presented in FIG. 1 may include a gap part 10 between the second electrode 7 and the second substrate 9. Inclusion of the gap part can control the oxygen concentration in the gap part, which results in improvement of the power generation performance and the durability. Moreover, because the second electrode 7 does not directly contact with the second substrate 9, peeling or breakage of the second electrode 7 may be minimized.

The oxygen concentration in the gap part is not particularly limited and may be appropriately selected in accordance with the intended purpose. The oxygen concentration in the gap part is preferably 1.0% by volume or more and 21.0% by volume or less, and more preferably 3.05% by volume or more and 15.0% by volume or less.

Note that, the first electrode 2 and the second electrode 7 can each have a path configured to allow electric current to pass to an electrode extraction terminal, which is not presented in the figure.

Figure 2:
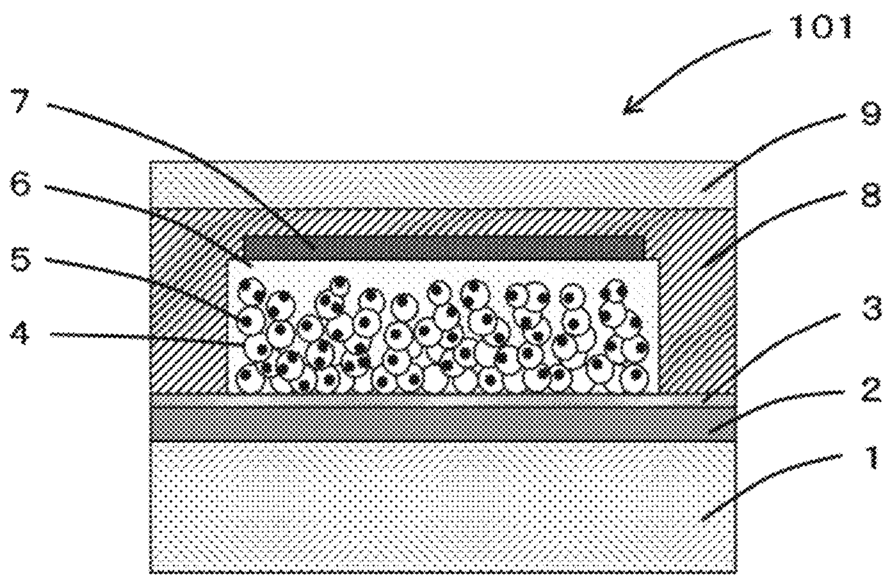
FIG. 2 is a drawing is a schematic view illustrating another example of a photoelectric conversion element of the present disclosure.
Figure 3:
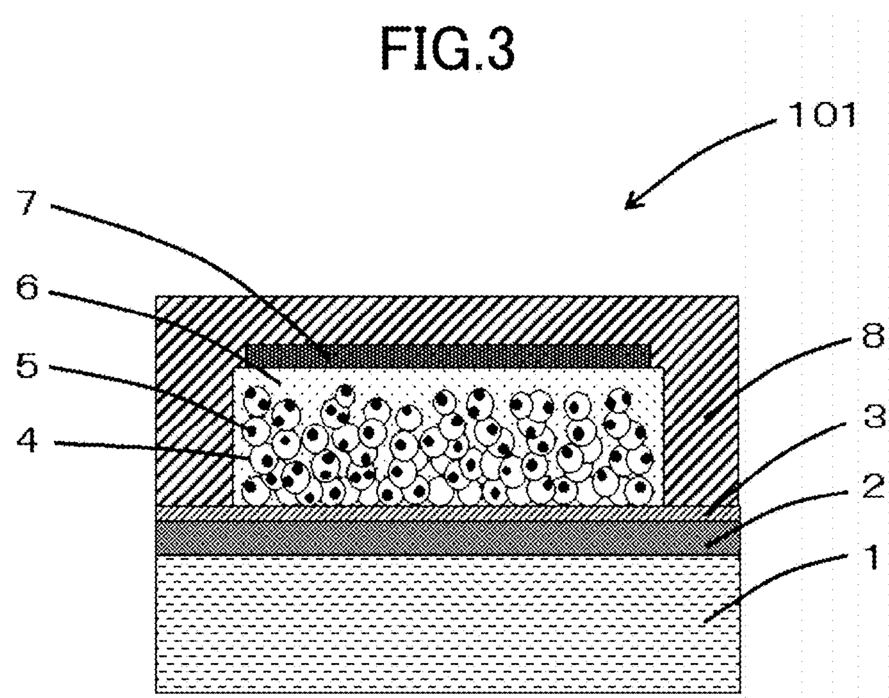
FIG. 3 is a schematic view illustrating another example of a photoelectric conversion element of the present disclosure.

FIG. 2 and FIG. 3 are each a schematic view presenting another example of the photoelectric conversion element of the present disclosure, and present a case where no gap part is provided and the photoelectric conversion layer (electron transport layer 4 and hole transport layer 6) of FIG. 1 is completely covered with a sealing part 8.

A method of producing the photoelectric conversion element including no gap part is not particularly limited and may be appropriately selected in accordance with the intended purpose. Examples thereof include: a method in which a sealing part 8 is coated on the whole surface of a second electrode 7 and a second substrate 9 is provided thereon; and a method using the aforementioned sheet-type sealing material. In this case, a passivation layer (not illustrated) can be provided between the second electrode 7 and the sealing part 8, and may be effective in minimizing peeling of the second electrode.

The gap part may be completely eliminated as presented in FIG. 2, or the gap part may partially remain as presented in FIG. 1. Complete covering of the photoelectric conversion layer with the sealing part 8 can minimize peeling or breakage of the second substrate 9 when stress caused by, for example, twisting or impacting is applied to the photoelectric conversion element, which can enhance the mechanical strength of the photoelectric conversion element. As a modified example of FIG. 2, the sealing part may be used as the second substrate as presented in FIG. 3.

Figure 4:
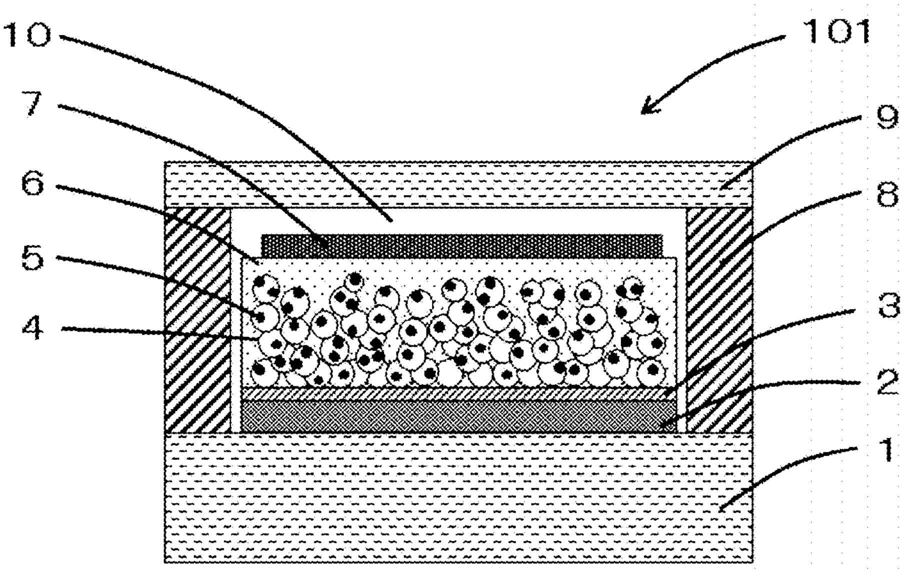
FIG. 4 is a schematic view illustrating another example of a photoelectric conversion element of the present disclosure.

FIG. 4 is a schematic view presenting another example of a photoelectric conversion element of the present disclosure and presents the case where a sealing part 8 is attached to a first substrate 1 and a second substrate 9. Such configuration increases adhesiveness between the substrate and the sealing part 8 and can obtain an effect of enhancing the mechanical strength of the photoelectric conversion element. When the adhesiveness is enhanced, such a sealing effect that minimizes entry of excessive moisture or oxygen can be further enhanced.

(Photoelectric Conversion Module)

A photoelectric conversion module of the present disclosure is a photoelectric conversion module including a first substrate, a first electrode, a photoelectric conversion layer, a second electrode, a sealing part, and a second substrate, and is translucent.

The second electrode includes a conductive nanowire and a conductive polymer.

The sealing part includes a drying agent and includes other layers if necessary. Each layer may have a single layer structure or may have a stacked layer structure.

A visible light transmittance of the photoelectric conversion module of the present disclosure is preferably 15% or more, more preferably 20% or more, and still more preferably 20% or more and 50, or less.

The photoelectric conversion element in the photoelectric conversion module of the present disclosure is the same as the photoelectric conversion element of the present disclosure.

The photoelectric conversion module of the present disclosure includes a plurality of the photoelectric conversion elements of the present disclosure that are disposed adjacent to each other, and preferably includes an arrangement region of photoelectric conversion elements that are electrically connected in series or in parallel.

Preferably, in the photoelectric conversion module of the present disclosure including at least two of the photoelectric conversion elements adjacent to each other, the first electrode in one of the photoelectric conversion elements is electrically connected to the second electrode in another of the photoelectric conversion elements through a conduction part penetrating the photoelectric conversion layer.

The photoelectric conversion module can have such a configuration that the photoelectric conversion module includes a pair of substrates, an arrangement region of photoelectric conversion elements connected in series or in parallel is provided between the pair of substrates, and the sealing part is sandwiched with the pair of substrates.

EMBODIMENTS

Hereinafter, one example of a photoelectric conversion module of the present disclosure will be described with reference to drawings. However, the present disclosure is not limited thereto, those that are not described in the embodiments of the present disclosure regarding the number, the position, and the shape of the following constituent components can be also included in the scope of the present disclosure.

Figures 5A, 5B:
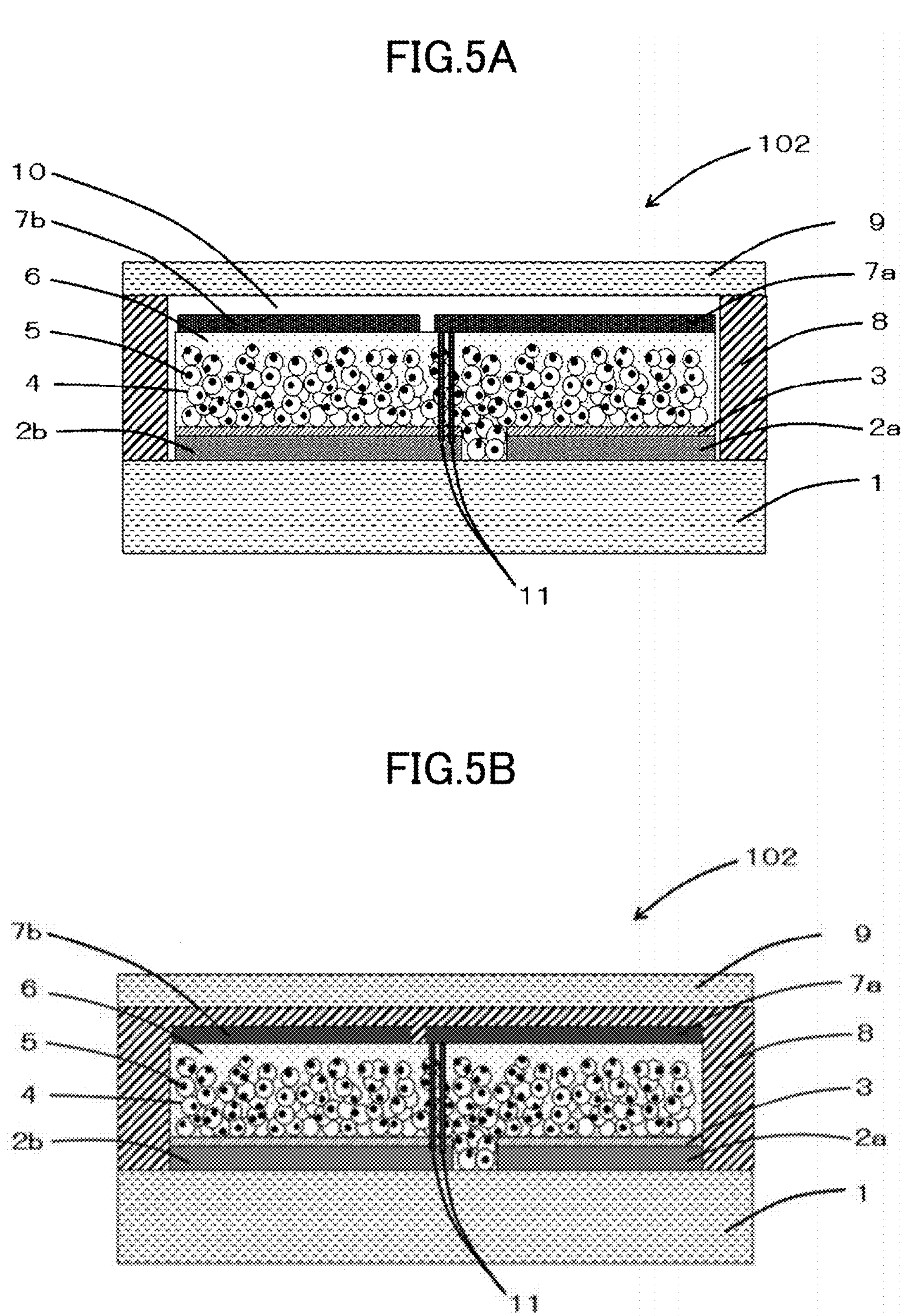
FIG. 5A is a schematic view illustrating one example of a photoelectric conversion module of the present disclosure.
FIG. 5B is a schematic view illustrating another example of a photoelectric conversion module of the present disclosure.

FIG. 5A is a schematic view of one example of a photoelectric conversion module of the present disclosure, and presents one example of a cross section of a part of the photoelectric conversion module that includes a plurality of photoelectric conversion elements that are connected in series.

As depicted in FIG. 5A, in a photoelectric conversion module 102, first electrodes 2*a* and 2*b* are formed on a first substrate 1, and a hole blocking layer 3 is formed on the first electrodes 2. An electron transport layer 4 is formed on the hole blocking layer 3, and a photosensitization compound 5 is adsorbed on the surface of an electron transport material constituting the electron transport layer 4. Above and inside the electron transport layer 4, a hole transport layer 6 is formed. After the hole transport layer 6 is formed, a penetration part 11 is formed. Then, second electrodes 7*a* and 7*b* are formed. Formation of the second electrode 7*a* after formation of the penetration part 11 introduces the material of the second electrode inside the penetration part 11, to thereby obtain a photoelectric conversion module in which electric current passes between the first electrode 2*b* and the second electrode 7*a* of adjacent cells. Above the second electrodes 7*a* and 7*b*, a second substrate 9 is provided, and the second substrate 9 and the first substrate 1 are fixed by a sealing part 8. Formation of the hole blocking layer 3 can minimize recombining of electrons and holes, which makes it possible to improve the power generation performance.

In the module 102 presented in FIG. 5A, a gap part 10 can be formed between the second electrodes 7*a* and 7*b*, and the second substrate 9. Because formation of the gap part 10 can control the oxygen concentration inside the gap part, the power generation performance and the durability can be improved. Because the second electrodes 7*a* and 7*b* do not directly contact with the second substrate 9, peeling or breakage of the second electrodes 7*a* and 7*b* can be minimized.

Note that, a first electrode 2*a* and a second electrode 7*b* each have an electrode of a further adjacent cell or a path configured to allow electric current to pass to an electrode extraction terminal, which is not presented in FIG. 5A.

The penetration part 11 may penetrate through the first electrode 2 to reach a first substrate 1, or may not reach the first substrate 1 by stopping processing inside the first electrode 2.

In the case where a shape of the penetration part 11 is such a micropore that penetrates through the first electrode 2 and reaches the first substrate 1, when a total opening area of the micropore relative to a total area of the developed penetration part 11 is too large, an area of the film of the first electrode 2 is decreased to thereby increase the resistance value, which may cause a decrease of photoelectric conversion efficiency. Therefore, a ratio of the total opening area of the micropore to the area of the penetration part 11 is preferably 5/100 or more and 60/100 or less.

A method of forming the penetration part 11 is not particularly limited and may be appropriately selected in accordance with the intended purpose. Examples thereof include the sand blasting method, the water blasting method, abrasive paper, the chemical etching method, and the laser processing method. Among them, the laser processing method is preferable. This makes it possible to form a minute hole without using, for example, sand, etching, or resist, and to perform processing with good cleanness and reproducibility. In addition, when the penetration part 11 is formed, at least one of the hole blocking layer 3, the electron transport layer 4, the hole transport layer 6, and the second electrode 7 can be removed through impact peeling using the laser processing method. As a result, it is not necessary to provide a mask at the time of laminating, and the aforementioned removal and formation of the minute penetration part 11 can be easily performed at one time.

FIG. 5B illustrates a case where the gap part 10 is not provided in FIG. 5A, and the photoelectric conversion layer (the electron transport layer 4 and the hole transport layer 6) is completely covered with the sealing part 8 in FIG. 5A.

Figure 6A:
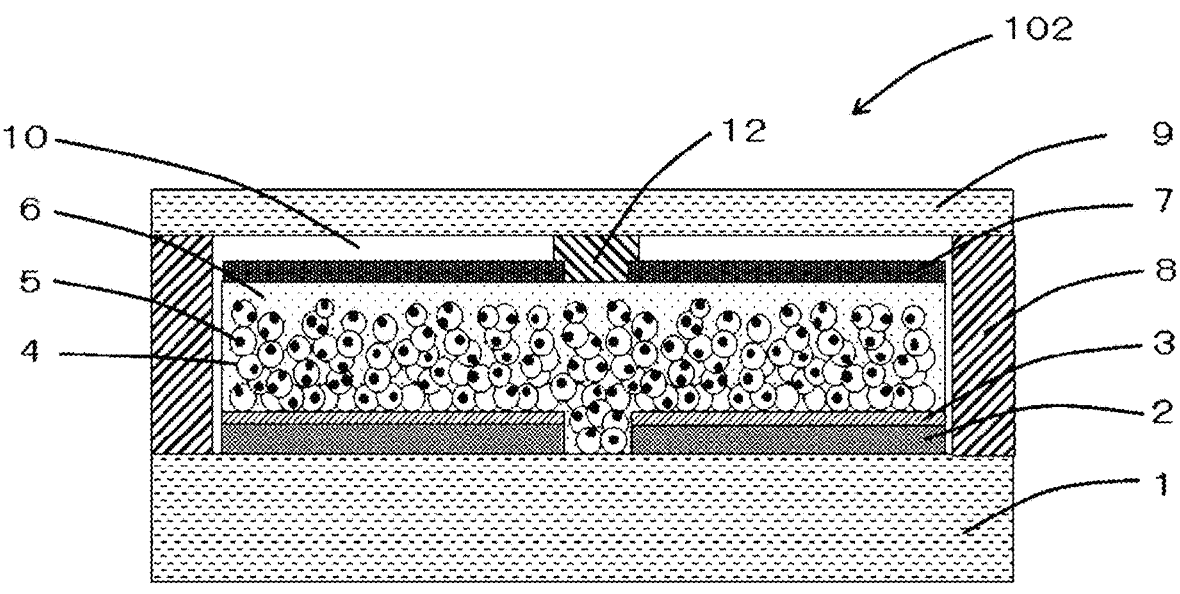
FIG. 6A is a schematic view illustrating another example of a photoelectric conversion module of the present disclosure.
Figure 6B:
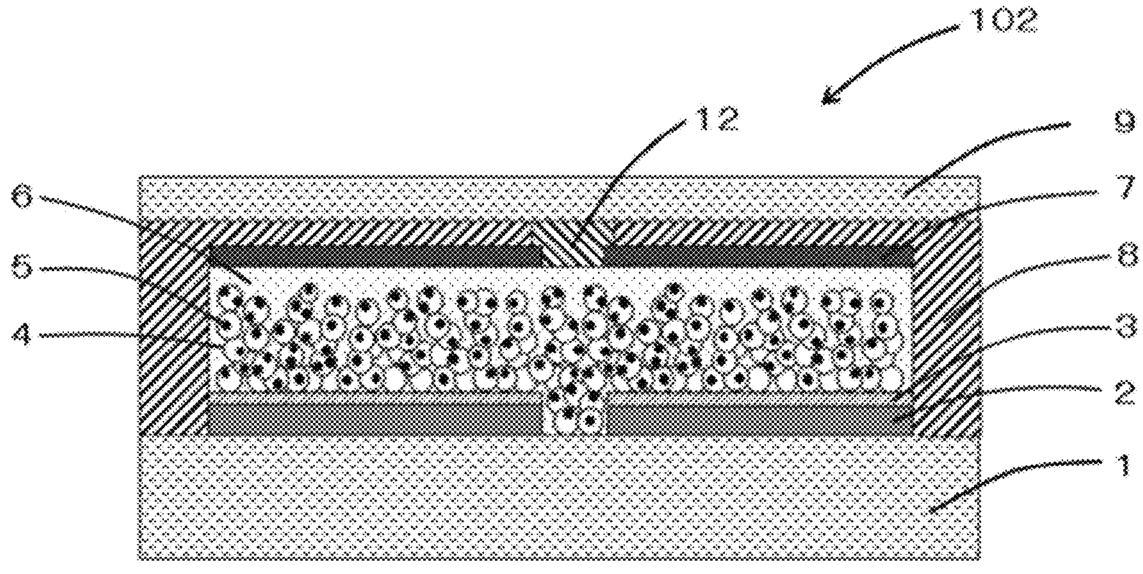
FIG. 6B is a schematic view illustrating another example of a photoelectric conversion module of the present disclosure.

FIG. 6A and FIG. 6B are schematic views depicting one example of the photoelectric conversion module of the present disclosure, and one example of a cross section of a part of the photoelectric conversion module in which a photoelectric conversion module 102 includes a plurality of photoelectric conversion elements that are connected in series, and includes a sealing part 12 like a beam in a gap part between the cells.

As depicted in FIG. 6A, when the gap part 10 is provided between the second electrode 7 and the second substrate 9, peeling or breakage of the second electrode 7 can be minimized, but the mechanical strength of the sealing may be reduced in some cases. Meanwhile, a space between the second electrode 7 and the second substrate 9 is filled with the sealing part 8, the mechanical strength of the sealing is enhanced, but there may be a risk that the second electrode 7 is peeled. In order to enhance electric power generation, increasing an area of the photoelectric conversion module is effective, but a decrease of the mechanical strength is inevitable in the case where the gap part is included therein.

Therefore, as presented in FIG. 6B, providing the sealing part 12 like a beam is effective because peeling or breakage of the second electrode 7 can be minimized and the mechanical strength of the sealing can be enhanced.

Here, a material of the sealing part 12 may be identical to or different from a material of the sealing part 8.

(Electronic Device)

An electronic device of the present disclosure includes: at least one of a photoelectric conversion element and a photoelectric conversion module of the present disclosure; and a device configured to be driven by electric power generated through photoelectric conversion of at least one of the photoelectric conversion element and the photoelectric conversion module. The electronic device of the present disclosure further includes other devices if necessary.

The electronic device of the present disclosure includes: at least one of the photoelectric conversion element and the photoelectric conversion module of the present disclosure; an electricity storage cell that can store electric power generated through photoelectric conversion of the at least one of the photoelectric conversion element and the photoelectric conversion module; and a device configured to be driven by the electric power stored in the electricity storage cell. The electronic device of the present disclosure further includes other devices if necessary.

(Power Supply Module)

A power supply module of the present disclosure includes: at least one of the photoelectric conversion element and the photoelectric conversion module of the present disclosure; and a power supply integrated circuit (power supply IC). The power supply module of the present disclosure further includes other devices if necessary.

A specific embodiment of an electronic device including the photoelectric conversion element and/or the photoelectric conversion module of the present disclosure and a device configured to be driven by electric power obtained through power generation of the photoelectric conversion element and/or the photoelectric conversion module will be described.

Figures 7, 8:
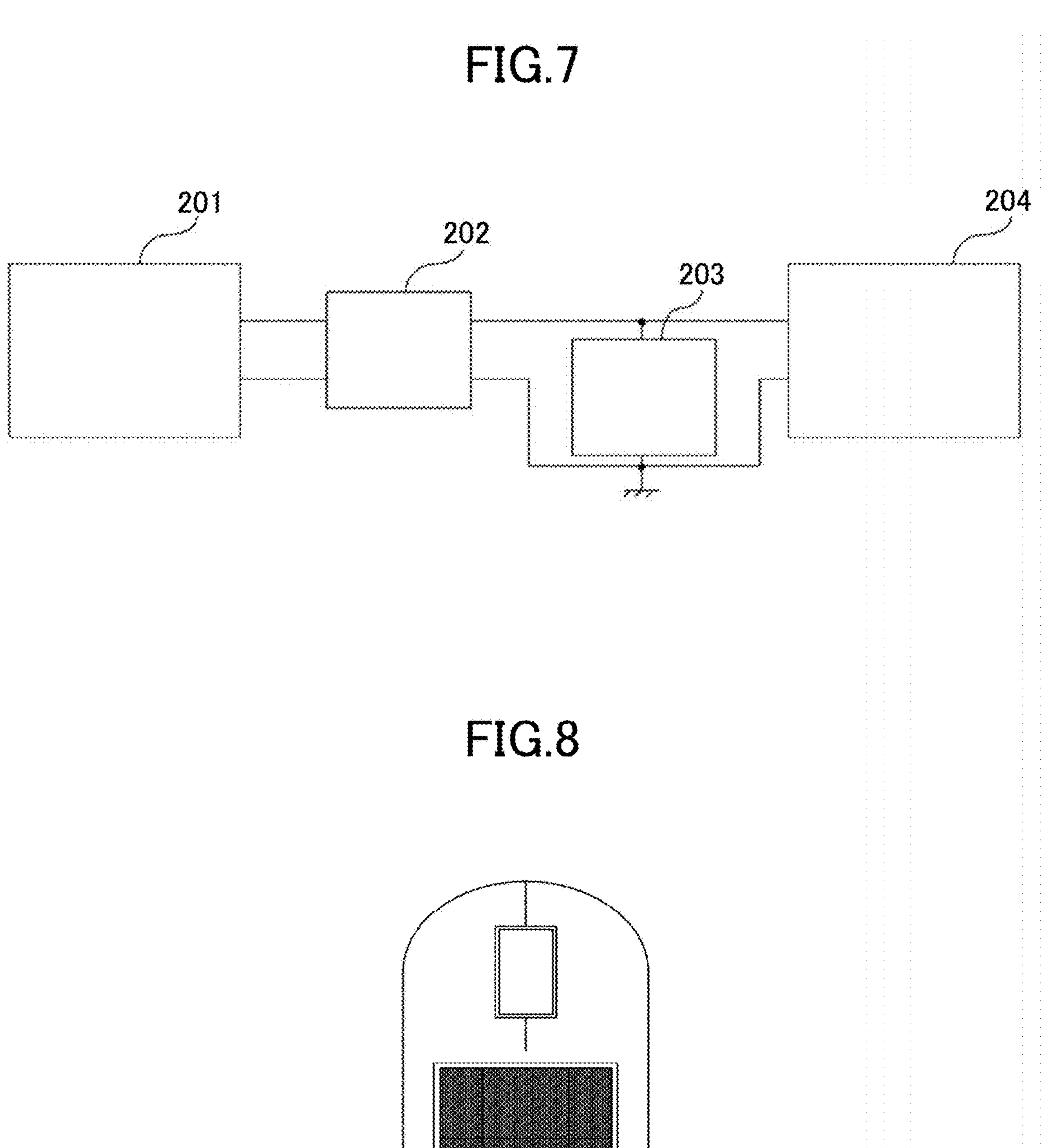
FIG. 7 is a schematic view illustrating one example of a mouse as an electronic device of the present disclosure, which includes the photoelectric conversion module of the present disclosure.
FIG. 8 is a schematic view illustrating one example of a mouse in which a photoelectric conversion element is mounted.

FIG. 7 presents one example of the electronic device including a mouse.

As presented in FIG. 7, a photoelectric conversion element 201, a power supply IC 202, and an electricity storage device 203 are combined and the supplied electric power is allowed to pass to a power supply of a control circuit 204 of a mouse. As a result, the electricity storage device 203 is charged when the mouse is not used, and the mouse can be driven by the electric power. Therefore such a mouse that requires neither wiring nor replacement of a cell can be obtained. Since a cell is not required, a weight thereof can be decreased, and such a configuration is effective.

FIG. 8 presents a schematic view of a mouse including a photoelectric conversion element 201. The photoelectric conversion element 201, a power supply IC 202, and an electricity storage device 203 are mounted inside a mouse, but an upper part of the photoelectric conversion element 201 is covered with a transparent housing so that the photoelectric conversion element 201 receives light. Moreover, the whole housing of the mouse can be formed with a transparent resin. The arrangement of the photoelectric conversion element 201 is not limited to the above. For example, the photoelectric conversion element 201 may be arranged in a position to which light is emitted even when the mouse is covered with a hand, and such arrangement may be preferable.

Another embodiment of an electronic device including the photoelectric conversion element and/or the photoelectric conversion module of the present disclosure and a device configured to be driven by electric power obtained through power generation of the photoelectric conversion element and/or the photoelectric conversion module will be described.

Figures 9, 10:
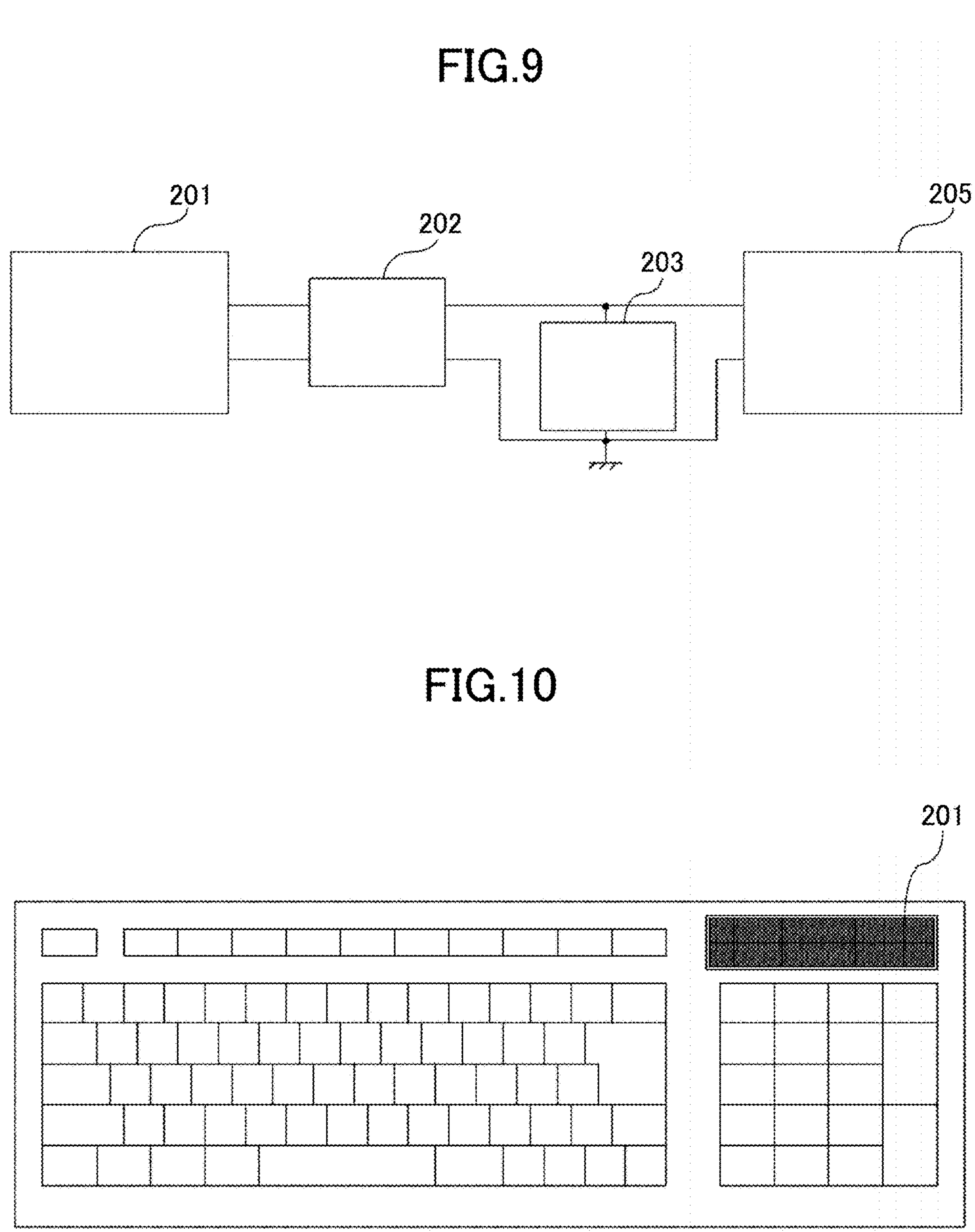
FIG. 9 is a schematic view illustrating one example of a keyboard used in a personal computer as an electronic device of the present disclosure, which includes the photoelectric conversion module of the present disclosure.
FIG. 10 is a schematic view illustrating one example of a keyboard in which a photoelectric conversion element is mounted.

FIG. 9 presents one example of a keyboard as the electronic device, which is used in a personal computer.

As presented in FIG. 9, a photoelectric conversion element 201, a power supply IC 202, and an electricity storage device 203 are combined, and the supplied electric power is allowed to pass to a power supply of a control circuit 205 of a keyboard. As a result, the electricity storage device 203 is charged when the keyboard is not used, and the keyboard can be driven by the electric power. Therefore, such a keyboard that requires neither wiring nor replacement of a cell can be obtained. Such a configuration is effective because a cell is not required and therefore a weight thereof can be decreased.

FIG. 10 presents a schematic view of a keyboard including a photoelectric conversion element 201. The photoelectric conversion element 201, a power supply IC 202, and an electricity storage device 203 are mounted inside the keyboard, but an upper part of the photoelectric conversion element 201 is covered with a transparent housing so that the photoelectric conversion element 201 receives light. The whole housing of the keyboard can be formed with a transparent resin. The arrangement of the photoelectric conversion element 201 is not limited to the above.

Figure 11:
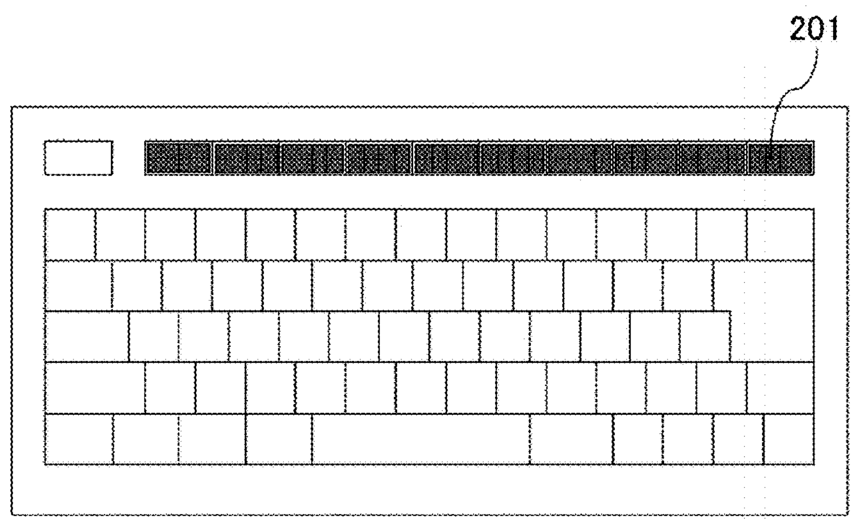
FIG. 11 is a schematic view illustrating one example of a keyboard including a small photoelectric conversion element in part of keys of the keyboard.

In the case of a small keyboard in which a space for incorporating the photoelectric conversion element is small, a small photoelectric conversion element may be embedded in some keys as presented in FIG. 11, and such arrangement is effective.

Another embodiment of an electronic device including the photoelectric conversion element and/or the photoelectric conversion module of the present disclosure and a device configured to be driven by electric power obtained through power generation of the photoelectric conversion element and/or the photoelectric conversion module will be described.

Figure 12:
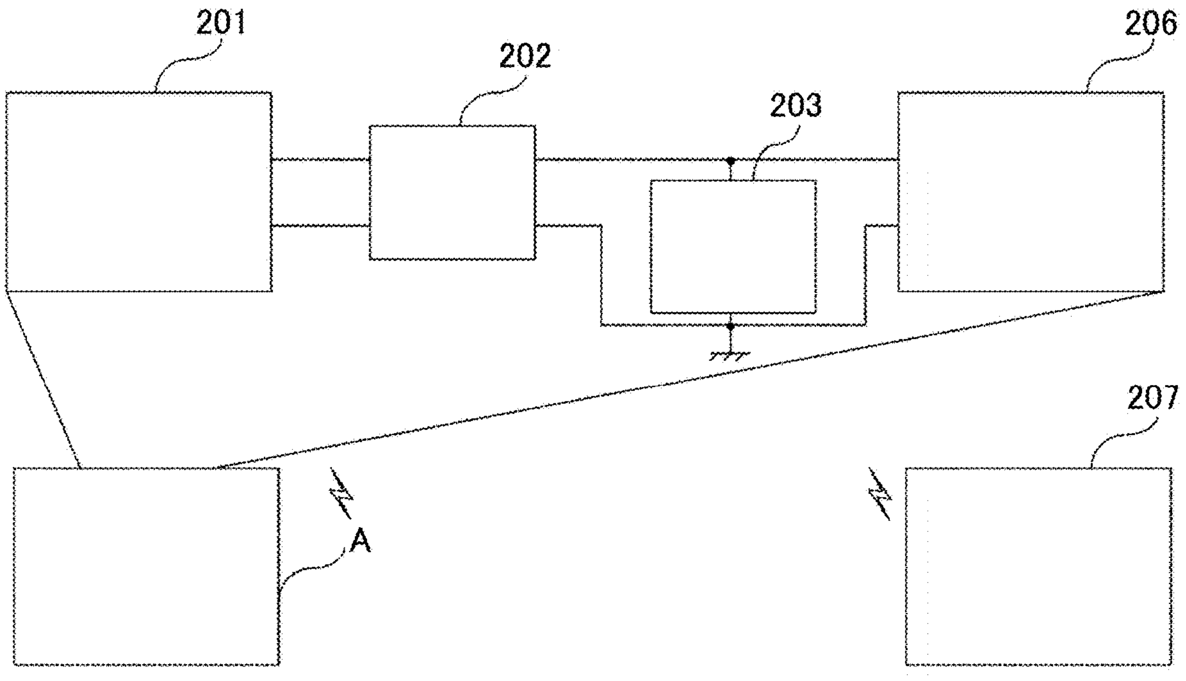
FIG. 12 is a schematic diagram illustrating one example of a sensor as an electronic device of the present disclosure, which includes the photoelectric conversion module of the present disclosure.

FIG. 12 illustrates one example where a sensor is used as the electronic device.

As presented in FIG. 12, a photoelectric conversion element 201, a power supply IC 202, and an electricity storage device 203 are combined, and the supplied electric power is allowed to pass to a power supply of a sensor circuit 206. As a result, a sensor module A can be constituted without requiring connection to an external power supply and without requiring replacement of a cell. A sensing target is, for example, temperature and humidity, illuminance, human detection, $CO_2$ concentration, acceleration, UV intensity, noise, terrestrial magnetism, and atmospheric pressure, and such an electronic device can be applied to various sensors, which is effective. As presented in FIG. 12, the sensor module is configured to sense a target to be measured on a regular basis and to transmit the read data to a device 207 such as a personal computer (PC) or a smartphone through wireless communication.

It is expected that use of sensors is significantly increased as the internet of things (IoT) society approaches. Replacing batteries of numerous sensors one by one is time consuming and is not realistic. Moreover, a sensor is installed at a position such as a ceiling and a wall where a cell is not easily replaced, and this arrangement makes workability bad. The fact that electricity can be supplied by the photoelectric conversion element is also significantly advantageous. In addition, the photoelectric conversion element of the present disclosure has such advantages that a high output can be obtained even with light of a low illuminance, and a high degree of freedom in installation can be achieved because dependence of light incidence angle for the output is small.

Another embodiment of an electronic device including the photoelectric conversion element and/or the photoelectric conversion module of the present disclosure and a device configured to be driven by electric power obtained through power generation of the photoelectric conversion element and/or the photoelectric conversion module will be described.

Figure 13:
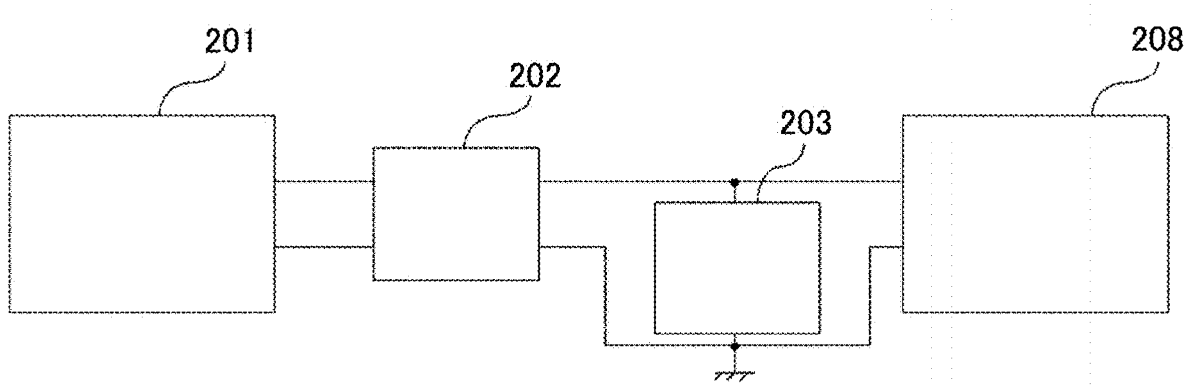
FIG. 13 is a schematic diagram illustrating one example where a turntable is used as an electronic device of the present disclosure, which includes the photoelectric conversion module of the present disclosure.

FIG. 13 illustrates one example where a turntable is used as the electronic device.

As illustrated in FIG. 13, a photoelectric conversion element 201, a power supply IC 202, and an electricity storage device 203 are combined, and the supplied electric power is allowed to pass to a power supply of a turntable control circuit 208. As a result, a turntable can be constituted without requiring connection to an external power supply and without requiring replacement of a cell.

The turntable is used in, for example, a display case in which products are displayed. Wiring of a power supply degrades appearance of the display, and moreover displayed products need to be removed at the time of replacing a cell, which is time-consuming. Use of the photoelectric conversion element of the present disclosure is effective because the aforementioned problems can be overcome.

<Use>

As described above, the electronic device and the power supply module, which include the photoelectric conversion element and/or the photoelectric conversion module of the present disclosure and the device configured to be driven by electric power obtained through power generation of the photoelectric conversion element and/or the photoelectric conversion module, have been described. However, the embodiments described are only part of applicable embodiments, and use of the photoelectric conversion element or the photoelectric conversion module of the present disclosure is not limited to the above-described uses.

The photoelectric conversion element and the photoelectric conversion module can be applied to, for example, a power supply device by combining the photoelectric conversion element and/or the photoelectric conversion module with a circuit board configured to control generated electric current.

Examples of devices using the power supply device include electronic desk calculators, watches, mobile phones, electronic organizers, and electronic paper displays.

Moreover, a power supply device including the photoelectric conversion element can be used as an auxiliary power supply for prolonging a continuous operating time of a rechargeable or disposable electronic equipment.

The photoelectric conversion element and the photoelectric conversion module of the present disclosure can function as a self-sustaining power supply, and electric power generated through photoelectric conversion can be used to drive a device. Since the photoelectric conversion element and the photoelectric conversion module of the present disclosure can generate electricity by irradiation of light, it is not necessary to connect the electronic device to a power supply or to replace a cell. Therefore, the electronic device can be driven in a place without power supply facility, the electronic device can be worn or carried, and the electronic device can be driven without replacement of a cell even in a place where a cell is not easily replaced. Moreover, when a dry cell is used, the electronic device becomes heavy by a weight of the dry cell, or the electronic device becomes large by a size of the dry cell. Therefore, there may be a problem in installing the electronic device on a wall or ceiling, or transporting the electronic device. However, since the photoelectric conversion element and the photoelectric conversion module of the present disclosure are light and thin, they can be freely installed, and can be worn or carried, which is advantageous.

As described above, the photoelectric conversion element and the photoelectric conversion module of the present disclosure can be used as a self-sustaining power supply, and can be combined with various electronic devices. For example, the photoelectric conversion element and the photoelectric conversion module of the present disclosure can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), a transmitter (e.g., a beacon and a global positioning system (GPS)), and numerous electronic devices (e.g., an auxiliary lamp and a remote controller).

The photoelectric conversion element and the photoelectric conversion module of the present disclosure are widely applied because they can generate electricity particularly with light of a low illuminance and can generate electricity indoors and in further darker shade. Moreover, the photoelectric conversion element and the photoelectric conversion module are highly safe, because liquid leakage in the case of a dry cell does not occur, and accidental ingestion in the case of a button cell does not occur. Furthermore, the photoelectric conversion element and the photoelectric conversion module can be used as an auxiliary power supply for the purpose of prolonging the continuous operation time of electrical devices powered by rechargeable or disposable batteries. As described above, when the photoelectric conversion element and/or the photoelectric conversion module of the present disclosure are/is combined with a device configured to be driven by electric power generated through photoelectric conversion of the photoelectric conversion element and/or the photoelectric conversion module, it is possible to obtain an electronic device, which is light and easy to use, has a high degree of freedom in installation, does not require replacement of a cell, is excellent in safety, and is effective in reducing environmental impact.

Figure 14:
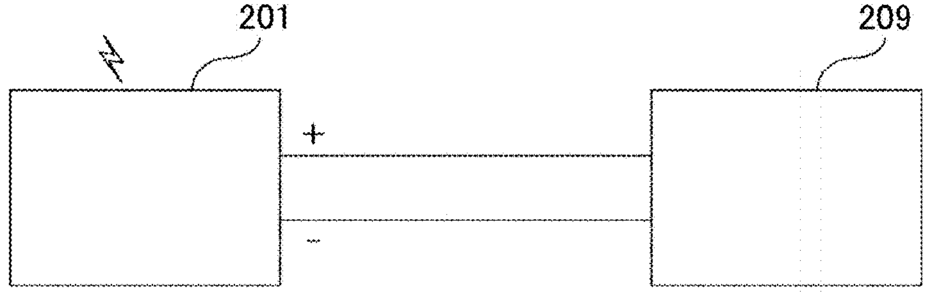
FIG. 14 is a schematic diagram illustrating one example of an electronic device obtained by combining the photoelectric conversion element and/or the photoelectric conversion module of the present disclosure with a device configured to be driven by electric power generated through photoelectric conversion of the photoelectric conversion element and/or the photoelectric conversion module.

FIG. 14 presents a basic configuration diagram of an electronic device obtained by combining the photoelectric conversion element and/or photoelectric conversion module of the present disclosure with a device configured to be driven by electric power generated through photoelectric conversion of the photoelectric conversion element and/or photoelectric conversion module. As presented in FIG. 14, in the electronic device, a photoelectric conversion element 201 is connected to a device circuit 209. This allows the electronic device to generate electricity when the photoelectric conversion element is irradiated with light, and therefore electric power can be extracted. A circuit of the device can be driven by the generated electric power.

Figure 15:
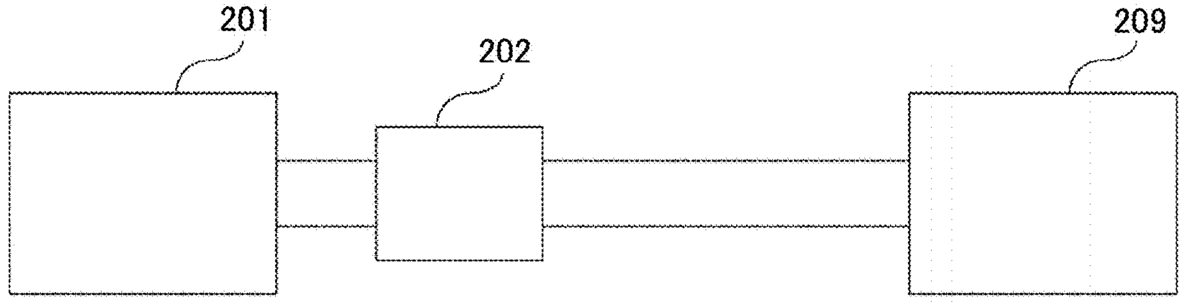
FIG. 15 is a schematic diagram illustrating one example where a power supply IC for a photoelectric conversion element is incorporated between the photoelectric conversion element and the circuit of the device of FIG. 14.

Since the output of the photoelectric conversion element varies depending on circumferential illuminance, the electronic device presented in FIG. 14 may not be stably driven in some cases. In this case, as presented in FIG. 15, a power supply IC 202 for a photoelectric conversion element can be incorporated between a photoelectric conversion element 201 and a device circuit 209 in order to supply stable voltage to a side of the circuit, and such arrangement is effective.

Figure 16:
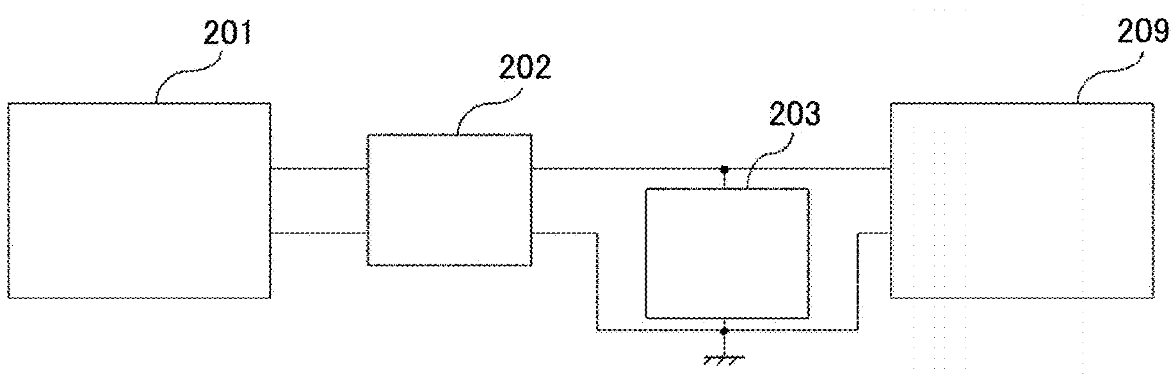
FIG. 16 is a schematic diagram illustrating one example where an electricity storage device is incorporated between the power supply IC and the circuit of the device of FIG. 15.

However, the photoelectric conversion element can generate electricity as long as it is irradiated with light of a sufficient illuminance. However, when the photoelectric conversion element lacks illuminance enough to generate electricity, desired electric power cannot be obtained, which is a disadvantage of the photoelectric conversion element. In this case, as presented in FIG. 16, when an electricity storage device 203 such as a capacitor is mounted between a power supply IC 202 and a device circuit 209, excessive electric power from a photoelectric conversion element 201 can be stored in the electricity storage device 203. In addition, the electric power stored in the electricity storage device 203 can be supplied to the device circuit 209 to thereby enable stable operation when the illuminance is too low or even when no light is applied to the photoelectric conversion element 201.

As described above, the electronic device obtained by combining the photoelectric conversion element and/or the photoelectric conversion module of the present disclosure with the device circuit can be driven even in an environment without a power supply, does not require replacement of a cell, and can be stably driven, in combination with a power supply IC or an electricity storage device. Therefore, it is possible to make the most of advantages of the photoelectric conversion element.

Meanwhile, the photoelectric conversion element and/or the photoelectric conversion module of the present disclosure can also be used as a power supply module, and such use is effective. As presented in FIG. 17, for example, when the photoelectric conversion element and/or the photoelectric conversion module of the present disclosure are/is connected to a power supply IC 202 for a photoelectric conversion element, it is possible to constitute a DC power supply module, which can supply electric power generated through photoelectric conversion of a photoelectric conversion element 201 to the power supply IC 202 at a predetermined voltage level.

Figure 18:
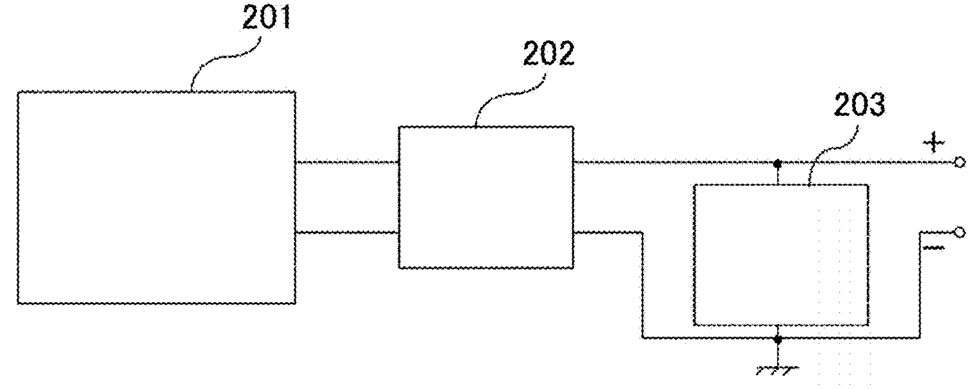
FIG. 18 is a schematic diagram illustrating one example of a power supply module obtained by adding an electricity storage device to the power supply IC of FIG. 17.

Moreover, as presented in FIG. 18, when an electricity storage device 203 is added to a power supply IC 202, electric power generated by a photoelectric conversion element 201 can be stored in the electricity storage device 203. Therefore, it is possible to constitute a power supply module that can supply electric power when the illuminance is too low or even when no light is applied to the photoelectric conversion element 201.

Figure 17:
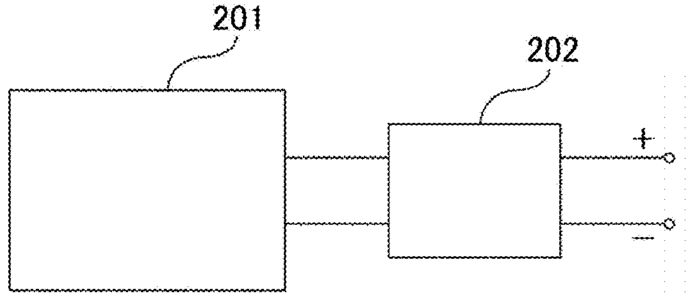
FIG. 17 is a schematic diagram illustrating one example of a power supply module including the photoelectric conversion element and/or the photoelectric conversion module of the present disclosure and a power supply IC.

The power supply modules of the present disclosure presented in FIG. 17 and FIG. 18 can be used as a power supply module without replacement of a cell as in case of conventional primary cells.

As described above, the photoelectric conversion element and the photoelectric conversion module of the present disclosure can be mounted on various electronic devices and can provide many added values, but are particularly suitably used as a partition.

(Partition)

A partition of the present disclosure includes at least one of the photoelectric conversion element and the photoelectric conversion module of the present disclosure, and further includes other devices if necessary.

The partition of the present disclosure includes at least one of the photoelectric conversion element and the photoelectric conversion module of the present disclosure, an electricity storage cell that can store electric power generated through photoelectric conversion of the photoelectric conversion element or the photoelectric conversion module, and a device configured to be driven by the electric power stored in the electricity storage cell, and further includes other devices if necessary.

Note that, the partition of the present disclosure may be referred to as "partition equipped with see-through solar cell".

The partition is mainly used to perform partition in a room, or on a desk or table, and may also be referred to as a partition panel or a partition screen.

In recent years, not only for the purpose of increasing privacy protection or a degree of concentration on work but also for the purpose of minimizing virus infection, a demand as a panel for minimizing aerosol has increased rapidly.

When a partition is used for the purpose of protecting privacy, those that do not transmit light may be used. However, when the partition is used as a panel for minimizing aerosol, a see-through-type partition that can see a partner is preferably used because a user often communicates with the partner through the panel for minimizing aerosol.

Also, the see-through-type partition makes the vicinity of hand bright, and has effects on improving workability or decreasing a burden on eyes.

Conventional see-through solar cells are known to have slits to achieve see-through. When a slit opening rate is increased, light transmission is increased and visibility is improved, but the amount of power generation is decreased. Therefore, it was difficult to achieve both light transmission and electric power generation.

The photoelectric conversion element and the photoelectric conversion module of the present disclosure highly transmit light without providing slits, and can receive light not only from the front surface but also light from the rear surface to generate electric power. Therefore, both light transmission and electric power generation can be achieved. Therefore, the photoelectric conversion element and the photoelectric conversion module of the present disclosure are effectively used for, for example, a partition that receives light from the front surface and the rear surface because the amount of power generation increases, rather than used for a partition displayed on wall, which receives light only from the front surface.

The photoelectric conversion element and the photoelectric conversion module of the present disclosure can variously change, for example, colors, light transmittances, or haze rates depending on selection of a photosensitization compound, and a partition equipped with a see-through solar cell, which has a color or light transmittance according to a preference, can be obtained.

A completely colorless and transparent partition has disadvantageous concerns in terms of increasing privacy protection or a degree of concentration. However, such concerns can be overcome by coloring the completely colorless and transparent partition, slightly decreasing a light transmission, or slightly increasing a haze rate, and the functions of the original partition can be maintained.

Moreover, because the photoelectric conversion element and the photoelectric conversion module of the present disclosure are detachable, colors, light transmission, and haze rates of the partition of the present disclosure can be changed in accordance with uses or purposes, and can be used in combination with a photoelectric conversion element and a photoelectric conversion module having, for example, different colors, light transmission, and haze rates.

The partition of the present disclosure is provided with an output terminal configured to extract generated electric current.

Any of conventional output terminals can be used as long as the output terminal is a terminal configured to extract electric current. Examples the output terminal include USB terminals. This configuration can be used for a power source of an LED desk stand or for temporary charging of a smartphone.

Note that, the output terminal of the present disclosure is not limited thereto, and also includes, for example, a terminal connected to a device that can be driven by using generated electric power and will be described later.

The partition of the present disclosure can include a device that can be driven by using generated electric power.

Examples of the device that can be driven include sensors, displays, lights (warning lamps), and audio output devices.

Examples of the sensor include conventional sensors such as temperature and humidity sensors, $CO_2$ sensors, human detection sensors, illuminance sensors, and noise sensors. When the partition is provided with the sensor, the sensor can be continuously driven without supplying an external power source. This makes it possible to alert a user to the danger of heat stroke, to facilitate ventilation of a room to minimize infection, and to visualize environments to result in improvement of the environments. Therefore, such a configuration can be expected to be developed to various uses.

Examples of the display include electronic paper, liquid crystal displays, and organic electroluminescence (EL) displays. When the display is mounted on the partition, it is possible to display, for example, the latest news or advertisements, or a menu or recommended items in information or restaurants. The partition including the display together with the sensor is effective because sensing data can be displayed.

In combination with various sensors, the light (warning lamps) or the audio output device can be used as a means for alerting a user to an emergency such as the time when the danger of heat stroke increases or the time when ventilation is required. For example, the light (warning lamps) or the audio output device can be used as a means for, for example, informing a user of a vacant place in combination with the human detection sensor.

As described above, the photoelectric conversion element and the photoelectric conversion module of the present disclosure can generate electricity with light not only from the front surface side (first electrode side) but also from the rear surface side (second electrode side), highly generate electric power even under indoor environments having a low illuminance, and also have a high light transmission. Therefore, the photoelectric conversion element and the photoelectric conversion module of the present disclosure are particularly useful as partitions or panels for minimizing aerosol.

The partition of the present disclosure is very useful because it can be widely used in places where people gather together, such as offices, shops, restaurants, schools, libraries, meetings, and workshops, can provide many added values, require neither replacement of a cell nor wiring of a power supply, and are easily movable.

One example of the partition (partition equipped with see-through solar cell) including the photoelectric conversion element and the photoelectric conversion module of the present disclosure will be described with reference to drawings below. However, the followings are one example to describe the present disclosure, and the present disclosure is not limited thereto.

Figure 19:
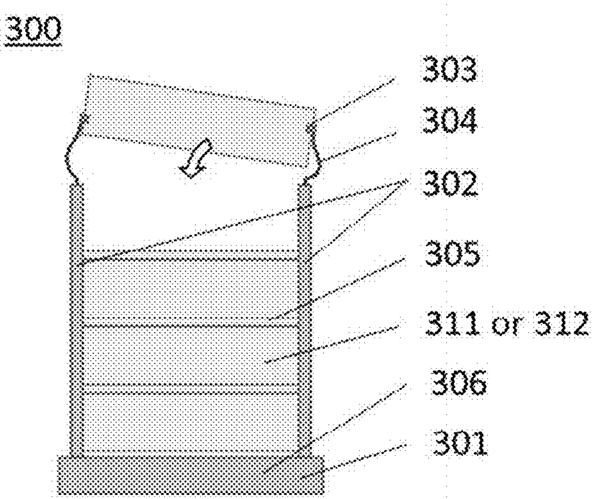
FIG. 19 is a schematic view illustrating one example of a partition of the present disclosure.

FIG. 19 illustrates one example of a partition equipped with a see-through solar cell of the present disclosure.

In FIG. 19, a partition 300 includes two rails 302 on an installation stand 301 in a vertical direction, and is fixed by inserting a photoelectric conversion element 311 and/or a photoelectric conversion module 312 between the two rails. The edge of the photoelectric conversion element 311 and/or the photoelectric conversion module 312 is provided with a terminal 303, and the terminal 303 is provided with a wiring 304 that is electrically connected to a terminal 303 of another photoelectric conversion element 311 and/or photoelectric conversion module 312 in series or in parallel. The terminal 303 and the wiring 304 of the photoelectric conversion element 311 and/or the photoelectric conversion module 312 are housed inside the rail 302, and are invisible from the outside.

A protection member 305 configured to minimize breakage or unstableness can be sandwiched between a plurality of the photoelectric conversion elements 311 and/or photoelectric conversion modules 312. The protection member 305 is preferably formed of a resin, and is more preferably transparent.

The partition equipped with the see-through solar cell of the present disclosure includes an output terminal 306 configured to extract electric power generated by at least one of the photoelectric conversion element 311 and the photoelectric conversion module 312 of the present disclosure. As described above, another device that can be driven by using generated electric power, such as a sensor, a display, a light, or an audio output device can be installed (not illustrated).

The partition equipped with the see-through solar cell of the present disclosure can also include a means for installing at least one of the photoelectric conversion element 311 and the photoelectric conversion module 312 on a transparent insulation panel 307.

Figure 20:
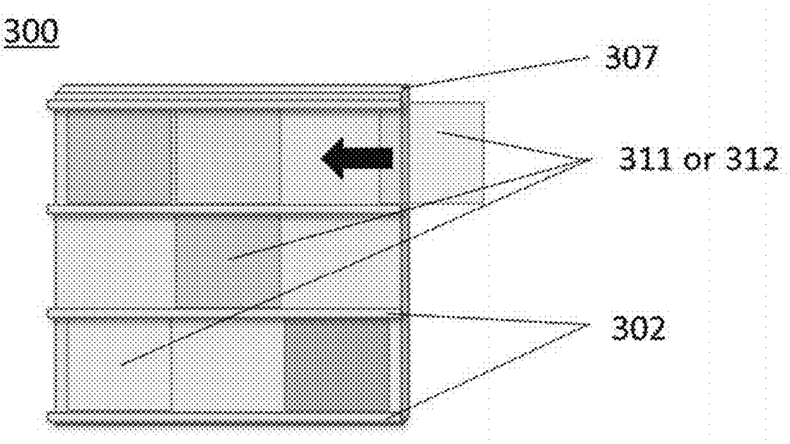
FIG. 20 is a schematic view illustrating another example of a partition of the present disclosure.
Figure 21:
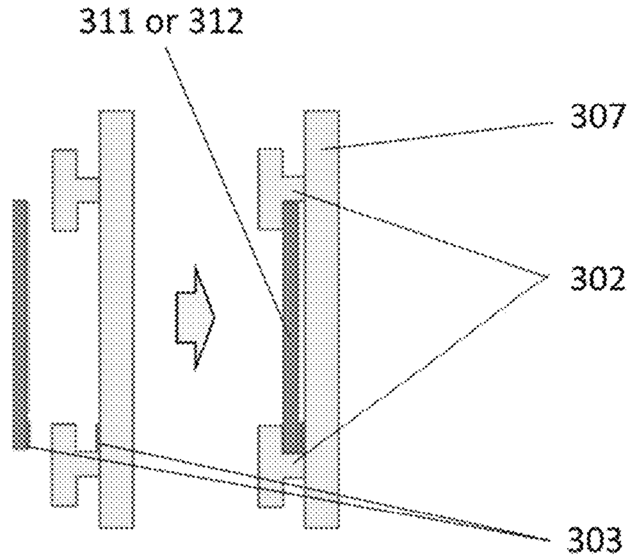
FIG. 21 is a schematic view illustrating one example of a side surface of the partition of the present disclosure illustrated in FIG. 20.

FIG. 20 and FIG. 21 illustrate another example of the partition 300 equipped with the see-through solar cell of the present disclosure including the transparent insulation panel 307.

The partition 300 of FIG. 20 includes, on the transparent insulation panel 307, the rails 302 configured to fix at least one of the photoelectric conversion element 311 and the photoelectric conversion module 312 of the present disclosure, and at least one of the photoelectric conversion element 311 and the photoelectric conversion module 312 of the present disclosure can be inserted into the rails 302 to be fixed.

FIG. 21 illustrates a side view of FIG. 20. As illustrated in FIG. 21, when a photoelectric conversion element 311 and/or a photoelectric conversion module 312 are/is inserted into a rail 302 to be placed in a predetermined position, a terminal 303 provided on the photoelectric conversion element 311 and the photoelectric conversion module 312 contacts with a terminal 303 provided on the insulation panel 307, and the photoelectric conversion element 311 and/or the photoelectric conversion module 312 are/is electrically connected to another photoelectric conversion element 311 and/or photoelectric conversion module 312 in series or in parallel via a wiring 304 that is not illustrated.

The partitions of FIG. 20 and FIG. 21 are provided with an output terminal (not illustrated) configured to extract electric power generated by at least one of the photoelectric conversion element 311 and the photoelectric conversion module 312, and further include a device that can be driven by using generated or stored electric power, such as a sensor, a display, a light, or an audio output device.

Figure 22:
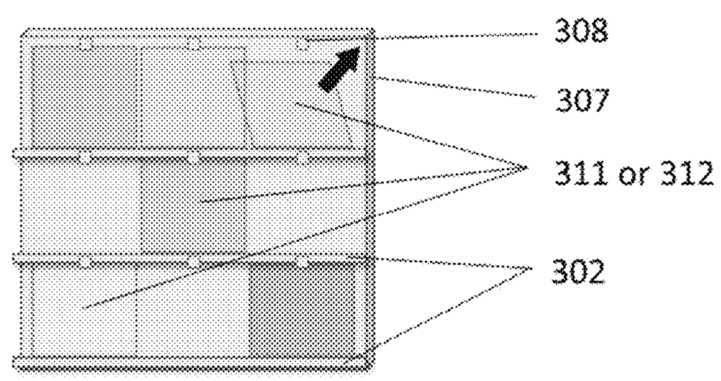
FIG. 22 is a schematic view illustrating another example of a partition of the present disclosure.
Figure 23:
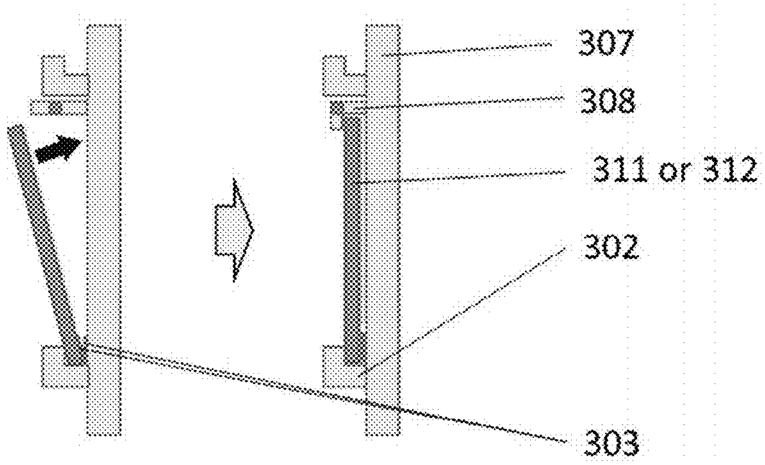
FIG. 23 is a schematic view illustrating one example of a side surface of the partition of the present disclosure illustrated in FIG. 22.

FIG. 22 and FIG. 23 are still another example of a partition equipped with a see-through solar cell of the present disclosure, which includes a transparent insulation panel 307.

In the partition 300 of FIG. 22, the lower side of the photoelectric conversion element 311 and/or the photoelectric conversion module 312 is mounted on the rail 302 of a transparent insulation panel 307, and the upper side thereof is fixed with a clasp 308.

FIG. 23 illustrates a side view of FIG. 22. As illustrated in FIG. 23, when the lower side of at least one of the photoelectric conversion element 311 and the photoelectric conversion module 312 is mounted on the rail 302 and the upper side thereof is fixed with the clasp 308, a terminal 303 provided on at least one of the photoelectric conversion element 311 and the photoelectric conversion module 312 contacts with a terminal 303 provided on the insulation panel 307, and the at least one of the photoelectric conversion element 311 and the photoelectric conversion module 312 is electrically connected to at least one of another photoelectric conversion element 311 and another photoelectric conversion module 312 in series or in parallel by a wiring 304 that is not illustrated.

The partition 300 of FIG. 22 and FIG. 23 is provided with an output terminal (not illustrated) configured to extract electric power generated by at least one of the photoelectric conversion element 311 and the photoelectric conversion module 312, and can be further equipped with, for example, a device that can be driven by using generated or stored electric power, such as a sensor, a display, a light, and an audio output device.

Figure 24:
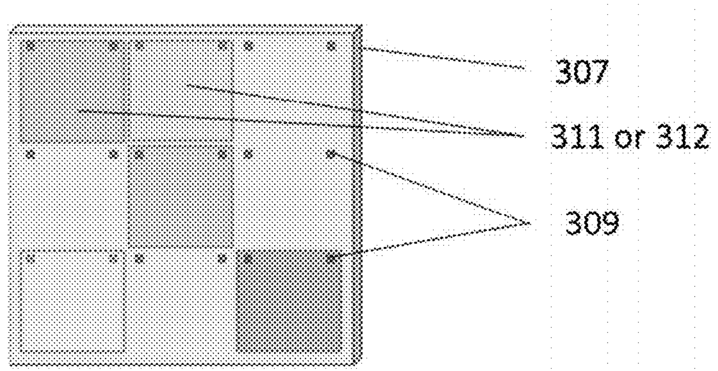
FIG. 24 is a schematic view illustrating another example of a partition of the present disclosure.
Figure 25:
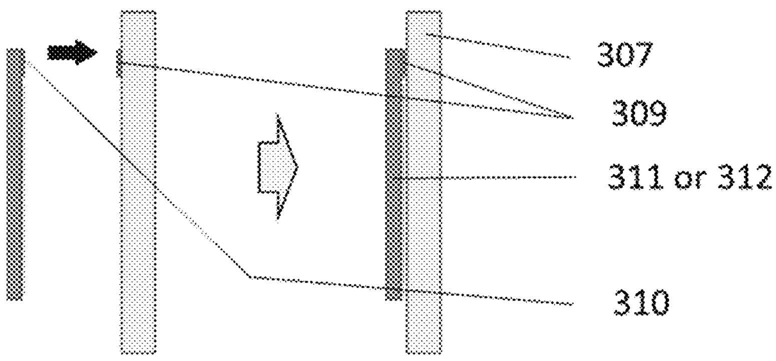
FIG. 25 is a schematic view illustrating one example of a side surface of the partition of the present disclosure illustrated in FIG. 24.

FIG. 24 and FIG. 25 are still another example of a partition 300 equipped with a see-through solar cell of the present disclosure, which includes a transparent insulation panel 307.

A partition 300 of FIG. 24 is provided with a magnet terminal 309 provided with wirings (not illustrated) on the transparent insulation panel 307. A metallic terminal 303 of the photoelectric conversion element 311 and/or the photoelectric conversion module 312 is attached to the magnet terminal 309, to fix the photoelectric conversion element 311 and/or the photoelectric conversion module 312.

FIG. 25 is a side view of FIG. 24. As illustrated in FIG. 25, when the metallic terminal of the photoelectric conversion element 311 and the photoelectric conversion module 312 is simply attached to the magnet terminal 309 that include wirings that are not illustrated and are provided on a transparent insulation panel 307, the photoelectric conversion element 311 and/or the photoelectric conversion module 312 are/is easily electrically connected to another photoelectric conversion element 311 and another photoelectric conversion module 312 in series or in parallel, and are/is fixed at the same time. If necessary, the lower side of the photoelectric conversion element 311 and/or the photoelectric conversion module 312 can also be fixed with, for example, a rail 302 or a clasp 308.

The partition 300 of FIG. 24 and FIG. 25 is provided with an output terminal (not illustrated) configured to extract electric power generated by the photoelectric conversion element 311 and/or the photoelectric conversion module 312, and can be further equipped with a device that can be driven by using generated or stored electric power, such as a sensor, a display, a light, and an audio output device.

EXAMPLES

Hereinafter, Examples of the present disclosure will be described, but the present disclosure shall not be construed as being limited to these Examples.

Example 1

<Production of Photoelectric Conversion Module>

On a glass substrate as a first substrate, a film of indium-doped tin oxide (ITO) and a film of niobium-doped tin oxide (NTO) as a first electrode were sequentially formed through sputtering (ITO: average thickness 250 nm, and NTO: average thickness 150 nm).

A visible light transmittance of the first electrode was 70%, which was measured by a measurement method of visible light transmittance $t_v$ using an ultraviolet and visible spectrophotometer (apparatus name: ISR-3100, manufactured by SHIMADZU CORPORATION) according to JIS A5759.

Next, a compact layer (average thickness 20 nm) formed of titanium oxide was formed as a hole blocking layer through reactive sputtering using oxygen gas.

Next, a titanium oxide paste (manufactured by JGC Catalysts and Chemicals Ltd., product name: PST-18NR) was coated on the hole blocking layer through screen printing so as to have an average thickness of about 0.7 μm. After the coated paste was dried at 120° C., it was fired at 550° C. for 30 minutes in the air to form a porous electron transport layer. Then, the ITO/NTO layer, the hole blocking layer, and the electron transport layer were each divided into eight cells through laser processing.

The glass substrate on which the electron transport layer was formed was immersed in a solution, which was obtained by adding an acetonitrile/t-butanol (volume ratio 1:1) mixed liquid to a photosensitization compound (0.2 mM) expressed by the following (B-60) under stirring. Then, the resulting mixture was left to stand for an hour in a dark place, and the photosensitization compound was adsorbed on the surface of the electron transport layer.

(B-60)

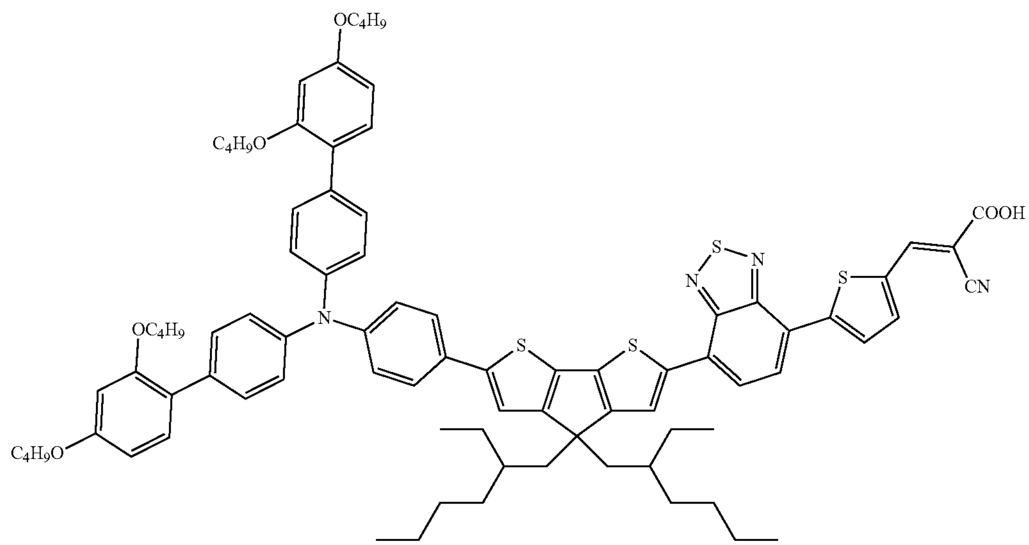

Next, to a chlorobenzene solution, lithium (fluorosulfonyl) (trifluoromethanesulfonyl)imide (Li-FTFSI) (manufactured by Tokyo Chemical Industry Co., Ltd.) (65.1 mM) as a lithium salt, a pyridine compound expressed by the following (H-1) (146.5 mM), an organic hole transport material (HTM) (manufactured by Sigma-Aldrich) (162.8 mM) expressed by the following (D-7), and a cobalt complex expressed by the following (F-11) (manufactured by Greatcell solar materials) (12.7 mM) were added, followed by dissolving these materials, to thereby prepare a coating liquid for hole transport layer. Note that, a molar ratio (a/b) of the pyridine compound (a) to the lithium salt (b) was 2.25.

(Li-FTFSI)

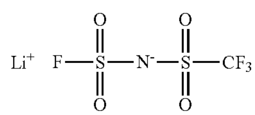

(H-1)

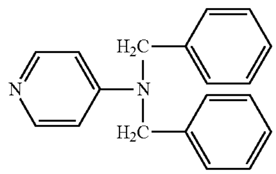

(D-7)

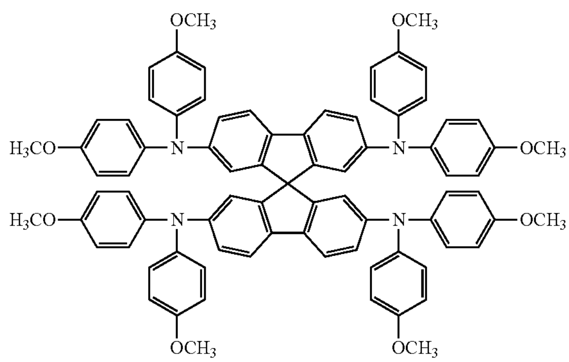

(F-11)

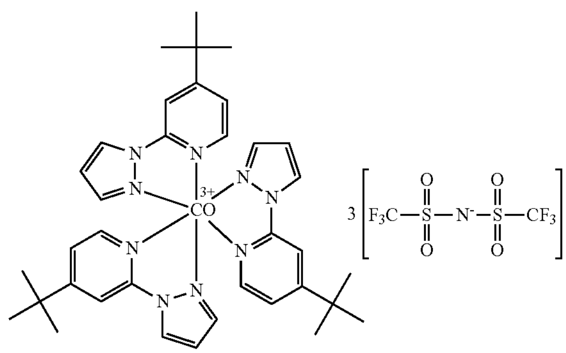

Then, on the electron transport layer on which the photosensitization compound was adsorbed, a hole transport layer having an average thickness of about 600 nm was formed through die coating using the coating liquid for hole transport layer. As described above, a photoelectric conversion layer including the electron transport layer and the hole transport layer was formed.

Then, a silver nanowire liquid (manufactured by SEIKO PMC CORPORATION, product name: T-AG221) was coated through die coating so as to form a film having an average thickness of about 70 nm, and was dried at 120° C. for 5 minutes, to form a second electrode.

Note that, the silver nanowire liquid includes a poly(3,4-ethyleneoxythiophene) polystyrene sulfonate derivative as a conductive polymer.

In this state, the visible light transmittance was measured based on the following method. The results are presented in Table 2.

[Measurement Method of Visible Light Transmittance]

Measurement was performed by a measurement method of visible light transmittance $t_v$ using an ultraviolet and visible spectrophotometer (apparatus name: ISR-3100, manufactured by SHIMADZU CORPORATION) according to JIS A5759.

A silane structure-including fluorine compound (manufactured by Harves Co., Ltd., product name: DURASURF DS-5935F130) was coated on the second electrode through die coating so as to form a film of an electrode protection layer having an average thickness of 10 nm.

Then, in order to form parts where the sealing parts were to contact with the glass substrate, an etching treatment (deletion treatment) through laser processing was applied to 1.0 mm-wide parts from the edges of the glass substrate to be provided with the sealing parts. The etching treatment was applied between the cells in the same manner. Moreover, a through hole (through part) connected to the ITO/NTO layer, which is a terminal extraction part, was formed through laser processing, and a through hole (through part) to connect the cells in series was formed through laser processing.

A piece of tape (manufactured by Tesa, product name: 61533) as a sealing part including a moisture-reactive dry agent such as calcium chloride, and a second substrate (manufactured by LINTEC Corporation, product name: MS-F2050P) were sequentially pasted to the whole glass substrate using an assembly machine (manufactured by JOYO ENGINEERING CO., LTD., machine name: airbag-type vacuum laminator). The pasted products were joined with pressure while being warmed to 70° C. using a heat laminator, to form a sealing part and a second substrate.

As described above, the power generation region was sealed, and an UV protection film (manufactured by LINTEC Corporation, product name: PET50 HD UV400 PET25) was finally pasted to a surface that receives light, to produce a photoelectric conversion module as presented in FIG. 5B.

Example 2

A photoelectric conversion module was produced in the same manner as in Example 1 except that the photosensitization compound B-60 used was changed to the following photosensitization compound B-5 and the average thickness of the second electrode was changed to 45 nm. The results are presented in Table 2.

(B-5)

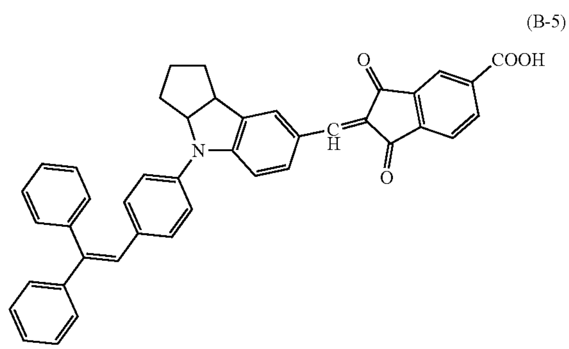 [SMILES: O=C(O)c1ccc2c(c1)C(=O)/C(=C\c1ccc3c(c1)C1CCCC1N3c1ccc(C=C(c3ccccc3)c3ccccc3)cc1)C2=O]

Example 3

A photoelectric conversion module was produced in the same manner as in Example 1 except that the photosensitization compound B-60 used was changed to product name: D131 (manufactured by Mitsubishi Paper Mills Limited) and the average thickness of the second electrode was changed to 20 nm. The results are presented in Table 2.

Example 4

In Example 1, the edges of the first electrode were coated by an ultraviolet ray curable resin (manufactured by ThreeBond Holdings Co., Ltd., product name: TB3118) using a dispenser (manufactured by SAN-EI TECH LTD., product name: 2300N) so that the power generation region was surrounded. Then, the coated product was transferred in a glove box in which the dew point was controlled to −40° C. and the oxygen concentration was controlled to 10%. A moisture-trapping agent (manufactured by SAES Getters Japan, product name: EDRY/X/SMT10) was coated on the ultraviolet ray curable resin in the same area as the power generation region, and a dried glass substrate (manufactured by Corning Incorporated, product name: EAGLE XG) was placed thereon. After the obtained product was cured by irradiation of ultraviolet rays, it was heated at 80° C. for 60 minutes. Then, a photoelectric conversion module was produced in the same manner as in Example 1 except that the power generation region was sealed. The results are presented in Table 2.

Example 5

A photoelectric conversion module was produced in the same manner as in Example 1 except that the thickness of the second electrode was changed to 15 nm. The results are presented in Table 2.

Example 6

A photoelectric conversion module was produced in the same manner as in Example 1 except that the thickness of the second electrode was changed to 85 nm. The results are presented in Table 2.

Example 7

A photoelectric conversion module was produced in the same manner as in Example 1 except that the sealing part was changed to $H_2$-3000 (manufactured by Alpha Advanced Materials) that includes a moisture absorbing drying agent including, for example, zeolite. The results are presented in Table 2.

Comparative Example 1

A photoelectric conversion module was produced in the same manner as in Example 1 except that after a mask was mounted at the edges and between cells of the glass substrate, silver was deposited under vacuum to form a second electrode having an average thickness of about 70 nm in the production of the second electrode in Example 1.

Comparative Example 2

A photoelectric conversion module was produced in the same manner as in Example 1 except that a material (manufactured by Tesa, product name: 61563) including no drying agent was used for the sealing part. The results are presented in Table 2.

Comparative Example 3

A photoelectric conversion module was produced in the same manner as in Example 1 except that the thickness of the second electrode was changed to 150 nm. The results are presented in Table 2.

Comparative Example 4

A photoelectric conversion module was produced in the same manner as in Example 1 except that the silver nanowire liquid was changed to a silver nanowire liquid (manufactured by SEIKO PMC CORPORATION, product name: T-AG217) that includes no conductive polymer. The results are presented in Table 2.

Comparative Example 5

A photoelectric conversion module was produced in the same manner as in Example 1 except that, as the first substrate, the glass substrate formed of the ITO/NTO film was changed to titanium foil (manufactured by Takeuchi Metal Foil & Powder Co., Ltd., product name: TR270-C). The results are presented in Table 2.

Next, each of the produced photoelectric conversion modules was evaluated for "visible light transmittance" and "performance of photoelectric conversion module (Pmax maintenance rate)" in the following manners. The results are presented in Table 2.

<Evaluation of Visible Light Transmittance>

The obtained photoelectric conversion module was measured by a measurement method of visible light transmittance $t_v$ using an ultraviolet and visible spectrophotometer (apparatus name: ISR-3100, manufactured by SHIMADZU CORPORATION) according to JIS A5759. The results are presented in Table 2.

<Performance Evaluation (1) of Photoelectric Conversion Module>

The IV characteristics of the obtained photoelectric conversion module were measured at 25° C. and 200 1x using a solar cell evaluation system (apparatus name: As-510-PV03, manufactured by NF Corporation) to determine the initial maximum output electric power Pmax1 (μW/cm$^2$).

After the both surfaces of the photoelectric conversion module were irradiated with 5,000 K white LED of 20,000 1x for about 500 hours under an environment of 60° C., relative humidity 90% in a thermostat bath, the IV characteristics at 25° C. and 200 1× were measured again, to measure the maximum output electric power Pmax2 (μW/cm$^2$). Then, the Pmax maintenance rate A [(Pmax2/Pmax1)×100] (%) was obtained.

Table 2 also presents the results of the initial value maintenance rates obtained by continuously irradiating the produced photoelectric conversion modules with LED of 20 klx.

<Performance Evaluation (2) of Photoelectric Conversion Module>

The IV characteristics of the obtained photoelectric conversion module were measured at 25° C. and 200 1× using a solar cell evaluation system (apparatus name: As-510-PV03, manufactured by NF Corporation) to determine the initial maximum output electric power Pmax1 (μW/cm$^2$).

After the first substrate of the photoelectric conversion module was irradiated with 5,000 K white LED of 20,000 1× for about 500 hours under an environment of 60° C. in a thermostat bath, the IV characteristics at 25° C. and 200 1× were measured again, to measure the maximum output electric power Pmax3 (μW/cm$^2$). Then, the Pmax maintenance rate B [(Pmax3/Pmax1)×100] (%) was obtained.

The obtained results are presented in Table 2.

TABLE 2

| | Second electrode | | | Sealing part | | | Photo-sensitization compound | Photoelectric conversion module | | |
|---|---|---|---|---|---|---|---|---|---|---|
| | Materials | Average thickness (nm) | Visible ray transmittance (%) | Sealing method | Drying agent | Sealing material | | Visible ray transmittance (%) | Pmax maintenance rate A (%) | Pmax maintenance rate B (%) |
| Ex. 1 | Silver nanoware and conductive polymer | 70 | 68 | Full surface sealing | Moisture sensitivity | Pressure-sensitive adhesive | B-60 | 20 | 75 | 90 |
| Ex. 2 | Silver nanoware and conductive polymer | 45 | 70 | Full surface sealing | Moisture sensitivity | Pressure-sensitive adhesive | B-5 | 35 | 78 | 87 |
| Ex. 3 | Silver nanoware and conductive polymer | 20 | 80 | Full surface sealing | Moisture sensitivity | Pressure-sensitive adhesive | D131 | 50 | 82 | 86 |
| Ex. 4 | Silver nanoware and conductive polymer | 70 | 60 | Frame sealing | Moisture sensitivity | UV curable resin | B-60 | 27 | 76 | 83 |
| Ex. 5 | Silver nanoware and conductive polymer | 15 | 90 | Full surface sealing | Moisture sensitivity | Pressure-sensitive adhesive | B-61 | 43 | 65 | 79 |
| Ex. 6 | Silver nanoware and conductive polymer | 85 | 55 | Full surface sealing | Moisture sensitivity | Pressure-sensitive adhesive | B-60 | 15 | 58 | 87 |
| Ex. 7 | Silver nanoware and conductive polymer | 70 | 60 | Full surface sealing | Moisture-adsorbing property | Pressure-sensitive adhesive | B-62 | 23 | 72 | 85 |
| Comp. Ex. 1 | Vacuum deposition of silver | 70 | 5 | Full surface sealing | Moisture sensitivity | Pressure-sensitive adhesive | B-63 | 2 | 32 | 88 |
| Comp. Ex. 2 | Silver nanoware and conductive polymer | 70 | 60 | Full surface sealing | — | Pressure-sensitive adhesive | B-64 | 22 | 12 | 60 |
| Comp. Ex. 3 | Silver nanoware and conductive polymer | 150 | 37 | Full surface sealing | Moisture sensitivity | Pressure-sensitive adhesive | B-65 | 13 | 41 | 81 |
| Comp. Ex. 4 | Silver nanoware | 70 | 60 | Full surface sealing | Moisture sensitivity | Pressure-sensitive adhesive | B-66 | 24 | 35 | 32 |
| Comp. Ex. 5 | Silver nanoware and conductive polymer | 70 | 60 | Full surface sealing | Moisture sensitivity | Pressure-sensitive adhesive | B-60 | 0 | 27 | 79 |

From the results of Examples 1 to 7 and Comparative Examples 1 to 5, the higher the visible light transmittance was, the better the output maintenance rate A (Pmax maintenance rate A) was. In Comparative Examples 1, 3, and 4, which exhibited no translucency (transmission of visible light), the proximity of the boundary surface between the second electrode having a low translucency and the hole transport layer was partially discolored, and patchy patterns were observed. Moreover, in Comparative Example 2 including no drying agent, the output maintenance rate B (Pmax maintenance rate B) showed the same result even in the test of high temperature light irradiation that was not affected by the external humidity. It is considered that the reason for this is because moisture adsorbed when the device is produced deteriorates the conductive polymer in the second electrode.

Next, the photoelectric conversion module of Example 1 was used to produce a partition in the following manner.

<Production of Partition Equipped with See-Through Solar Cell>

A partition equipped with a see-through solar cell of the present disclosure in FIG. 19 was produced.

As a photoelectric conversion module 312 of the present disclosure equipped in a partition 300, five photoelectric conversion modules 312 having a dimension of 84 mm by 270 mm were produced in the same manner as in Example 1. At a side opposite to a side where sealing was performed using a barrier film (second substrate), an UV protection film was pasted.

Moreover, terminals were provided at short sides of the photoelectric conversion module 312, and wiring was performed so that the respective terminals 303 of the five photoelectric conversion modules 312 were connected in parallel.

Two rails 302 were provided at both edges of an installation stand 301 in a perpendicular direction.

Figure 26:
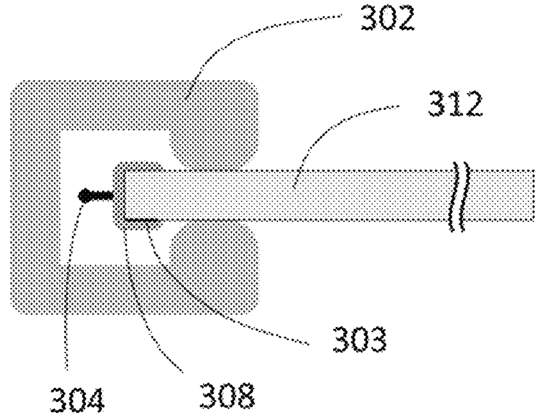
FIG. 26 is a schematic view illustrating a rail of a partition in Examples.

FIG. 26 illustrates a cross-sectional view of the rail 302.

After conductive paste (product name: SX-ECA48, manufactured by Cemedine) was coated on the terminal 303 of the photoelectric conversion module 312, the terminal 303 was fixed using a metallic terminal-fixing jig 308 so as not to be removed.

The terminal-fixing jig (clasp) 308 was provided with a wiring 30 configured to connect the terminal 303 of another photoelectric conversion module in parallel, and all of the five photoelectric conversion modules 312 were connected in series.

The photoelectric conversion module 312 was inserted into the rail 302, and the five photoelectric conversion modules 312 were vertically arranged, to produce a solar cell panel.

The terminal 303 and the wiring 304 of the photoelectric conversion module 312 were housed inside the rail 302 so as to be hidden from the outside.

A protection member 305, which had been prepared with a transparent resin in advance, was inserted between the photoelectric conversion modules 312.

Figure 27:
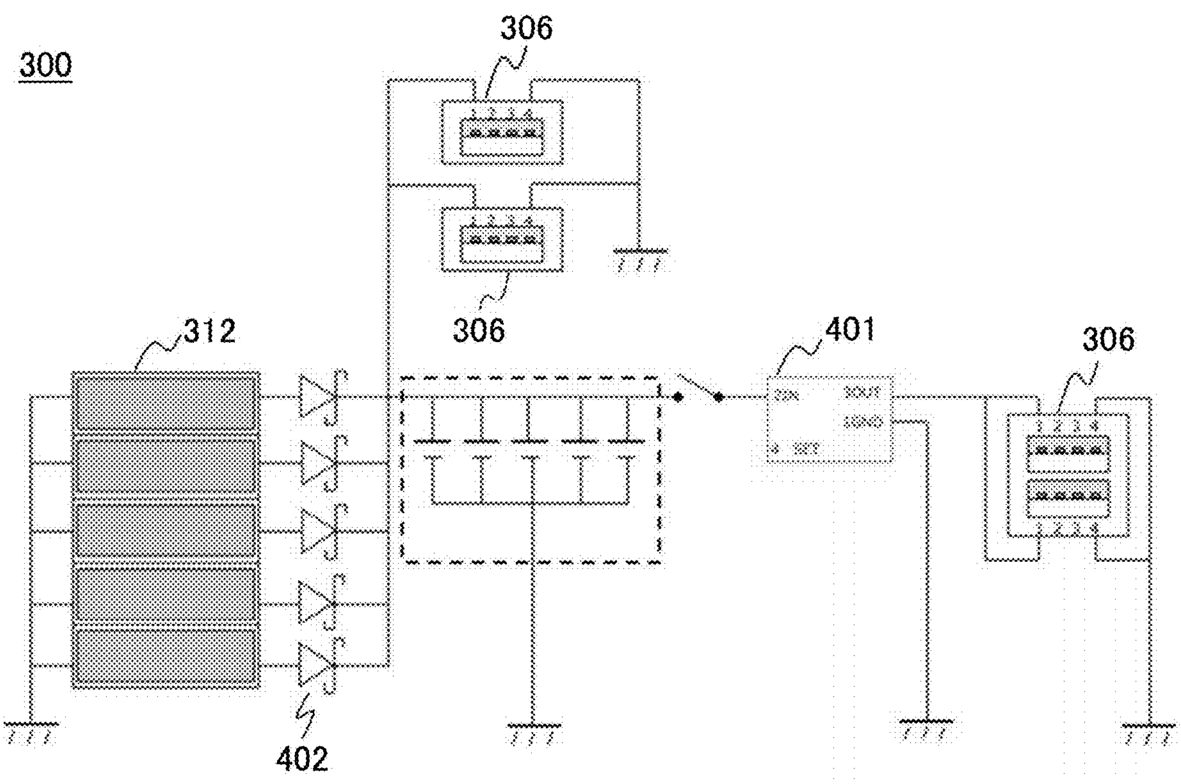
FIG. 27 is a circuit diagram of a partition in Examples.

An electricity storage cell configured to store generated electric power, a DCDC converter configured to raise voltage with direct current, and a schottky barrier diode configured to minimize backflow were provided inside the installation stand 301, and the wiring 304 of the photoelectric conversion module 312 was connected. A switch and a USB terminal as an output terminal 306 were provided at the outside of the installation stand 301. FIG. 27 presents its circuit diagram.

Figure 28:
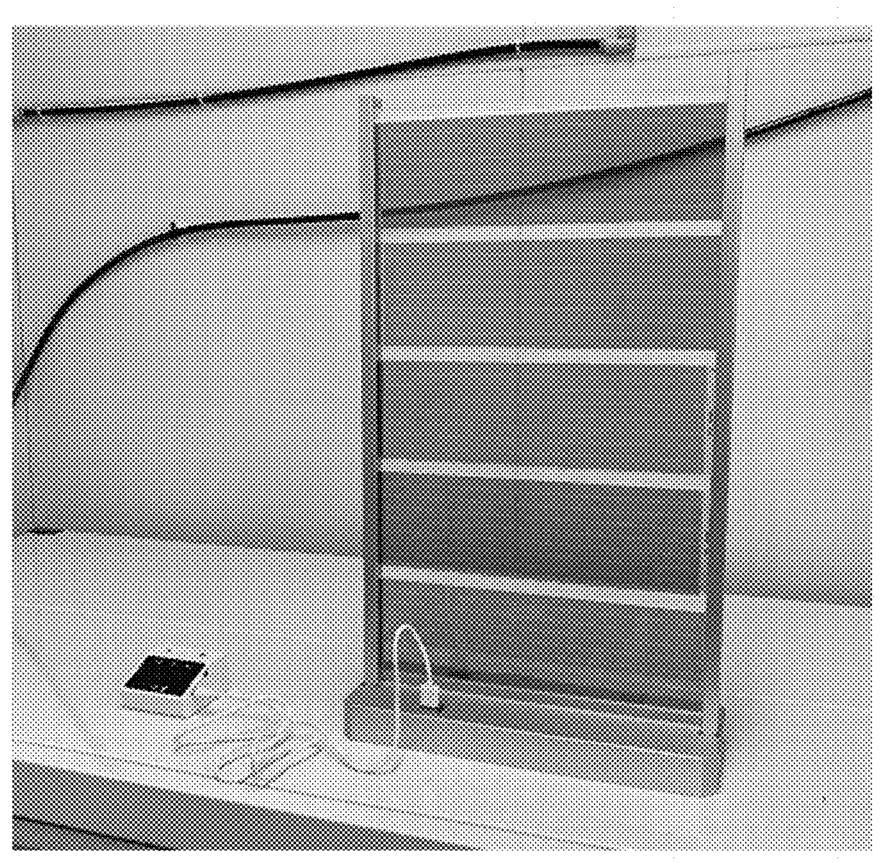
FIG. 28 is a photograph of a partition in Examples.
Figure 28:
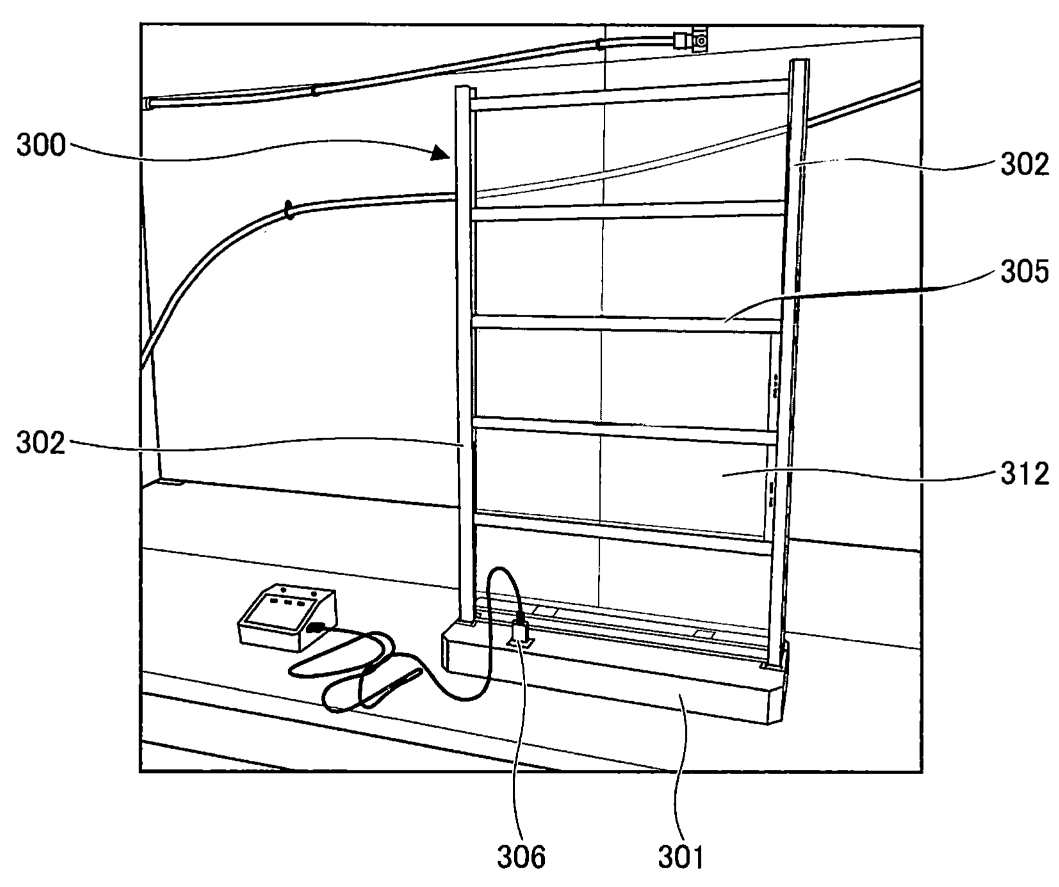

As described above, the partition equipped with the see-through solar cell of the present disclosure as illustrated in FIG. 28 was completed.

<Use of Partition Equipped with See-Through Solar Cell>

The produced partition equipped with the see-through solar cell of the present disclosure was installed as a partition on an indoor table. The illuminance on the table was about 1,000 1×.

A temperature and humidity sensor was connected to the USB terminal of the partition equipped with the see-through solar cell of the present disclosure.

The solar cell panel part of the partition equipped with the see-through solar cell of the present disclosure had a visible light transmittance of 45%, had an output of 21 mW at an illuminance of 700 1× in the place where the panel was installed, highly transmitted visible light, and was able to obtain a high output even with indoor light having a low illuminance.

The partition equipped with the see-through solar cell requires no replacement of a cell, can stably measure the temperature and humidity, and enables visualization of environments.

Aspects of the present disclosure are as follows, for example.

<1> A photoelectric conversion element including:

a first substrate;

a first electrode;

a photoelectric conversion layer;

a second electrode;

a sealing part; and a second substrate, wherein the photoelectric conversion element is translucent, the second electrode includes a conductive nanowire and a conductive polymer, and the sealing part includes a drying agent.

<2> The photoelectric conversion element according to <1>, wherein the sealing part contacts with a side surface of the photoelectric conversion layer and an upper surface of the second electrode.

<3> The photoelectric conversion element according to <1> or <2>, wherein the drying agent is water-reactive.

<4> The photoelectric conversion element according to any one of <1> to <3>, wherein the sealing part is a pressure-sensitive adhesive.

<5> The photoelectric conversion element according to any one of <1> to <4>, wherein the second electrode has a visible light transmittance of 60% or more and 80% or less.

<6> The photoelectric conversion element according to any one of <1> to <5>, wherein the second electrode has an average thickness of 20 nm or more and 70 nm or less.

<7> The photoelectric conversion element according to any one of <1> to <6>, wherein the conductive nanowire is a silver nanowire.

<8> The photoelectric conversion element according to any one of <1> to <7>, wherein the second substrate has a water vapor transmittance of 0.01 ($g/m^2 \cdot day$) or less.

<9> The photoelectric conversion element according to any one of <1> to <8>, wherein the photoelectric conversion element has an electrode protection layer between the second electrode and the sealing part.

<10> The photoelectric conversion element according to <9>, wherein the sealing part includes at least one selected from the group consisting of olefin-based resins, rubber-based resins, silicon-based resins, and acrylic resins.

<11> The photoelectric conversion element according to <9> or <10>, wherein the electrode protection layer includes a fluorine compound having a silane structure.

<12> The photoelectric conversion element according to any one of <1> to <11>, wherein the conductive polymer includes at least one selected from the group consisting of polythiophene, polyaniline, polypyrrole, and derivatives thereof.

<13> The photoelectric conversion element according to any one of <1> to <12>, wherein the photoelectric conversion layer includes an electron transport layer and a hole transport layer, the hole transport layer includes a p-type semiconductor material, a basic compound, and a lithium salt, and the basic compound includes a pyridine compound.

<14> The photoelectric conversion element according to <13>, wherein a surface of the electron transport layer includes a photosensitization compound.

<15> A photoelectric conversion module including a photoelectric conversion element including a first substrate, a first electrode, a photoelectric conversion layer, a second electrode, a sealing part, and a second substrate, wherein the photoelectric conversion element is translucent, the second electrode includes a conductive nanowire and a conductive polymer, and the sealing part includes a drying agent.

<16> The photoelectric conversion module according to <15>, wherein the photoelectric conversion module includes a plurality of the photoelectric conversion elements adjacent to each other, and the photoelectric conversion elements adjacent to each other are electrically connected in series or in parallel.

<17> The photoelectric conversion module according to <16>, wherein, in the photoelectric conversion module including at least two of the plurality of the photoelectric conversion elements adjacent to each other, the first electrode in one of the plurality of the photoelectric conversion elements is electrically connected to the second electrode in another of the plurality of the photoelectric conversion elements through a conduction part penetrating the photoelectric conversion layer.

<18> An electronic device including at least one selected from the group consisting of the photoelectric conversion element according to any one of <1> to <14> and the photoelectric conversion module according to any one of <15> to <17>; and a device configured to be driven by electric power generated through photoelectric conversion of the photoelectric conversion element or the photoelectric conversion module.

<19> An electronic device including:

at least one selected from the group consisting of the photoelectric conversion element according to any one of <1> to <14> and the photoelectric conversion module according to any one of <15> to <17>;

an electricity storage cell that can store electric power generated through photoelectric conversion of the photoelectric conversion element or the photoelectric conversion module; and a device configured to be driven by the electric power stored in the electricity storage cell.

<20> A partition including at least one selected from the group consisting of the photoelectric conversion element according to any one of <1> to <14> and the photoelectric conversion module according to any one of <15> to <17>.

<21> A partition including:

at least one selected from the group consisting of the photoelectric conversion element according to any one of <1> to <14> and the photoelectric conversion module according to any one of <15> to <17>;

an electricity storage cell that can store electric power generated through photoelectric conversion of the photoelectric conversion element or the photoelectric conversion module; and a device configured to be driven by the electric power stored in the electricity storage cell.

<22> The partition according to <20> or <21>, wherein the photoelectric conversion element or the photoelectric conversion module is detachable.

<23> The partition according to any one of <20> to <22>, further including at least one selected from the group consisting of sensors, displays, lights, and audio output devices.

The photoelectric conversion element according to any one of <1> to <14>, the photoelectric conversion module according to any one of <15> to <17>, the electronic device according to <18> or <19>, and the partition according to any one of <20> to <23> can solve the conventionally existing problems and can achieve the object of the present disclosure.

Further, the present invention is not limited to these embodiments, but various variations and modifications may be made without departing from the scope of the present invention.

What is claimed is:

1. A photoelectric conversion element comprising:

a first substrate;

a first electrode;

a photoelectric conversion layer;

a second electrode;

a sealing part; and a second substrate, wherein the photoelectric conversion element is translucent, wherein the second electrode includes a conductive metal nanowire and a conductive polymer, wherein the sealing part includes a drying agent, wherein an average diameter of the conductive metal nanowire is 5 nm or more and 250 nm or less, wherein the sealing part contacts with a side surface of the photoelectric conversion layer and an upper surface of the second electrode, wherein the sealing part is a pressure-sensitive adhesive, wherein the second electrode has a visible light transmittance of 60% or more and 80% or less.

2. The photoelectric conversion element according to claim 1, wherein the drying agent is water-reactive.

3. The photoelectric conversion element according to claim 1, wherein the second electrode has an average thickness of 20 nm or more and 70 nm or less.

4. The photoelectric conversion element according to claim 1, wherein the conductive metal nanowire is a silver nanowire.

5. The photoelectric conversion element according to claim 1, wherein the second substrate has a water vapor transmittance of 0.01 (g/$m^2$·day) or less.

6. The photoelectric conversion element according to claim 1, wherein the photoelectric conversion element has an electrode protection layer between the second electrode and the sealing part.

7. The photoelectric conversion element according to claim 6, wherein the electrode protection layer includes a fluorine compound having a silane structure.

8. The photoelectric conversion element according to claim 1, wherein the photoelectric conversion layer includes an electron transport layer and a hole transport layer, the hole transport layer includes a p-type semiconductor material, a basic compound, and a lithium salt, and the basic compound includes a pyridine compound.

9. The photoelectric conversion element according to claim 8, wherein a surface of the electron transport layer includes a photosensitization compound.

10. A photoelectric conversion module comprising at least one photoelectric conversion element including a first substrate, a first electrode, a photoelectric conversion layer, a second electrode, a sealing part, and a second substrate, wherein the at least one photoelectric conversion element is translucent, wherein the second electrode includes a conductive metal nanowire and a conductive polymer, wherein the sealing part includes a drying agent, wherein an average diameter of the conductive metal nanowire is 5 nm or more and 250 nm or less, wherein the sealing part contacts with a side surface of the photoelectric conversion layer and an upper surface of the second electrode, and wherein the sealing part is a pressure-sensitive adhesive.

11. The photoelectric conversion module according to claim 10, wherein, the photoelectric conversion module includes at least two photoelectric conversion elements adjacent to each other, and the first electrode in one of the photoelectric conversion elements is electrically connected to the second electrode in another of the photoelectric conversion elements through a conduction part penetrating the photoelectric conversion layer.

12. An electronic device comprising the photoelectric conversion element according to claim 1; and a device configured to be driven by electric power generated through photoelectric conversion of the photoelectric conversion element.

13. An electronic device comprising:

the photoelectric conversion element according to claim 1;

an electricity storage cell that can store electric power generated through photoelectric conversion of the photoelectric conversion element; and a device configured to be driven by the electric power stored in the electricity storage cell.

14. A partition comprising the photoelectric conversion element according to claim 1.

15. A partition comprising:

the photoelectric conversion element according to claim 1;

an electricity storage cell that can store electric power generated through photoelectric conversion of the photoelectric conversion element; and a device configured to be driven by the electric power stored in the electricity storage cell.

16. The partition according to claim 14, further comprising at least one selected from the group consisting of sensors, displays, lights, and audio output devices.

17. The photoelectric conversion element according to claim 1, wherein the conductive polymer includes polythiophene or derivatives thereof, polyaniline or derivatives thereof, or polypyrrole or derivatives thereof.

18. The photoelectric conversion element according to claim 1, wherein the pressure-sensitive adhesive is not a UV curable resin nor a thermosetting resin.

19. The photoelectric conversion element according to claim 1, wherein the second electrode has a visible light transmittance of 60% or more and less than 80%.

20. The photoelectric conversion element according to claim 1, wherein the second electrode has a visible light transmittance of 60% or more and 70% or less.

* * * * *